US009236572B2

(12) United States Patent
Tilyou et al.

(10) Patent No.: US 9,236,572 B2
(45) Date of Patent: Jan. 12, 2016

(54) ENHANCEMENT OF LIGHT EMISSION QUANTUM YIELD IN TREATED BROAD SPECTRUM NANOCRYSTALS

(75) Inventors: Teresa E. Tilyou, Nashville, TN (US); James R. McBride, Nashville, TN (US); Sandra J. Rosenthal, Nashville, TN (US)

(73) Assignee: Vanderbilt University, Nashville, TN (US)

( * ) Notice: Subject to any disclaimer, the term of this patent is extended or adjusted under 35 U.S.C. 154(b) by 214 days.

(21) Appl. No.: 13/985,749

(22) PCT Filed: Feb. 17, 2012

(86) PCT No.: PCT/US2012/025663
§ 371 (c)(1), (2), (4) Date: Oct. 28, 2013

(87) PCT Pub. No.: WO2012/112899
PCT Pub. Date: Aug. 23, 2012

(65) Prior Publication Data
US 2014/0046083 A1 Feb. 13, 2014

Related U.S. Application Data

(60) Provisional application No. 61/443,934, filed on Feb. 17, 2011.

(51) Int. Cl.

| | |
|---|---|
| ***H01L 51/00*** | (2006.01) |
| ***B32B 5/16*** | (2006.01) |
| ***C01B 19/00*** | (2006.01) |
| ***C09K 11/02*** | (2006.01) |
| ***C09K 11/88*** | (2006.01) |
| ***H01L 51/50*** | (2006.01) |
| ***B82Y 30/00*** | (2011.01) |

(52) U.S. Cl.
CPC ................ *H01L 51/005* (2013.01); *B32B 5/16* (2013.01); *B82Y 30/00* (2013.01); *C01B 19/007* (2013.01); *C09K 11/025* (2013.01); *C09K 11/883* (2013.01); *H01L 51/502* (2013.01); *B32B 2307/40* (2013.01); *C01P 2004/64* (2013.01)

(58) Field of Classification Search
CPC .. H01L 51/005; H01L 51/502; C09K 11/025; C09K 11/883; C01B 19/007; B32B 5/16; B82Y 30/00
USPC ............. 556/19, 31; 977/774, 896, 773, 932; 428/403
See application file for complete search history.

(56) References Cited

U.S. PATENT DOCUMENTS

| | | | |
|---|---|---|---|
| 6,114,038 A | 9/2000 | Castro et al. | |
| 6,319,607 B1 * | 11/2001 | Barbera-Guillem et al. | 428/402.24 |
| 6,846,565 B2 * | 1/2005 | Korgel et al. | 428/402 |
| 6,872,249 B2 | 3/2005 | Peng et al. | |
| 2005/0274944 A1 | 12/2005 | Jang et al. | |
| 2006/0060862 A1 * | 3/2006 | Bawendi et al. | 257/76 |
| 2006/0062720 A1 | 3/2006 | Jang et al. | |
| 2007/0170418 A1 | 7/2007 | Bowers et al. | |
| 2008/0020235 A1 * | 1/2008 | Parce et al. | 428/690 |
| 2008/0138514 A1 | 6/2008 | Jang et al. | |
| 2009/0073349 A1 | 3/2009 | Park et al. | |
| 2010/0062154 A1 | 3/2010 | Shin et al. | |
| 2010/0159249 A1 | 6/2010 | Jang et al. | |
| 2011/0049442 A1 | 3/2011 | Schreuder et al. | |
| 2011/0256404 A1 * | 10/2011 | Tulsky et al. | 428/407 |

FOREIGN PATENT DOCUMENTS

WO WO 2010/039897 A2 4/2010

OTHER PUBLICATIONS

Achermann M., et al. (2004) "Energy-transfer pumping of semiconductor nanocrystals using an epitaxial quantum well," *Nature* 429: 642-646.

Anikeeva P. O., et al. (2008) "Electronic and excitonic processes in light-emitting devices based on organic materials and colloidal quantum dots," *Physical Review B* 78:085434.

Berrettini M. G., et al. (2004) "NMR Analysis of Surfaces and Interfaces in 2-nm CdSe," *J. Am. Chem. Soc.* 126(22): 7063-7070.

Bowers M. J., et al. (2005) "White-light emission from magic-sized cadmium selenide nanocrystals," *J. Am. Chem. Soc.* 127(44): 15378-15379.

Bruchez M., et al. (1998) "Semiconductor Nanocrystals as Fluorescent Biological Labels," *Science* 281(5385): 2013-2016.

(Continued)

*Primary Examiner* — Porfirio Nazario Gonzalez
(74) *Attorney, Agent, or Firm* — Ballard Spahr LLP

(57) ABSTRACT

Inorganic photoluminescent nanoparticles comprising a solid assembly comprising a first plurality of atoms from group II crystallized with a second plurality of atoms from group VI; at least one dimension of the assembly less than about 3.0 nm; and one or more organocarboxylate agents coupled to a surface that bounds the assembly, wherein the nanocrystal exhibits nanocrystal photoluminescence quantum yield of at least about 10%. Coupling to such surface comprises coating at least a portion of the nanocrystal being coated with the organocarboxylate agent, wherein the organocarboxylate agent is a carboxylic acid or the conjugate base of a carboxylic acid. The carboxylic acid can be is selected from formic acid, acetic acid, hexanoic acid, octanoic acid, oleic acid, and benzoic acid. This abstract is intended as a scanning tool for purposes of searching in the particular art and is not intended to be limiting of the present invention.

20 Claims, 18 Drawing Sheets

(56) References Cited

OTHER PUBLICATIONS

Bullen C. and Mulvaney P. (2006) "The effects of chemisorption on the luminescence of CdSe quantum dots," *Langmuir* 22(7): 3007-3013.
Chan W. C. W. and Nie S. M. (1998) "Quantum Dot Bioconjugates for Ultrasensitive Nonisotopic Detection," *Science* 281(5385): 2016-2018.
Chen X. B., et al. (2005) "Investigation of the crystallization process in 2 nm CdSe quantum dots," *J. Am. Chem. Soc.* 127: 4372-4375.
Dukes A. D., et al. (2008) "Pinned emission from ultrasmall cadmium selenide nanocrystals," *J. Chem. Phys.* 129(12): 1102.
Gomez D. E., et al. (2006) "Blinking and surface chemistry of single CdSe nanocrystals," *Small* 2: 204-208.
Gosnell J. D., et al. (2006) "Cadmium Selenide Nanocrystals as White-Light Phosphors," Eds. SPIE, p. 63370A.
Grant No. TN-SCORE, NSF EPSCoR EPS 1004083.
Hambrock J., et al. (2001) "Synthesis of CdSe nanoparticles and using various organometallic cadmium precursors," *Journal of Materials Chemistry* 11(12): 3197-3201.
Kim S. M., et al. (2006) "Optical Properties and Surface Conditions of CdSe Quantum Dots," *Journal of the Korean Physical Society* 49: S688-S691.
Kim S., et al. (2004) "Near-infrared fluorescent type II quantum dots for sentinel lymph node mapping," *Nature Biotechnology* 22(1): 93-97.
Kopping J. T. and Patten T. E. (2008) "Identification of acidic phosphorous-containing ligands involved in the surface chemistry of CdSe nanoparticles prepared in tri-N-octylphosphine oxide solvents," *J. Am. Chem. Soc.* 130(17): 5689-5698.
Kuno M., et al. (1997) "The band edge luminescence of surface modified CdSe nanocrystallites: Probing the luminescing state," *J. Chem. Phys.* 106(23): 9869-9882.
Landes C. F., et al. (2001) "On the Nanoparticle to Molecular Size Transition: Fluorescence Quenching Studies," *J. Phys. Chem. B* 105: 10554-10558.
Landes C., et al. (2001) "Observation of Large Changes in the Band Gap Absorption Energy of Small CdSe Nanoparticles Induced by the Adsorption of a Strong Hole Acceptor," *Nano Lett.* 1: 667-670.
Landes C., et al. (2002) "Thermodynamic and Kinetic Characterization of the Interaction between *N*-Butylamine and 1 nm CdSe Nanoparticles," *J. Phys. Chem. A* 106: 7621-7627.
Lifshitz E., et al. (1998) "Optically Detected Magnetic Resonance Study of Electron/Hole Traps on CdSe Quantum Dot Surfaces," *J. Phys. Chem. B* 102(46) 9245-9250.
Light Emitting Diodes (LEDs) for General Illumination: An OIDA Technology Roadmap Update 2002 (http://lighting.sandia.gov/lightingdocs/OIDA_SSL_LED_Roadmap_Full.pdf).
Liu I. S., et al. (2008) "Enhancing photoluminescence quenching and photoelectric properties of CdSe quantum dots with hole accepting ligands," *J. Mater. Chem.* 18(6): 675-682.
Mattoussi H., et al. (1999) "Composite thin films of CdSe nanocrystals and a surface passivating/electron transporting block copolymer: Correlations between film microstructure by transmission electron microscopy and electroluminescence," *J. of Appl. Phys.* 86: 4390-4399.
Munro A. M. and Ginger D. S. (2008) "Photoluminescence quenching of single CdSe nanocrystals by ligand adsorption," *Nano Letters* 8(8): 2585-2590.
Munro A. M., et al. (2007) "Quantitative Study of the Effects of Surface Ligand Concentration on CdSe Nanocrystal Photoluminescence," *J. Phys. Chem. C* 111(17): 6220-6227.
Munro A. M., et al. (2008) "Colloidal CdSe quantum dot electroluminescence: ligands and light-emitting diodes," *Michrochimica Acta* 160(3): 345-350.
Nag A. and Sarma D. D. (2007) "White Light from $Mn^{2+}$-Doped CdS Nanocrystals: A New Approach," *J. Phys. Chem. C* 111: 13641-13644.
Nirmal M., et al. (1996) "Fluorescence intermittency in single cadmium selenide nanocrystals," *Nature* 383: 802-804.
Ozel T., et al. (2008) "Selective enhancement of surface-state emission and simultaneous quenching of interbrand transition in white-luminophor CdS nanocrystals using localized plasmon coupling," *New Journal of Physics* 10(8): 083035.
Peng Z. A. and Peng X. G. (2001) "Formation of high-quality CdTe, CdSe, and CdS nanocrystlas using CdO as precursor," *J. Am. Chem. Soc.* 123(1): 183-184.
Peng Z. A. and Peng X. (2002) "Nearly monodisperse and shape-controlled CdSe nanocrystals via alternative routes: nucleation and growth," *J. Am. Chem. Soc.* 124(13): 3343-3353.
Rogach A. L., et al. (1999) "Synthesis and Characterization of a Size Series of Extremely Small Thiol-Stabilized CdSe Nanocrystals," *J. Phys. Chem. B* 103: 3065-3069.
Rosenthal S. J., et al. (2007) "Synthesis, Surface Studies, Composition and Structural Characterization of CdSe, Core/Shell, and Biologically Active Nanocrystals," *Surface Science Reports* 62: 111-157.
Schlotter P., et al. (1999) "Fabrication and characterization of GaN/InGaN/AlGaN double heterostructure LEDs and their application in luminescence conversion LEDs," *Mat. Sci. and Eng.* B59: 390-394.
Schreuder M. A., et al. (2008) "Encapsulated white-light CdSe nanocrystals as nanophosphors for solid-state lighting," *J. Mater. Chem.* 18(9): 970-975.
Schreuder M. A., et al. (2009) "Control of Surface State Emission via Phosphonic Acid Modulation in Ultrasmall CdSe Nanocrystals: The Role of Ligand Electronegativity," *J. Phys. Chem. C.* 113: 8169-8176.
Shirakawa T. (2002) "Effect of defects on the degradation of ZnSe-based white LEDs," *Mater. Sci. and Eng. B* 91-92: 470-475.
Smith A. M., et al. (2006) "A systematic examination of surface coatings on the optical and chemical properties of semiconductor quantum dots," *Physical Chemistry Chemical Physics* 8(33): 3895-3903.
Solid-State Lighting (http://lighting.sandia.gov/).
Steigerwald D. A., et al. (2002) "Illumination with Solid State Lighting Technology," *IEEE J. on Sel. Top. in Quant. Elec.* 8(2): 310-320.
Yu W. W., et al. (2003) "Experimental Determination of the Extinction Coefficient of CdTe, CdSe, and CdS Nanocrystals," *Chem. Mater.* 15: 2854-2860.
Written Opinion mailed May 31, 2012 for PCT/US12/25663 filed Feb. 17, 2012 and published as WO 2012/112899 on Aug. 23, 2012 (Applicants—Vanderbilt University // Inventors—Tilyou et al. // (4 pages).
International Search Report mailed May 31, 2012 for PCT/US12/25663 filed Feb. 17, 2012 and published as WO 2012/112899 on Aug. 23, 2012 (Applicants—Vanderbilt University // Inventors—Tilyou et al. // (2 pages).
Restriction Requirement issued Jul. 3, 2012 for U.S. Appl. No. 12/750,039, filed Mar. 30, 2010 (Applicant—Vanderbilt University // Inventors—Schreuder et al. // (8 pages).
Response to Restriction Requirement filed Aug. 3, 2012 for U.S. Appl. No. 12/750,039, filed Mar. 30, 2010 (Applicant—Vanderbilt University // Inventors—Schreuder et al. // (4 pages).
Non-Final Rejection issued Sep. 21, 2012 for U.S. Appl. No. 12/750,039, filed Mar. 30, 2010 (Applicant—Vanderbilt University // Inventors—Schreuder et al. // (6 pages).
International Search Report and Written Opinion issued on Jul. 1, 2011 for PCT/US2011/029948 filed Mar. 25, 2011 (Applicants—Vanderbilt University // Inventors—Schreuder et al. // (7 pages).
Non-Final Rejection issued Jan. 2, 2014 for U.S. Appl. No. 13/115,001, filed May 24, 2011 (Applicant—Vanderbilt University // Inventors—Schreuder et al. // (8 pages).
Response to Non-Final Office Action filed Apr. 1, 2014 for U.S. Appl. No. 13/115,001, filed May 24, 2011 (Applicant—Vanderbilt University // Inventors—Schreuder et al. // (7 pages).
Notice of Allowance issued Jun. 9, 2014 for U.S. Appl. No. 13/115,001, filed May 24, 2011 (Applicant—Vanderbilt University // Inventors—Schreuder et al. // (8 pages).

* cited by examiner (a) (b) (c)

Methyl = 2.278

Ethyl = 2.305

P = 2.19

Branched = 2.362

Oxygen = 3.44

Hydroxyl = 2.68

ENHANCEMENT OF LIGHT EMISSION QUANTUM YIELD IN TREATED BROAD SPECTRUM NANOCRYSTALS

CROSS-REFERENCE TO RELATED APPLICATIONS

This application claims the benefit of U.S. Application No. 61/443,934, filed Feb. 17, 2011; which is hereby incorporated herein by reference in its entirety.

STATEMENT REGARDING FEDERALLY SPONSORED RESEARCH

This invention was made with government support under grant TN-SCORE, NSF EPSCoR EPS 1004083 awarded by the National Science Foundation. The United States government has certain rights in the invention.

BACKGROUND

In response to ever increasing energy demands and subsequent costs, a tremendous emphasis is being placed on energy-saving solid-state lighting devices in the form of light emitting diodes (LEDs). Specifically, a need exists for pure white-light LEDs as a more efficient replacement for conventional lighting sources. Switching to solid state lighting would reduce global electricity use by 50% and reduce power consumption by 760 GW in the United States alone over a 20 year period. *Solid-State Lighting* http://lighting.sandia.gov/; *The Promise of Solid State Lighting for General Illumination*, Optoelectronics Industry Development Association, Washington, D.C. (2001).

The complications associated with design and fabrication of such devices have generated great interest in developing white-light phosphors that do not depend on complex doping schemes or combinations of materials. One proposed solution is to use a mixture of semiconductor nanocrystals as the intrinsic emitting layer for an LED device. Achermann, M.; Petruska, M. A.; Kos, S.; Smith, D. L.; Koleske, D. D.; Klimov, V. I. *Nature* 2004, 429, 642-646; Mueller, A. H.; Petruska, M. A.; Achermann, M.; Werder, D. J.; Akhadov, E. A.; Koleske, D. D.; Hoffbauer, M. A.; Klimov, V. I. *Nano Lett.* 2005, 5, 1039-1044. Semiconductor nanocrystals can exhibit high fluorescence quantum efficiencies and large molar absorptivities. Alivisatos, A. P. *Science* 1996, 271, 933-937; Yu, W. W.; Qu, L.; Guo, W.; Peng, X. *Chem. Mater.* 2003, 15, 2854-2860. However, mixtures of such nanocrystals merely approximate white light by mixing the traditional red, green, and blue colors and result in a loss in total device efficiency due to self absorption for a device of more than a few monolayers. Mueller, A. H.; Petruska, M. A.; Achermann, M.; Werder, D. J.; Akhadov, E. A.; Koleske, D. D.; Hoffbauer, M. A.; Klimov, V. I. *Nano Lett.* 2005, 5, 1039-1044.

Therefore, there remains a need for methods and compositions that overcome these deficiencies and that effectively provide broad-emission nanocrystals having improved quantum yield.

SUMMARY

In accordance with the purpose(s) of the invention, as embodied and broadly described herein, the invention, in one aspect, relates to enhancement of light emission quantum yield in treated broad spectrum ultrasmall nanocrystals.

Disclosed are inorganic photoluminescent nanoparticles comprising a solid assembly comprising a first plurality of atoms from group II crystallized with a second plurality of atoms from group VI; at least one dimension of the assembly less than about 3.0 nm; and one or more organocarboxylate agents coupled to a surface that bounds the assembly, wherein the nanocrystal exhibits nanocrystal photoluminescence quantum yield of at least about 10%. Coupling to such surface comprises coating at least a portion of the nanocrystal being coated with the organocarboxylate agent, wherein the organocarboxylate agent is a carboxylic acid or the conjugate base of a carboxylic acid. The carboxylic acid can be is selected from formic acid, acetic acid, hexanoic acid, octanoic acid, oleic acid, and benzoic acid.

Also disclosed are nanocrystals treated in accordance with the subject disclosure can exhibit a photoluminescence quantum yield of at least double that of nanocrystal without one or more organocarboxylate agents, of at least triple that of a nanocrystal without one or more organocarboxylate agents, or of at least four-times that of a nanocrystal without one or more organocarboxylate agents. In a further aspect, nanocrystals treated in accordance with the subject disclosure can exhibit photoluminescence with a quantum yield of at least about 20%, a quantum yield of at least about 30%, or a quantum yield of at least about 40%.

Also disclosed are methods of increasing photoluminescence quantum yield, the method comprising the steps of: (a) providing a nanocrystal comprising a first plurality of atoms from group II and a second plurality of atoms from group VI; and (b) treating the nanocrystal with a molar excess of one or more organocarboxylate agents for a time period and at a temperature sufficient to increase nanocrystal photoluminescence quantum yield, compared with the nanocrystal before treatment.

Also disclosed are the products produced by the methods of the invention.

While aspects of the present invention can be described and claimed in a particular statutory class, such as the system statutory class, this is for convenience only and one of skill in the art will understand that each aspect of the present invention can be described and claimed in any statutory class. Unless otherwise expressly stated, it is in no way intended that any method or aspect set forth herein be construed as requiring that its steps be performed in a specific order. Accordingly, where a method claim does not specifically state in the claims or descriptions that the steps are to be limited to a specific order, it is no way intended that an order be inferred, in any respect. This holds for any possible non-express basis for interpretation, including matters of logic with respect to arrangement of steps or operational flow, plain meaning derived from grammatical organization or punctuation, or the number or type of aspects described in the specification.

Additional advantages of the invention will be set forth in part in the description which follows, and in part will be obvious from the description, or may be learned by practice of the invention. The advantages of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF THE FIGURES

The accompanying figures, which are incorporated in and constitute a part of this specification, illustrate several embodiments and together with the description serve to explain the principles of the invention.

DETAILED DESCRIPTION

Figure 1:
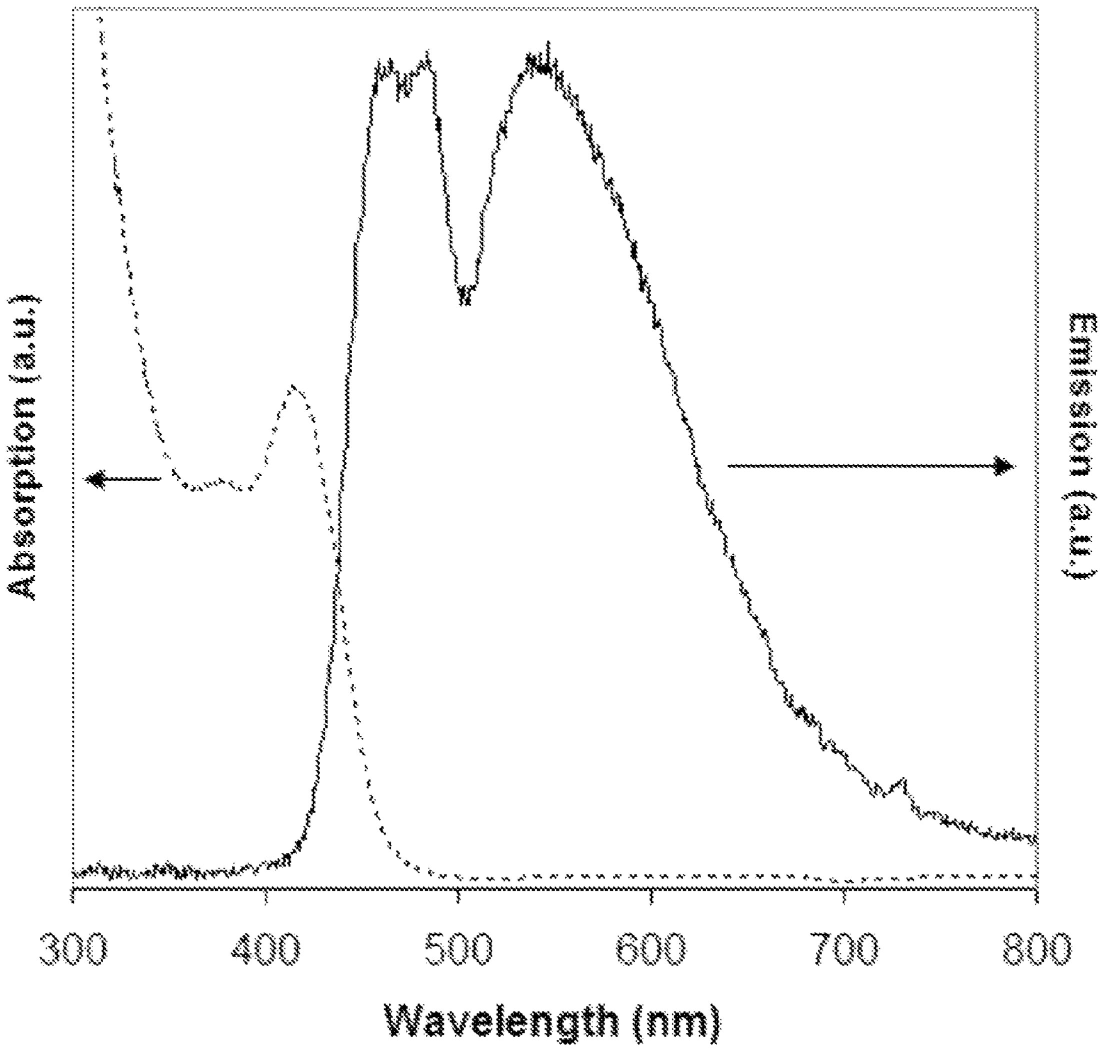
FIG. 1 shows absorption (dashed line) and emission (solid line, $\lambda_{ex}$=367 nm) spectra of ultrasmall CdSe. Static absorption and emission spectra were obtained using a Cary Bio 50 UV-Visible spectrometer and an ISS photon counting fluorescence spectrometer, respectively.

The present invention may be understood more readily by reference to the following detailed description of aspects of the invention and the Examples included therein and to the Figures and their previous and following description.

Before the present compounds, compositions, articles, devices, and/or methods are disclosed and described, it is to be understood that they are not limited to specific synthetic methods unless otherwise specified, or to particular reagents unless otherwise specified, as such may, of course, vary. It is also to be understood that the terminology used herein is for the purpose of describing particular embodiments only and is not intended to be limiting. Although any methods and materials similar or equivalent to those described herein can be used in the practice or testing of the present invention, example methods and materials are now described.

All publications mentioned herein are incorporated herein by reference to disclose and describe the methods and/or materials in connection with which the publications are cited. The publications discussed herein are provided solely for their disclosure prior to the filing date of the present application. Nothing herein is to be construed as an admission that the present invention is not entitled to antedate such publication by virtue of prior invention. Further, the dates of publication provided herein may be different from the actual publication dates, which may need to be independently confirmed.

A. Definitions

As used herein, nomenclature for compounds, including organic compounds, can be given using common names, IUPAC, IUBMB, or CAS recommendations for nomenclature. When one or more stereochemical features are present, Cahn-Ingold-Prelog rules for stereochemistry can be employed to designate stereochemical priority, E/Z specification, and the like. One of skill in the art can readily ascertain the structure of a compound If given a name, either by systemic reduction of the compound structure using naming conventions, or by commercially available software, such as CHEMDRAW™ (Cambridgesoft Corporation, U.S.A.).

As used in the specification and the appended claims, the singular forms "a," "an" and "the" include plural referents unless the context clearly dictates otherwise. Thus, for example, reference to "a component," "a polymer," or "a particle" includes mixtures of two or more such components, polymers, or particles, and the like.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself For example, if the value "10" is disclosed, then "about 10" is also disclosed. It is also understood that when a value is disclosed that "less than or equal to" the value, "greater than or equal to the value" and possible ranges between values are also disclosed, as appropriately understood by the skilled artisan. For example, if the value "10" is disclosed the "less than or equal to 10" as well as "greater than or equal to 10" is also disclosed. It is also understood that throughout the application, data is provided in a number of different formats and that this data represents endpoints and starting points, and ranges for any combination of the data points. For example, if a particular data point "10" and a particular data point 15 are disclosed, it is understood that greater than, greater than or equal to, less than, less than or equal to, and equal to 10 and 15 are considered disclosed as well as between 10 and 15. It is also understood that each unit between two particular units are also disclosed. For example, if 10 and 15 are disclosed, then 11, 12, 13, and 14 are also disclosed.

References in the specification and concluding claims to parts by weight of a particular element or component in a composition denotes the weight relationship between the element or component and any other elements or components in the composition or article for which a part by weight is expressed. Thus, in a compound containing 2 parts by weight of component X and 5 parts by weight component Y, X and Y are present at a weight ratio of 2:5, and are present in such ratio regardless of whether additional components are contained in the compound.

A weight percent (wt. %) of a component, unless specifically stated to the contrary, is based on the total weight of the formulation or composition in which the component is included.

As used herein, the terms "optional" or "optionally" means that the subsequently described event or circumstance may or may not occur, and that the description includes instances where said event or circumstance occurs and instances where it does not.

As used herein, the term "polymer" refers to a relatively high molecular weight organic compound, natural or synthetic, whose structure can be represented by a repeated small unit, the monomer (e.g., polyethylene, rubber, cellulose). Synthetic polymers are typically formed by addition or condensation polymerization of monomers.

As used herein, the term "copolymer" refers to a polymer formed from two or more different repeating units (monomer residues). By way of example and without limitation, a copolymer can be an alternating copolymer, a random copolymer, a block copolymer, or a graft copolymer. It is also contemplated that, in certain aspects, various block segments of a block copolymer can themselves comprise copolymers.

As used herein, the term "oligomer" refers to a relatively low molecular weight polymer in which the number of repeating units is between two and ten, for example, from two to eight, from two to six, or form two to four. In one aspect, a collection of oligomers can have an average number of repeating units of from about two to about ten, for example, from about two to about eight, from about two to about six, or form about two to about four.

As used herein, the term "visible spectrum" or "visible light" or "visible light spectrum" refers to the portion of the electromagnetic spectrum to which the human eye is sensitive, i.e., light with wavelengths from about 400 nm to about 700 nm.

As used herein, the term "white light" refers to light energy integrated over the visible portion of the spectrum (i.e., from about 400 nm to about 700 nm) so that all colors are blended to appear white to the eye. Such light contains approximately equal amounts of the primary additive colors of light; the human eye perceives this light as colorless.

As used herein, the term "quantum dot" refers to a semiconductor crystal with a nanoscale diameter, also called a nanocrystal, that because of its small size behaves like a potential well that confines electrons in three dimensions to a region on the order of the electrons' de Broglie wavelength in size, a few nanometers in a semiconductor. Typically, a quantum dot can absorb energy within a first electromagnetic region and emit light in a second electromagnetic region; the particular absorbance or emission regions can depend upon the material and diameter of the quantum dot. In one aspect, the nanoparticle of the invention can be considered a quantum dot or nanocrystal; however, the nanoparticle of the invention can differ from conventional quantum dots or nanocrystals in that the nanoparticle of the invention can emit broad band visible light, for example, white light.

The term "stable," as used herein, refers to compounds that are not substantially altered when subjected to conditions to allow for their production, detection, and, in certain aspects, their recovery, purification, and use for one or more of the purposes disclosed herein.

A residue of a chemical species, as used in the specification and concluding claims, refers to the moiety that is the resulting product of the chemical species in a particular reaction scheme or subsequent formulation or chemical product, regardless of whether the moiety is actually obtained from the chemical species. Thus, an ethylene glycol residue in a polyester refers to one or more $—OCH_2CH_2O—$ units in the polyester, regardless of whether ethylene glycol was used to prepare the polyester. Similarly, a sebacic acid residue in a polyester refers to one or more $—CO(CH_2)_8CO—$ moieties in the polyester, regardless of whether the residue is obtained by reacting sebacic acid or an ester thereof to obtain the polyester.

Certain materials, compounds, compositions, and components disclosed herein can be obtained commercially or readily synthesized using techniques generally known to those of skill in the art. For example, the starting materials and reagents used in preparing the disclosed compounds and compositions are either available from commercial suppliers such as Aldrich Chemical Co., (Milwaukee, Wis.), Acros Organics (Morris Plains, N.J.), Fisher Scientific (Pittsburgh, Pa.), or Sigma (St. Louis, Mo.) or are prepared by methods known to those skilled in the art following procedures set forth in references such as Fieser and Fieser's Reagents for Organic Synthesis, Volumes 1-17 (John Wiley and Sons, 1991); Rodd's Chemistry of Carbon Compounds, Volumes 1-5 and Supplementals (Elsevier Science Publishers, 1989); Organic Reactions, Volumes 1-40 (John Wiley and Sons, 1991); March's Advanced Organic Chemistry, (John Wiley and Sons, 4th Edition); and Larock's Comprehensive Organic Transformations (VCH Publishers Inc., 1989).

Disclosed are the components to be used to prepare the compositions of the invention as well as the compositions themselves to be used within the methods disclosed herein. These and other materials are disclosed herein, and it is understood that when combinations, subsets, interactions, groups, etc. of these materials are disclosed that while specific reference of each various individual and collective combinations and permutation of these compounds may not be explicitly disclosed, each is specifically contemplated and described herein. For example, if a particular compound is disclosed and discussed and a number of modifications that can be made to a number of molecules including the compounds are discussed, specifically contemplated is each and every combination and permutation of the compound and the modifications that are possible unless specifically indicated to the contrary. Thus, if a class of molecules A, B, and C are disclosed as well as a class of molecules D, E, and F and an example of a combination molecule, A-D is disclosed, then even if each is not individually recited each is individually and collectively contemplated meaning combinations, A-E, A-F, B-D, B-E, B-F, C-D, C-E, and C-F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions of the invention. Thus, if there are a variety of additional steps that can be performed it is understood that each of these additional steps can be performed with any specific embodiment or combination of embodiments of the methods of the invention.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; and the number or type of embodiments described in the specification.

It is understood that the compositions disclosed herein have certain functions. Disclosed herein are certain structural requirements for performing the disclosed functions, and it is understood that there are a variety of structures that can perform the same function that are related to the disclosed structures, and that these structures will typically achieve the same result.

B. Broad-Emission Nanocrystals

In one aspect, the invention relates to ultrasmall cadmium selenide (CdSe) nanocrystals capable of emitting white light. The inorganic particles or nanocrystals can also be referred to as quantum dots. More specifically, in one aspect, the invention relates to a quantum dot capable of emitting white light. Typically, these ultrasmall nanocrystals exhibit broadband emission (e.g., from about 420 nm to about 710 nm) throughout the visible light spectrum while not suffering from self absorption due to an unusually narrow particle size distribution and an unusually large Stokes shift (see, e.g., FIG. 1), making these nanocrystals ideal materials for devices currently under development and also an ideal platform to study the molecule-to-nanocrystal transition. Achermann, M.; Petruska, M. A.; Kos, S.; Smith, D. L.; Koleske, D. D.; Klimov, V. I. *Nature* 2004, 429, 642-646.

Without wishing to be bound by theory, it is believed that this broadband emission is the result of the size of the nanoparticle. In one aspect, the nanoparticles of the invention are so small that the surface is intimately involved in the emission; that is, the nanoparticle is essentially all surface, which is not the case with larger nanocrystals. Further, without wishing to be bound by theory, it is believed that the broadband emission is the result of the surface structure of the nanoparticle. That is, nanoparticles prepared by conventional techniques but of comparable size to the nanoparticles of the invention typically do not exhibit the broadband emission observed with the nanoparticles of the invention.

In a further aspect, the invention relates to an inorganic nanoparticle having a surface and a diameter and capable of absorbing energy from a first electromagnetic region and capable of emitting light in a second electromagnetic region, wherein the diameter is less than about 5.0 nm, and wherein the second electromagnetic region comprises an at least about 50 nm wide (FWHH) band of wavelengths.

In a yet further aspect, the invention relates to an inorganic nanoparticle having a surface and a diameter and capable of absorbing energy from a first electromagnetic region and capable of emitting light in a second electromagnetic region, wherein the diameter is less than about 2.0 nm, and wherein the second electromagnetic region comprises an at least about 100 nm wide (FWHH) band of wavelengths.

In one aspect, the nanoparticle of the invention is not produced by an etching process. In a further aspect, the nanoparticle of the invention is not produced by an inverse micellular process.

1. Particle Size

In one aspect, the nanoparticle of the invention has a diameter, which can also be referred to as a particle size. When, the nanoparticle of the invention is provided as a collection of nanoparticles, the diameter refers to the average diameter of the nanoparticles in the collection. While referring to the particle size as a diameter, it is understood that the particles can be spherical, approximately spherical, or nonspherical. In nonspherical cases, the diameter typically refers to the diameter of a sphere having the same hydrodynamic volume of the particle.

In one aspect, the diameter of nanoparticle of the invention can be controlled by the method of preparation. For example, by controlling the temperature of the preparation mixture, growth kinetics can be favored relative to nucleation (also referred to as nanoparticle formation or initiation) kinetics. Consequently, a collection of nanoparticles can be provided with an unusually narrow particle size distribution. In a further aspect, by further controlling the temperature of the preparation mixture, growth kinetics can be disfavored. Consequently, the size of the nanoparticle or collection of nanoparticles can be limited to a particular size or diameter.

In one aspect, the diameter of the nanoparticle of the invention is less than about 3.0 nm, less than about 2.5 nm, less than about 2.0 nm, less than about 1.5 nm, or less than about 1.0 nm.

In a further aspect, the diameter of the nanoparticle of the invention can be from about 5.0 nm to about 0.5 nm, from about 5.0 nm to about 1.0 nm, from about 5.0 nm to about 2.0 nm, from about 5.0 nm to about 3.0 nm, from about 4.0 nm to about 0.5 nm, from about 4.0 nm to about 1.0 nm, from about 4.0 nm to about 2.0 nm, from about 4.0 nm to about 3.0 nm, from about 3.0 nm to about 0.5 nm, from about 3.0 nm to about 1.0 nm, from about 3.0 nm to about 2.0 nm, from about 2.0 nm to about 0.5 nm, or from about 2.0 nm to about 1.0 nm. In a further aspect, the diameter of the nanoparticle of the invention can be about 11 Å, about 12 Å, about 13 Å, about 14 Å, about 15 Å, about 16 Å, about 17 Å, about 18 Å, or about 19 Å.

2. Absorption Region

In one aspect, the nanoparticle of the invention is capable of absorbing energy in a first electromagnetic region. That is, the nanoparticle can absorb light having one or more wavelengths. In a further aspect, the first electromagnetic region comprises light with a wavelength of less than about 450 nm, for example less than about 425 nm, less than about 400 nm, less than about 375 nm, less than about 350 nm, less than about 325 nm, less than about 300 nm, less than about 275 nm, less than about 250 nm, less than about 225 nm, or less than about 200 nm. In a further aspect, the first electromagnetic region comprises light of a wavelength of from about 100 nm to about 450 nm, for example, from about 100 nm to about 170 nm, from about 170 nm to about 290 nm, from about 100 nm to about 290 nm, from about 290 nm to about 400 nm, from about 100 nm to about 320 nm, from about 290 nm to about 320 nm, from about 320 nm to about 400 nm, or from about 320 nm to about 450 nm. In a yet further aspect, the first electromagnetic region comprises light with a wavelength of from about 400 nm to about 430 nm, from about 410 nm to about 420 nm, or about 414 nm.

The absorption of a photon of light by the semiconducting material of the nanoparticle of the invention and subsequent emission of a lower energy photon by the nanoparticle of the invention results in fluorescence.

3. Emission Region

In one aspect, the nanoparticle of the invention is capable of emitting light in a second electromagnetic region. That is, the nanoparticle can emit light having one or more wavelengths. When the emission comprises more than one wavelength, such emission comprises an emission band and can be characterized by a maximum emission and an emission band width. Typically, absorbance band width or emission band width can be reported as a band measurement of full-width at half-height (FWHH). For example, an emission band can comprise light of wavelengths from about 420 nm to about 710 nm, having a maximum emission at about 560 nm and an emission band width of about 210 nm (FWHH) (see, e.g., FIG. 1).

In one aspect, the emission band comprises one or more wavelengths within the second electromagnetic region. In a further aspect, the emitted wavelengths are continuous. In a yet further aspect, the emitted wavelengths are discontinuous. In a further aspect, the emission band comprises all wavelengths within the second electromagnetic region. In a yet further aspect, the emission band comprises less than all wavelengths within the second electromagnetic region.

In one aspect, the second electromagnetic region comprises an at least about 50 nm wide (FWHH) band of wavelengths, for example, at least about 60 nm wide (FWHH), at least about 70 nm wide (FWHH), at least about 80 nm wide (FWHH), at least about 90 nm wide (FWHH), at least about 100 nm wide (FWHH), at least about 125 nm wide (FWHH), at least about 150 nm wide (FWHH), at least about 175 nm wide (FWHH), at least about 200 nm wide (FWHH), at least about 250 nm wide (FWHH), at least about 300 nm wide (FWHH), at least about 350 nm wide (FWHH), or at least about 400 nm wide (FWHH). In a further aspect, the second electromagnetic region comprises an emission band at least about 100 nm wide, at least about 125 nm wide, at least about 150 nm wide, at least about 175 nm wide, at least about 200 nm wide, at least about 250 nm wide, at least about 300 nm wide, at least about 350 nm wide, or at least about 400 nm wide.

In a further aspect, the second electromagnetic region can comprise a band of wavelengths at least about 50 nm wide (FWHH), at least about 60 nm wide (FWHH), at least about 70 nm wide (FWHH), at least about 80 nm wide (FWHH), at least about 90 nm wide (FWHH), at least about 100 nm wide (FWHH), at least about 125 nm wide (FWHH), at least about 150 nm wide (FWHH), at least about 175 nm wide (FWHH), at least about 200 nm wide (FWHH), at least about 250 nm wide (FWHH), at least about 300 nm wide (FWHH), at least about 350 nm wide (FWHH), or at least about 400 nm wide (FWHH) in the region between about 400 nm and about 700 nm, about 420 nm and about 710 nm, about 350 nm and about 750 nm, about 400 nm and about 600 nm, about 500 nm and about 700 nm, about 300 nm and about 800 nm, about 500 nm and about 750 nm, or about 350 nm and about 600 nm.

In further aspects, the second electromagnetic region can comprise light of all wavelengths from about 400 nm to about 700 nm or the visible light spectrum.

4. Nanocrystal Materials

In one aspect, the nanoparticle of the invention can be provided from materials known to those of skill in the art of the preparation of nanocrystals or quantum dots. For example, the nanoparticle of the invention can comprise at least one of cadmium selenide, cadmium sulfide, or cadmium telluride, or a mixture thereof. In another example, the nanoparticle of the invention can comprise at least one of zinc sulfide, zinc selenide, zinc telluride, magnesium sulfide, magnesium selenide, magnesium telluride, or a mixture thereof. More generally, nanoparticles or nanocrystals of the subject disclosure can be embodied in a solid assembly comprising a first plurality of atoms from group II crystallized with a second plurality of atoms from group VI.

In a further aspect, the nanoparticle of the invention can be provided as part of a collection of nanoparticles. In such an aspect, the collection of nanoparticles can comprise nanoparticles comprising at least one of cadmium selenide, cadmium sulfide, cadmium telluride, zinc sulfide, zinc selenide, zinc telluride, magnesium sulfide, magnesium selenide, magnesium telluride, or a mixture thereof. The individual nanoparticles can be the same or different in composition. Moreover, the individual nanoparticles or nanocrystals can have various shapes having a group of one or more characteristic dimensions. As an example, for a spherical nanoparticle, diameter is a single dimension that can characterize its size. As another example, for a cylindrical nanoparticles, such as a nanowire, diameter and length are two dimensions that characterize the nanoparticle size.

5. Stokes Shift

In one aspect, absorbance region or first electromagnetic region can be different from the emission region or second electromagnetic region, thereby providing a Stokes shift. Typically, the Stokes Shift is reported as the difference between a wavelength of maximum absorbance and a wavelength of maximum emission and can be expressed in nanometers (nm). For example, a nanoparticle can have an absorbance band with a maximum absorbance of about 414 nm and an emission band with a maximum emission at about 441 nm, thereby providing a Stokes Shift of about 27 nm (see, e.g., FIG. 1).

In a further aspect, the Stokes shift can be at least about 10 nm, at least about 15 nm, at least about 20 nm, at least about 25 nm, at least about 30 nm, at least about 35 nm, at least about 40 nm, at least about 45 nm, or at least about 50 nm. In a further aspect, the Stokes shift can be from about 15 nm to about 50 nm, from about 20 nm to about 50 nm, from about 30 nm to about 50 nm, from about 40 nm to about 50 nm, from about 20 nm to about 30 nm, from about 20 nm to about 40 nm, from about 20 nm to about 50 nm, from about 30 nm to about 40 nm, or from about 30 nm to about 50 nm.

6. Quantum Yield

In one aspect, the quantum dots of the invention exhibit a quantum yield. As used herein, the "quantum yield" of a radiation-induced process refers to the number of times that a defined event occurs per photon absorbed by the system. Thus, the quantum yield is a measure of the efficiency with which absorbed light produces some effect.

With respect to the quantum dots of the invention, quantum yield generally refers to a "light in" to "light out" ratio. Such a ratio can be measured by any of the methods for measuring electromagnetic absorbance and emission known to those of skill in the art. For example, the "light in" can be measured by a spectrophotometer set at the emission wavelength(s) of an electromagnetic energy source (e.g., an ultraviolet light emitter). As another example, the "light out" can be measured by a spectrophotometer set at the wavelengths of white light (i.e., one or more wavelengths of visible light) emitted by the quantum dots of the invention.

The term "quantum yield" can be applied to a single quantum dot or to an average of a plurality of quantum dots. In theory, a quantum yield must be greater than 0% and is typically less than 100%. However, for photo-induced or radiation-induced chain reactions, in which a single photon may trigger a long chain of transformations, quantum yields greater than 100% are possible.

In one aspect, the quantum yield of the quantum dots of the invention are greater than about 2%, for example, greater than about 3%, greater than about 4%, greater than about 5%, greater than about 6%, greater than about 7%, greater than about 8%, greater than about 9%, greater than about 10%, greater than about 12%, greater than about 15%, greater than about 20%, greater than about 25%, greater than about 30%, greater than about 35%, greater than about 40%, greater than about 45%, greater than about 50%, greater than about 55%, greater than about 60%, greater than about 65%, greater than about 70%, greater than about 75%, greater than about 80%, greater than about 85%, greater than about 90%, or greater than about 95%.

7. Nanoparticle Surface

In one aspect, due to a very small particle size, the nanoparticles of the invention can have an unusually high surface area to volume ratio. Consequently, the surface composition can have an influence on the observed properties of the nanoparticles of the invention. For example, the surface composition can be functionalized to enhance nanoparticle stability or to facilitate formation of dispersions or suspensions of collections of nanoparticles of the invention. Further, the surface of the nanocrystal can play an intimate role in the optical properties of the nanocrystal, such as the emission quantum yield (i.e., light in to light out ratio) and the width of the spectrum (i.e., emission band width).

The nanoparticles of the invention can be further functionalized at the surface. Such functionalization can occur during preparation or subsequent to preparation. In one aspect, the nanoparticle of the invention can further comprise an inorganic shell at the surface of the nanoparticle. The inorganic shell can comprise, for example, cadmium selenide, cadmium sulfide, cadmium telluride, zinc sulfide, zinc selenide, zinc telluride, magnesium sulfide, magnesium selenide, magnesium telluride, zinc sulfide, magnesium sulfide, or a mixture thereof. In a further aspect, inorganic shell can comprise, for example, cadmium oxide, magnesium oxide, zinc oxide, aluminum oxide, titanium dioxide, cadmium sulfoselenide, or cadmium selenium oxide. In one aspect, the inorganic shell can be optically transparent. In a further aspect, the inorganic shell can be absent from the nanoparticle of the invention.

In one aspect, the nanoparticle of the invention can further comprise an organic ligand coating at the surface of the nanoparticle. The organic ligand coating can comprise, for example, at least one of an alkylamine or arylamine residue, an alkyl- or arylphosphonic acid residue, a trialkyl- or triarylphosphine oxide residue, a trialkyl- or triarylphosphine residue, or a mixture thereof. In a further aspect, the organic ligand coating can comprise at least one of a hexadecylamine residue, a dodecylphosphonic acid residue, a tri-n-octylphosphine oxide residue, or a mixture thereof. In a yet further aspect, the organic ligand coating can comprise at least one alkyl or aryl phosphine; for example, the organic ligand coating can comprise tributylphosphine or triphenylphosphine. In an even further aspect, the organic ligand coating can comprise at least one alkylthiol or carboxylic acid or mixture thereof; for example, the organic ligand coating can comprise 1-octanethiol or decanoic acid. In a further aspect, organic ligand coating can be absent from the nanoparticle of the invention.

In a yet further aspect, the nanoparticle of the invention can further comprise an inorganic shell and an organic ligand coating at the surface of the nanoparticle.

8. Collections of Nanocrystals

In one aspect, the nanoparticle of the invention can be provided as part of a collection of nanoparticles comprising a plurality of nanoparticles of the invention. In such an aspect, the plurality of nanoparticles can exhibit the absorption properties and the emission properties disclosed herein for individual nanoparticles of the invention.

For example, the plurality of nanoparticles is capable of emitting light in a second electromagnetic region. In one aspect, the second electromagnetic region comprises an at least about 50 nm wide (FWHH) band of wavelengths, for example, at least about 60 nm wide (FWHH), at least about 70 nm wide (FWHH), at least about 80 nm wide (FWHH), at least about 90 nm wide (FWHH), at least about 100 nm wide (FWHH), at least about 125 nm wide (FWHH), at least about 150 nm wide (FWHH), at least about 175 nm wide (FWHH), at least about 200 nm wide (FWHH), at least about 250 nm wide (FWHH), at least about 300 nm wide (FWHH), at least about 350 nm wide (FWHH), or at least about 400 nm wide (FWHH). In a further aspect, the second electromagnetic region comprises an emission band at least about 100 nm wide, at least about 125 nm wide, at least about 150 nm wide, at least about 175 nm wide, at least about 200 nm wide, at least about 250 nm wide, at least about 300 nm wide, at least about 350 nm wide, or at least about 400 nm wide.

In a further aspect, the second electromagnetic region can comprise a band of wavelengths at least about 50 nm wide (FWHH), at least about 60 nm wide (FWHH), at least about 70 nm wide (FWHH), at least about 80 nm wide (FWHH), at least about 90 nm wide (FWHH), at least about 100 nm wide (FWHH), at least about 125 nm wide (FWHH), at least about 150 nm wide (FWHH), at least about 175 nm wide (FWHH), at least about 200 nm wide (FWHH), at least about 250 nm wide (FWHH), at least about 300 nm wide (FWHH), at least about 350 nm wide (FWHH), or at least about 400 nm wide (FWHH) in the region between about 400 nm and about 700 nm, about 420 nm and about 710 nm, about 350 nm and about 750 nm, about 400 nm and about 600 nm, about 500 nm and about 700 nm, about 300 nm and about 800 nm, about 500 nm and about 750 nm, or about 350 nm and about 600 nm. In further aspects, the second electromagnetic region can comprise light of all wavelengths from about 400 nm to about 700 nm or the visible light spectrum.

In one aspect, the plurality of nanoparticles of the invention can have an unusually narrow size distribution. Typically, the size distribution for a collection of nanoparticles of the invention can be such that at least about 80% of the nanoparticles have diameters within about 10% of the average diameter of the collection of nanoparticles. For example, the size distribution for a collection of nanoparticles of the invention can be such that at least about 50%—for example, at least about 60%, at least about 70%, at least about 80%, at least about 90%, or at least about 95%—of the nanoparticles have diameters within about 50%—for example, within about 40%, within about 30%, within about 20%, within about 10%, or within about 5%—of the average diameter of the collection of nanoparticles.

C. Methods of Preparing Broad-Emission Nanocrystals

Several reported synthetic schemes have produced ultrasmall nanocrystals by growing larger nanocrystals, then etching them with various chemical etchants. Landes, C.; Braun, M.; Burda, C.; El-Sayed, M. A. *Nano Lett.* 2001, 1, 667-670; Landes, C.; El-Sayed, M. A. *J. Phys. Chem. A* 2002, 106, 7621-7627. Reports of ultrasmall nanocrystals grown into the ultrasmall, in contrast to ultrasmall nanocrystals etched from larger nanocrystals, are relatively rare. Qu, L.; Yu, W. W.; Peng, X. *Nano Lett.* 2004, 4, 465-469; Chen, X.; Samia, A. C. S.; Lou, Y.; Burda, C. *J. Am. Chem. Soc.* 2005, 127, 4372-4375. Peng, Z. A.; Peng, X. *J. Am. Chem. Soc.* 2001, 123, 183-184. Inverse micellular methods and low temperature organometallic preparations can also yield ultrasmall nanocrystals; however, none of these methods produce nanocrystals with comparable optical properties to high-temperature pyrolytically-synthesized nanocrystals. Kasuya, A.; Sivamohan, R.; Barnakov, Y. A.; Dmitruk, I. M.; Nirasawa, T.; Romanyuk, V. R.; Kumar, V.; Mamykin, S. V.; Tohji, K.; Jeyadevan, B.; Shinoda, K.; Kudo, T.; Terasaki, O.; Liu, Z.; Beloludov, R. V.; Sundararajan, V.; Kawazoe, Y. *Nature Materials* 2004, 3, 99-102. Rogach, A., L.; Kornowski, A.; Gao, M.; Eychmuller, A.; Weller, H. J. Phys. Chem. B 1999, 103, 3065-3069.

In one aspect, the invention relates to a method of preparing an inorganic nanoparticle comprising the steps of heating a reaction mixture comprising a $C_4$ to $C_{22}$ alkylphosphonic acid and a source of cadmium or zinc to a temperature of greater than about 300° C.; adding to the reaction mixture an injection mixture comprising a $C_2$ to $C_{16}$ trialkylphosphine and a source of selenium, sulfur, or tellurium; and decreasing the temperature of the reaction mixture to less than about 300° C. In a further aspect, the reaction mixture can further comprise at least one of a $C_4$ to $C_{20}$ trialkylphosphine oxide, or a $C_8$ to $C_{20}$ alkylamine or arylamine, or a mixture thereof. In a yet further aspect, the injection mixture can further comprise a $C_6$ to $C_{24}$ hydrocarbon.

In a further aspect, the invention relates to a method of preparing an inorganic nanoparticle comprising the steps of providing an approximately 1.0 M injection mixture comprising selenium and tri-n-butylphosphine; diluting the injection mixture with octadecene to approximately 0.10 M concentration; providing a reaction mixture comprising tri-n-octylphosphine oxide, hexadecylamine, cadmium oxide, and dodecylphosphonic acid; heating the reaction mixture to a temperature of about 330° C.; adding the injection mixture to the reaction mixture so as to decrease the temperature of the reaction mixture to from about 260° C. to about 270° C.; and adding toluene to the reaction mixture so as to decrease the temperature of the reaction mixture to less than about 150° C. within about ten seconds after adding the injection mixture to the reaction mixture.

In a further aspect, the nanocrystals of the invention are not prepared by an etching process. In a yet further aspect, the nanocrystals of the invention are not prepared by an inverse micellular process.

1. Reaction Mixture

In one aspect, the reaction mixture comprises a $C_4$ to $C_{22}$ alkylphosphonic acid and a source of cadmium or zinc. In a further aspect, the reaction mixture comprises a $C_4$ to $C_{20}$ trialkylphosphine oxide, a $C_8$ to $C_{20}$ alkylamine or arylamine, a $C_4$ to $C_{22}$ alkylphosphonic acid, and a source of cadmium or zinc. In one aspect, the reaction mixture comprises a solution. In a further aspect, the reaction mixture comprises a suspension. It is understood that these components can be added to the reaction mixture in any order. In a further aspect, one or more of these components can be absent from the reaction mixture.

In general, the reaction mixture can be provided at any concentration. However, in one aspect, the alkylphosphonic acid is provided in molar excess relative to the source of cadmium or zinc. For example, the alkylphosphonic acid to source of cadmium or zinc ratio can be about 1:1, about 1.05:1, greater than about 1:1, about 1.5:1, about 2:1, about 3:1, about 4:1, about 5:1, or greater than about 5:1.

In a further aspect, the trialkylphosphine oxide is provided relative to the amount of the alkylamine. For example, the trialkylphosphine oxide can present in the reaction mixture in an amount of about 0%, about 5%, about 10%, about 20%, about 30%, about 40%, about 50%, about 60%, about 70%, about 80%, about 90%, about 5%, or about 100% of the total weight of the trialkylphosphine oxide and the alkylamine. Conversely, in one aspect, the alkylamine can present in the reaction mixture in an amount of about 0%, about 5%, about 10%, about 20%, about 30%, about 40%, about 50%, about 60%, about 70%, about 80%, about 90%, about 5%, or about 100% of the total weight of the trialkylphosphine oxide and the alkylamine.

In one aspect, a typical reaction mixture can comprise the components in the following exemplary amounts: about 1 mmol of the source of cadmium or zinc, about 2 mmol of the alkylphosphonic acid, about 18.6 mmol of the trialkylphosphine oxide, and about 12.25 mmol of alkylamine. It is understood, however, that the relative amounts of the various components can, of course, be varied. For example, relative to about 1 mmol of the source of cadmium or zinc, from about 2 mmol to about 5 mmol—for example, about 2.5 mmol, about 3 mmol, about 3.5 mmol, about 4 mmol, or about 4.5 mmol—of the alkylphosphonic acid can be present; from about 10 mmol to about 40 mmol—for example, from about 15 mmol to about 20 mmol or from about 15 mmol to about 25 mmol—of the trialkylphosphine oxide can be present; and from about 5 mmol to about 30 mmol—for example, from about 10 mmol to about 15 mmol, from about 10 mmol to about 20 mmol, or from about 15 mmol to about 20 mmol—of alkylamine can be present.

a. Alkylamine or Arylamine

In one aspect, the reaction mixture comprises a $C_8$ to $C_{20}$ alkylamine or arylamine. The $C_8$ to $C_{20}$ alkylamine or arylamine can be any $C_8$ to $C_{20}$ alkylamine or arylamine known to those of skill in the art. The $C_8$ to $C_{20}$ alkylamine or arylamine can be, for example, a $C_8$, $C_9$, $C_{10}$, $C_{11}$, $C_{12}$, $C_{13}$, $C_{14}$, $C_{15}$, $C_{16}$, $C_{17}$, $C_{18}$, $C_{19}$, or $C_{20}$ alkylamine or arylamine. In a further aspect, the alkylamine or arylamine can be a $C_{12}$ to $C_{20}$ alkylamine or arylamine, a $C_{12}$ to $C_{18}$ alkylamine or arylamine, or a $C_{14}$ to $C_{18}$ alkylamine or arylamine. In a further aspect, the alkylamine or arylamine comprises hexadecylamine. In one aspect, the alkylamine or arylamine can comprise mixtures of $C_8$ to $C_{20}$ alkylamines or arylamines. In a further aspect, the alkyl group of an alkylamine can be straight-chain or branched and can be substituted or unsubstituted. In a further aspect, the alkyl group of an alkylamine can be cyclic and/or the nitrogen of the alkylamine can comprise a heteroatom of a cyclic compound, for example, pyrimidine.

In one aspect, the $C_8$ to $C_{20}$ alkylamine or arylamine can comprise a primary amine, a secondary amine, a tertiary amine, or a mixture thereof. In one aspect, wherein the $C_8$ to $C_{20}$ alkylamine or arylamine is provided as a secondary amine, the alkylamine can have two $C_4$ to $C_{10}$ alkyl or aryl groups, which can be the same or different. In a further aspect, wherein the alkylamine or arylamine is provided as a secondary amine, the alkylamine or arylamine can have two $C_8$ to $C_{20}$ alkyl or aryl groups, which can be the same or different. In one aspect, wherein the $C_8$ to $C_{20}$ alkylamine or arylamine is provided as a tertiary amine, the alkylamine or arylamine can have three $C_2$ to $C_7$ alkyl or aryl groups, which can be the same or different and total to 8 to 20 carbon units. In a further aspect, wherein the alkylamine or arylamine is provided as a tertiary amine, the alkylamine can have three $C_8$ to $C_{20}$ alkyl or aryl groups, which can be the same or different.

In one aspect, the $C_8$ to $C_{20}$ alkylamine or arylamine can comprise an aromatic amine. That is, the nitrogen of the amine can be bound to one or more aromatic moieties, for example, to one or more benzene, naphthalene, pyridine, imidazole, chlorobenzene, toluene, or aniline residues. In a further aspect, the aryl group(s) of an arylamine can be the same or different and can be substituted or unsubstituted. In a further aspect, the nitrogen of the arylamine can comprise a heteroatom of a cyclic aromatic compound, for example, pyridine.

It is also understood that the $C_8$ to $C_{20}$ alkylamine or arylamine can be absent from the reaction mixture.

b. Alkyl- or Arylphosphonic Acid

In one aspect, the reaction mixture comprises a $C_4$ to $C_{22}$ alkyl- or arylphosphonic acid. The $C_4$ to $C_{22}$ alkyl- or arylphosphonic acid can be any $C_4$ to $C_{22}$ alkyl- or arylphosphonic acid known to those of skill in the art. The $C_4$ to $C_{22}$ alkyl- or arylphosphonic acid can be, for example, a $C_4$, $C_5$, $C_6$, $C_7$, $C_8$, $C_9$, $C_{10}$, $C_{11}$, $C_{12}$, $C_{13}$, $C_{14}$, $C_{15}$, $C_{16}$, $C_{17}$, $C_{18}$, $C_{19}$, $C_{20}$, $C_{21}$, or $C_{22}$ alkyl- or arylphosphonic acid. In a further aspect, the alkyl- or arylphosphonic acid can be a $C_4$ to $C_{16}$ alkyl- or arylphosphonic acid, or a $C_{10}$ to $C_{14}$ alkyl- or arylphosphonic acid. In a further aspect, the alkyl- or arylphosphonic acid comprises dodecylphosphonic acid. In one aspect, the alkyl- or arylphosphonic acid can comprise mixtures of $C_4$ to $C_{22}$ alkyl- or arylphosphonic acids. In a further aspect, the alkyl group of the alkyl- or arylphosphonic acid can be straight-chain or branched and can be substituted or unsubstituted.

In a further aspect, an alkyl group of an alkyl- or arylphosphonic acid can be straight-chain or branched and can be substituted or unsubstituted. In a further aspect, an alkyl group of an alkyl- or arylphosphonic acid can be cyclic and/or the phosphorous of an alkyl- or arylphosphonic acid can comprise a heteroatom of a cyclic compound.

In one aspect, an alkyl- or arylphosphonic acid can comprise an aromatic alkyl- or arylphosphonic acid. That is, the phosphorous of the phosphonic acid can be bound to an aromatic moiety, for example, to a benzene, a naphthalene, a pyridine, an imidazole, a toluene, or an aniline residue. In a further aspect, the aryl group(s) of an alkyl- or arylphosphonic acid can be substituted or unsubstituted. In a further aspect, the phosphorous of the alkyl- or arylphosphonic acid can comprise a heteroatom of a cyclic aromatic compound.

In one aspect, alkyl- or aryl-phosphonic acid moieties comprise at least about 20% of the total surface ligand coverage at the nanoparticle surface. For example, alkyl- or aryl-phosphonic acid moieties can comprise at least about 25%, at least about 30%, at least about 35%, at least about 40%, at least about 45%, at least about 50%, at least about 55%, at least about 60%, at least about 65%, at least about 70%, at least about 75%, at least about 80%, at least about 85%, at least about 90%, at least about 95%, or substantially all of the total surface ligand coverage.

In a further aspect, the $C_4$ to $C_{22}$ alkyl- or aryl-phosphonic acid and the source of cadmium or zinc can be provided in the reaction mixture in a molar ratio of from about 1:5 to about 1:1 Cd/Zn:phosphonic acid. For example, the $C_4$ to $C_{22}$ alkyl- or aryl-phosphonic acid and the source of cadmium or zinc can be provided in a molar ratio of from about 1:5 to about 1:1, of from about 1:4.5 to about 1:1, of from about 1:4 to about 1:1, of from about 1:3.5 to about 1:1, of from about 1:3 to about 1:1, of from about 1:2.5 to about 1:1, of from about 1:2 to about 1:1, of from about 1: to about 1:1, of from about 1:5 to about 1:1.5, of from about 1:5 to about 1:2, of from about 1:4.5 to about 1:1.5, of from about 1:4 to about 1:2, of from about 1:3.5 to about 1:2, of from about 1:3 to about 1:2, of from about 1:2.5 to about 1:2, of from about 1:2.5 to about 1:1.5, of about 1:5, of about 1:4.5, of about 1:4, of about 1:3.5, of about 1:3, of about 1:2.5, of about 1:2, of about 1:1.5, of about 1:1 Cd/Zn:phosphonic acid.

c. Trialkyl- or Triarylphosphine Oxide

In one aspect, the reaction mixture comprises a $C_4$ to $C_{20}$ trialkylphosphine oxide. The $C_4$ to $C_{20}$ trialkylphosphine oxide can be any $C_4$ to $C_{20}$ trialkylphosphine oxide known to those of skill in the art. That is, each alkyl group of the trialkylphosphine oxide can comprise a $C_4$ to $C_{20}$ alkyl group. The $C_4$ to $C_{20}$ trialkylphosphine oxide can be, for example, a $C_4$, $C_5$, $C_6$, $C_7$, $C_8$, $C_9$, $C_{10}$, $C_{11}$, $C_{12}$, $C_{13}$, $C_{14}$, $C_{15}$, $C_{16}$, $C_{17}$, $C_{18}$, $C_{19}$, or $C_{20}$ trialkylphosphine oxide. In a further aspect, the trialkylphosphine oxide can be a $C_4$ to $C_{12}$ trialkylphosphine oxide or a $C_6$ to $C_{10}$ trialkylphosphine oxide. In a further aspect, the $C_4$ to $C_{20}$ trialkylphosphine oxide comprises tri-n-octylphosphine oxide. In one aspect, the trialkylphosphine oxide can comprise mixtures of $C_8$ to $C_{20}$ trialkylphosphine oxides. In a further aspect, the alkyl groups of the trialkylphosphine oxide can be straight-chain or branched, can be substituted or unsubstituted, and can be the same or different.

In a further aspect, one or more alkyl group(s) of an trialkyl- or triarylphosphine oxide can be straight-chain or branched and can be substituted or unsubstituted. In a further aspect, one or more alkyl group(s) of an trialkyl- or triarylphosphine oxide can be cyclic and/or the phosphorous of an trialkyl- or triarylphosphine oxide can comprise a heteroatom of a cyclic compound.

In one aspect, an trialkyl- or triarylphosphine oxide can comprise an aromatic trialkyl- or triarylphosphine oxide. That is, the phosphorous of the trialkyl- or triarylphosphine oxide can be bound to one or more aromatic moieties, for example, to benzene, naphthalene, pyridine, imidazole, chlorobenzene, toluene, or aniline residues. In a further aspect, the aryl group(s) of an alkyl- or arylphosphonic acid can be the same or different and can be substituted or unsubstituted.

It is also understood that the $C_4$ to $C_{20}$ trialkylphosphine oxide can be absent from the reaction mixture.

d. Source of Cadmium or Zinc

In one aspect, the reaction mixture comprises a source of cadmium or zinc. That is, in one aspect, the reaction mixture comprises at least one compound capable of providing cadmium, zinc, or a mixture thereof. In a further aspect, the reaction mixture comprises more than one compound capable of providing cadmium, zinc, or a mixture thereof.

The source of cadmium or zinc can be any source of cadmium or zinc known to those of skill in the art. For example, the source of cadmium or zinc can comprise at least one of an oxide of cadmium or zinc, a dialkyl cadmium or dialkyl zinc, a carboxylate salt of cadmium or zinc or a phosphonate salt of cadmium or zinc or a mixture thereof.

In one aspect, the source of cadmium or zinc can comprise at least one of an oxide of cadmium or zinc. That is, the source of cadmium or zinc can be, for example, at least one of zinc oxide or cadmium oxide or a mixture thereof.

In one aspect, the source of cadmium or zinc can comprise at least one of a dialkyl cadmium or dialkyl zinc or a mixture thereof. In one aspect, the alkyl groups can be the same or different, can be substituted or unsubstituted, and can be straight-chain or branched. In a further aspect, the alkyl can be one or more $C_1$ to $C_6$ alkyl groups, for example, at least one of methyl, ethyl, propyl, butyl, pentyl, or hexyl groups or a mixture thereof. In further aspects, the alkyl can be one or more $C_1$ to $C_{12}$ alkyl groups or $C_6$ to $C_{12}$ alkyl groups.

In one aspect, the source of cadmium or zinc can comprise at least one of a carboxylate salt of cadmium or zinc or a phosphonate salt of cadmium or zinc or a mixture thereof. In one aspect, the carboxylate or a phosphonate group can be alkyl or aryl, can be substituted or unsubstituted, and can be straight-chain or branched. In a further aspect, the carboxylate or phosphonate group can be one or more $C_1$ to $C_6$ carboxylate or phosphonate groups, for example, at least one of methyl, ethyl, propyl, butyl, pentyl, or hexyl carboxylate or phosphonate group or a mixture thereof. In further aspects, the carboxylate or phosphonate group can be one or more $C_1$ to $C_{12}$ carboxylate or phosphonate groups or $C_6$ to $C_{12}$ carboxylate or phosphonate groups.

In a yet further aspect, the source of cadmium or zinc comprises at least one of zinc oxide, dimethyl zinc, cadmium oxide, cadmium acetate, cadmium stearate, or dimethyl cadmium or a mixture thereof. In a further aspect, the source of cadmium or zinc comprises cadmium oxide.

In one aspect, the source of cadmium or zinc and the alkylphosphonic acid can be provided in a molar ratio of from about 5:1 Cd/Zn:phosphonic acid to about 1:1 Cd/Zn:phosphonic acid. For example, the source of cadmium or zinc and the alkylphosphonic acid can be provided in a molar ratio of from about 4.5:1 Cd/Zn:phosphonic acid, about 4:1 Cd/Zn:phosphonic acid, about 3.5:1 Cd/Zn:phosphonic acid, about 3:1 Cd/Zn:phosphonic acid, about 2.5:1 Cd/Zn:phosphonic acid, about 2:1 Cd/Zn:phosphonic acid, or about 1.5:1 Cd/Zn:phosphonic acid. In a further aspect, the source of cadmium or zinc and the alkylphosphonic acid can be provided in a molar ratio of greater than about 5:1 Cd/Zn:phosphonic acid.

In another aspect, the source of cadmium or zinc and the alkylphosphonic acid can be provided in a molar ratio of from about 1:5 Cd/Zn:phosphonic acid to about 1:1 Cd/Zn:phosphonic acid. For example, the source of cadmium or zinc and the alkylphosphonic acid can be provided in a molar ratio of from about 1:4.5 Cd/Zn:phosphonic acid, about 1:4 Cd/Zn:phosphonic acid, about 1:3.5 Cd/Zn:phosphonic acid, about 1:3 Cd/Zn:phosphonic acid, about 1:2.5 Cd/Zn:phosphonic acid, about 1:2 Cd/Zn:phosphonic acid, or about 1:1.5 Cd/Zn:phosphonic acid. In a further aspect, the source of cadmium or zinc and the alkylphosphonic acid can be provided in a molar ratio of greater than about 1:5 Cd/Zn:phosphonic acid. In still other aspects, the molar ratio of the source of cadmium or zinc and the phosphonic acid can be less than or greater than any values specifically recited herein, and the present invention is not intended to be limited to any particular ratio.

e. Reaction Temperature

In one aspect, the reaction mixture is heated to a temperature before the injection mixture is added. In a further aspect, the reaction mixture is heated to a temperature sufficient to facilitate both initiation of nanocrystal formation and growth of nanocrystals before the injection mixture is added.

For example, the temperature can be greater than about 200° C., greater than about 225° C., greater than about 250° C., greater than about 275° C., greater than about 300° C., greater than about 310° C., greater than about 320° C., greater than about 330° C., greater than about 340° C., or greater than about 350° C. In a further aspect, the temperature can be less than about 400° C., less than about 450° C., less than about 400° C., less than about 375° C., less than about 350° C., less than about 325° C., less than about 300° C., less than about 275° C., less than about 250° C., or less than about 225° C.

In a further aspect, the reaction mixture can be heated to a temperature of from about 200° C. to about 400° C. before the injection mixture is added. For example, the temperature can be from about 250° C. to about 400° C., from about 300° C. to about 400° C., from about 250° C. to about 350° C., from about 300° C. to about 350° C., about 310° C., about 320° C., about 330° C., or about 340° C.

2. Injection Mixture

In one aspect, the injection mixture comprises a $C_2$ to $C_{16}$ trialkyl- or triarylphosphine and a source of selenium, sulfur, or tellurium. In a further aspect, the injection mixture comprises a $C_2$ to $C_{16}$ trialkyl- or triarylphosphine, a $C_6$ to $C_{24}$ hydrocarbon, and a source of selenium, sulfur, or tellurium. In one aspect, the injection mixture comprises a solution. In a further aspect, the injection mixture comprises a suspension. It is understood that these components can be added to the injection mixture in any order. In a further aspect, one or more of these components can be absent from the injection mixture.

In general, the injection mixture can be provided at any concentration. However, in one aspect, the injection mixture can be provided as a solution of the source of selenium, sulfur, or tellurium in the $C_2$ to $C_{16}$ trialkyl- or triarylphosphine, which can then be diluted with a $C_6$ to $C_{24}$ hydrocarbon. In a further aspect, the injection mixture can be provided as a suspension of the source of selenium, sulfur, or tellurium in the $C_2$ to $C_{16}$ trialkyl- or triarylphosphine, which can then be diluted with a $C_6$ to $C_{24}$ hydrocarbon. The mixture can be provided at any desired concentration and is typically provided at a concentration of from about 0.1 M to about 7 M. For example, the source of selenium, sulfur, or tellurium can be provided as an approximately 1.0 M (e.g., approximately 0.25 M, approximately 0.5 M, approximately 0.75 M, approximately 1.25 M, approximately 1.5 M, approximately 1.75 M, approximately 2 M, approximately 2.5 M, or approximately 3 M) mixture in the $C_2$ to $C_{16}$ trialkyl- or triarylphosphine and can then be optionally diluted with a $C_6$ to $C_{24}$ hydrocarbon to, for example, an approximately 0.1 M (e.g., approximately 0.025 M, approximately 0.05 M, approximately 0.075 M, approximately 0.125 M, approximately 0.15 M, approximately 0.175 M, approximately 0.2 M, approximately 0.25 M, or approximately 0.3 M) concentration.

In one aspect, source of selenium, sulfur, or tellurium can be provided in an amount and concentration so as to achieve a Cd/Zn:Se/S/Te ratio of greater than about 1.01:1 after the injection mixture is added to the reaction mixture. That is, in one aspect, the overall reaction can be maintained cation-rich (i.e., Cd- or Zn-rich). For example, the Cd/Zn:Se/S/Te ratio can be greater than about 1.01:1, greater than about 1.05:1, greater than about 1.1:1, greater than about 1.2:1, greater than about 1.3:1, greater than about 1.4:1, greater than about 1.5:1, greater than about 2:1, greater than about 3:1, greater than about 4:1, or greater than about 5:1.

In a further aspect, the Cd/Zn:Se/S/Te ratio can be from about 1.01:1 to about 5:1, for example, about 1.05:1 to about 4:1, about 1.1:1 to about 3:1, about 1.5:1 to about 2:1, about 1.5:1 to about 2.5:1, about 2:1 to about 2.5:1, about 1.01:1, about 1.05:1, about 1.1:1, about 1.2:1, about 1.3:1, about 1.4:1, about 1.5:1, about 2:1, about 3:1, greater than about 4:1, or about 5:1.

In a yet further aspect, the Cd/Zn:Se/S/Te ratio can be from about 1:1.01 to about 1:5, for example, about 1:1.05 to about 1:4, about 1:1.1 to about 1:3, about 1:1.5 to about 1:2, about 1:1.5 to about 1:2.5, about 1:2 to about 1:2.5, about 1:1.01, about 1:1.05, about 1:1.1, about 1:1.2, about 1:1.3, about 1:1.4, about 1:1.5, about 1:2, about 1:3, greater than about 1:4, or about 1:5. In a still further aspect, the Cd/Zn:Se/S/Te ratio can be about 1:1.3, for example, from about 1:1.0 to about 1:6, from about 1:1.1 to about 1:5, from about 1:1.2 to about 1:4, or from about 1:1.25 to about 1:35.

In a further aspect, the $C_2$ to $C_{16}$ trialkyl- or triarylphosphine is provided relative to the amount of the $C_6$ to $C_{24}$ hydrocarbon. For example, the trialkyl- or triarylphosphine can present in the reaction mixture in an amount of about 1%, about 2.5%, about 5%, about 10%, about 15%, about 20%, about 30%, about 40%, about 50%, about 60%, about 70%, about 80%, about 90%, about 95%, or about 100%, of the total weight of the trialkyl- or triarylphosphine and the hydrocarbon. Conversely, in one aspect, the hydrocarbon can present in the reaction mixture in an amount of about 99%, about 97.5%, about 95%, about 90%, about 85%, about 80%, about 70%, about 60%, about 50%, about 40%, about 30%, about 20%, about 10%, about 5%, or about 0% of the total weight of trialkyl- or triarylphosphine and the hydrocarbon. It is understood that the relative amounts can also be expressed as a ratio.

In certain aspects, the $C_6$ to $C_{24}$ hydrocarbon and the $C_2$ to $C_{16}$ trialkyl- or triarylphosphine are provided in a ratio in the injection solution of less than about 70:30, of about 70:30, of less than about 75:25, or of about 75:25. In further aspects, the $C_6$ to $C_{24}$ hydrocarbon can be octadecene, and the $C_2$ to $C_{16}$ trialkyl- or triarylphosphine can be tri-n-butylphosphine. For example, the $C_6$ to $C_{24}$ hydrocarbon can be octadecene, the $C_2$ to $C_{16}$ trialkyl- or triarylphosphine can be tri-n-butylphosphine are, and the octadecene and the tri-n-butylphosphine can be provided in a ratio in the injection solution of from about 80:20 to about 60:40. In a further example, the $C_6$ to $C_{24}$ hydrocarbon can be octadecene, the $C_2$ to $C_{16}$ trialkyl- or triarylphosphine can be tri-n-butylphosphine are, and the octadecene and the tri-n-butylphosphine can be provided in a ratio in the injection solution of from about 70:30 to about 75:25. In certain aspects, these methods can prepare inorganic nanoparticles having a quantum yield of at least about 5%, at least about 8%, or at least about 10%.

Without wishing to be bound by theory, it is believed that the ratio of the $C_2$ to $C_{16}$ trialkyl- or triarylphosphine to the $C_6$ to $C_{24}$ hydrocarbon can affect the quantum yield of the resultant nanocrystals. That is, certain ratios of the $C_2$ to $C_{16}$ trialkyl- or triarylphosphine to the $C_6$ to $C_{24}$ hydrocarbon can increase the rate of reduction of cadmium oxide or zinc oxide, thereby facilitating availability of the metal. Further, without wishing to be bound by theory, it is believed that the disclosed ratios of the $C_2$ to $C_{16}$ trialkyl- or triarylphosphine to the $C_6$ to $C_{24}$ hydrocarbon can facilitate formation of the core crystal structure of the nanocrystals, thereby providing superior structures.

a. Trialkyl- or Triarylphosphine

In one aspect, the reaction mixture comprises a $C_2$ to $C_{16}$ trialkyl- or triarylphosphine. The $C_2$ to $C_{16}$ trialkyl- or triarylphosphine can be any $C_2$ to $C_{16}$ trialkyl- or triarylphosphine known to those of skill in the art. That is, each alkyl group of a $C_2$ to $C_{16}$ trialkylphosphine can comprise a $C_2$ to $C_{16}$ alkyl group. A $C_2$ to $C_{16}$ trialkylphosphine can be, for example, a $C_2$, $C_3$, $C_4$, $C_5$, $C_6$, $C_7$, $C_8$, $C_9$, $C_{10}$, $C_{11}$, $C_{12}$, $C_{13}$, $C_{14}$, $C_{15}$, or $C_{16}$ trialkylphosphine. In a further aspect, a trialkylphosphine can be a $C_2$ to $C_{12}$ trialkylphosphine, a $C_2$ to $C_{10}$ trialkylphosphine, a $C_2$ to $C_8$ trialkylphosphine, or a $C_2$ to $C_6$ trialkylphosphine. In a further aspect, a $C_2$ to $C_{16}$ trialkylphosphine comprises tri-n-butylphosphine. In one aspect, a $C_2$ to $C_{16}$ trialkylphosphine can comprise mixtures of $C_2$ to $C_{16}$ trialkylphosphines. In a further aspect, the alkyl groups of a $C_2$ to $C_{16}$ trialkylphosphine can be straight-chain or branched, can be substituted or unsubstituted, and can be the same or different. In a further aspect, the alkyl group of a trialkylphosphine can be cyclic and/or the phosphorous of a trialkylphosphine can comprise a heteroatom of a heterocyclic compound.

In one aspect, the $C_2$ to $C_{16}$ trialkyl- or triarylphosphine can comprise an aromatic phosphine. That is, the phosphorous of the phosphine can be bound to one or more aromatic moieties, for example, to one or more benzene, naphthalene, pyridine, imidazole, chlorobenzene, toluene, or aniline residues. In a further aspect, the aryl group(s) of an arylphosphine can be the same or different and can be substituted or unsubstituted. In a further aspect, the phosphorous of the arylphosphine can comprise a heteroatom of a cyclic aromatic compound.

It is also understood that the $C_2$ to $C_{16}$ trialkyl- or triarylphosphine can be absent from the reaction mixture.

b. Hydrocarbon

In one aspect, the reaction mixture comprises a $C_6$ to $C_{24}$ hydrocarbon. The hydrocarbon can be any $C_6$ to $C_{24}$ hydrocarbon known to those of skill in the art. The $C_6$ to $C_{24}$ hydrocarbon can be, for example, a $C_6$, $C_7$, $C_8$, $C_9$, $C_{10}$ $C_{11}$, $C_{12}$, $C_{13}$, $C_{14}$, $C_{15}$, $C_{16}$ $C_{17}$, $C_{18}$, $C_{19}$, $C_{20}$, $C_{21}$, $C_{22}$, $C_{23}$, or $C_{24}$ hydrocarbon. In a further aspect, the $C_6$ to $C_{24}$ hydrocarbon can be a $C_6$ to $C_{12}$ hydrocarbon, a $C_{14}$ to $C_{22}$ hydrocarbon, or a $C_{16}$ to $C_{20}$ hydrocarbon. In a further aspect, the $C_6$ to $C_{24}$ hydrocarbon comprises octadecene. In one aspect, the $C_6$ to $C_{24}$ hydrocarbon can comprise mixtures of $C_6$ to $C_{24}$ hydrocarbons. In a further aspect, the $C_6$ to $C_{24}$ hydrocarbon can be straight-chain or branched and can be substituted or unsubstituted. For example, halogenated hydrocarbons can be used. In a further aspect, the $C_6$ to $C_{24}$ hydrocarbon can comprise a cyclic hydrocarbon.

In a further aspect, the $C_6$ to $C_{24}$ hydrocarbon can comprise an aromatic hydrocarbon. That is, the hydrocarbon can comprise, for example, benzene, naphthalene, pyridine, imidazole, chlorobenzene, toluene, or aniline. Further, in one aspect, the hydrocarbon can comprise one or more benzene, naphthalene, pyridine, imidazole, chlorobenzene, toluene, or aniline residues. In a further aspect, the aryl group(s) of the $C_6$ to $C_{24}$ hydrocarbon can be the same or different and can be substituted or unsubstituted.

It is also understood that the $C_6$ to $C_{24}$ hydrocarbon can be absent from the reaction mixture.

c. Source of Selenium, Sulfur, or Tellurium

In one aspect, the injection mixture comprises a source of selenium, sulfur, or tellurium. That is, in one aspect, the injection mixture comprises at least one compound capable of providing selenium, sulfur, or tellurium or a mixture thereof. In a further aspect, the reaction mixture comprises more than one compound capable of providing selenium, sulfur, or tellurium or a mixture thereof.

The source of selenium, sulfur, or tellurium can be any source of selenium, sulfur, or tellurium known to those of skill in the art. In one aspect, the source of selenium, sulfur, or tellurium comprises at least one of selenium powder, sulfur powder, or tellurium powder or a mixture thereof. In a further aspect, the source of selenium, sulfur, or tellurium comprises at least one of hexamethyl silylsulfide, hexamethyl silylselenide, or hexamethyl silyltelluride or a mixture thereof d. Injection Temperature In one aspect, the injection mixture can be provided at any convenient temperature. In a further aspect, the injection mixture can be provided at a temperature lower than that of the reaction mixture temperature. For example, the injection mixture can be provided at room temperature. It is also understood that the injection mixture can be provided at a temperature higher than room temperature. Typically, the injection mixture is provided at a temperature of equal to or less than that necessary to maintain nanocrystal growth. In one aspect, the injection mixture is provided at a temperature of less than that necessary to maintain nanocrystal formation initiation. By "the injection mixture can be provided," it is meant that, in one aspect, the injection mixture can be added to the reaction mixture at the provided temperature.

In one aspect, the temperature of the injection mixture can be maintained at a temperature of less than that necessary to initiate nanocrystal formation. That is, an injection mixture containing both a source of source of cadmium or zinc and a source of selenium, sulfur, or tellurium can be provided at a temperature of less than that necessary to initiate nanocrystal formation until a heating step is performed, thereby initiating nanocrystal formation. In a further aspect, the temperature of the injection mixture can be maintained at a temperature of less than that necessary to maintain nanocrystal growth. That is, an injection mixture containing a source of selenium, sulfur, or tellurium can be provided at a temperature of less than that necessary to initiate nanocrystal formation until added to the reaction mixture, thereby decreasing the temperature of the reaction mixture to less than that necessary to initiate nanocrystal formation.

In a further aspect, the injection mixture can be provided at less than about 300° C., less than about 275° C., less than about 250° C., less than about 225° C., less than about 200° C., less than about 175° C., less than about 150° C., less than about 125° C., less than about 100° C., less than about 75° C., or less than about 50° C. In a further aspect, the injection mixture can be provided at about 300° C., about 275° C., about 250° C., about 225° C., about 200° C., about 175° C., about 150° C., about 125° C., about 100° C., about 75° C., about 50° C., or about 25° C.

In a further aspect, the injection mixture can be provided at a temperature of from about 25° C. to about 300° C., from about 25° C. to about 275° C., from about 25° C. to about 250° C., from about 25° C. to about 225° C., from about 25° C. to about 250° C., from about 25° C. to about 225° C., from about 25° C. to about 200° C., from about 25° C. to about 175° C., from about 25° C. to about 150° C., from about 25° C. to about 125° C., from about 25° C. to about 100° C., from about 200° C. to about 300° C., from about 100° C. to about 200° C., from about 150° C. to about 250° C., or from about 50° C. to about 150° C.

In a yet further aspect, the injection mixture can be provided at temperature less than room temperature. For example, the injection mixture can be provided at a temperature of from about 0° C. to about 25° C., from about 5° C. to about 25° C., from about 10° C. to about 25° C., from about 15° C. to about 25° C., from about 0° C. to about 10° C., or of less than about 0° C.

3. Temperature Decrease

In one aspect, the injection mixture can be added to the reaction mixture so as to decrease the temperature of the reaction mixture and, thus, the temperature of the resulting combined mixture. In one aspect, the addition of the injection mixture lowers the temperature of the combined mixture to a temperature at which nanocrystal initiation is disfavored, yet nanocrystal growth is still favored. In a further aspect, the addition of the injection mixture lowers the temperature of the combined mixture to a temperature at which both nanocrystal initiation and nanocrystal growth are disfavored.

In one aspect, addition of the injection mixture decreases the temperature of the reaction mixture to less than about 300° C., for example, to less than about 270° C., to less than about 250° C., to less than about 225° C., to less than about 200° C., to less than about 175° C., to less than about 150° C., or to less than about 125° C. In a further aspect, addition of the injection mixture decreases the temperature of the reaction mixture to from about 150° C. to about 300° C., from about 150° C. to about 250° C., from about 150° C. to about 200° C., from about 200° C. to about 250° C., or from about 250° C. to about 300° C.

It is understood that both injection mixture temperature and injection mixture addition rate can influence the temperature of the combined mixture and, thus the kinetics of nanocrystal initiation and nanocrystal growth. Typically, nucleation can occur at relatively higher temperatures, and growth can occur at relatively lower temperatures. If, for example, injection is distributed over a longer time period, the temperature remains at the nucleation temperature longer and, thus, more nanocrystals can nucleate. If, as a further example, injection is distributed over a shorter time period, the temperature remains at the nucleation temperature for less time and, thus, fewer nanocrystals can nucleate.

In one aspect, the temperature of the reaction mixture is decreased to less than a temperature within a time after adding the injection mixture to the reaction mixture. For example, the temperature can be about 330° C., about 320° C., about 310° C., about 300° C., about 290° C., about 280° C., about 270° C., about 260° C., about 250° C., about 240° C., about 230° C., about 220° C., about 210° C., about 200° C., about 190° C., about 180° C., about 170° C., about 160° C., or about 150° C. For example, the time can be about 90 seconds, about 60 seconds, about 30 seconds, about 20 seconds, about 10 seconds, or about 5 seconds.

It is also understood that external cooling can be used to decrease the temperature of the combined mixture, both in place of and in concert with the cooling effect of the addition of injection mixture.

4. Temperature Control Solvents

In one aspect, a solvent can be added to the combined mixture after addition of the injection mixture, or simultaneous with the addition of the injection mixture, so as to decrease the temperature of the combined mixture. That is, the addition of a solvent can lower the temperature of the combined mixture. In one aspect, the addition of a solvent mixture lowers the temperature of the combined mixture to a temperature at which both nanocrystal initiation and nanocrystal growth are disfavored.

In one aspect, a solvent can be provided at any convenient temperature. In a further aspect, a solvent can be provided at a temperature lower than that of the combined mixture temperature. For example, a solvent can be provided at room temperature. Typically, a solvent is provided at a temperature of less than that necessary to maintain nanocrystal growth. By “a solvent can be provided,” it is meant that, in one aspect, a solvent can be added to the combined mixture at the provided temperature.

In a further aspect, a solvent can be provided at less than about 300° C., less than about 275° C., less than about 250° C., less than about 225° C., less than about 200° C., less than about 175° C., less than about 150° C., less than about 125° C., less than about 100° C., less than about 75° C., or less than about 50° C. In a further aspect, a solvent can be provided at about 300° C., about 275° C., about 250° C., about 225° C., about 200° C., about 175° C., about 150° C., about 125° C., about 100° C., about 75° C., about 50° C., or about 25° C.

In a further aspect, a solvent can be provided at a temperature of from about 25° C. to about 300° C., from about 25° C. to about 275° C., from about 25° C. to about 250° C., from about 25° C. to about 225° C., from about 25° C. to about 250° C., from about 25° C. to about 225° C., from about 25° C. to about 200° C., from about 25° C. to about 175° C., from about 25° C. to about 150° C., from about 25° C. to about 125° C., from about 25° C. to about 100° C., from about 200° C. to about 300° C., from about 100° C. to about 200° C., from about 150° C. to about 250° C., or from about 50° C. to about 150° C.

In a yet further aspect, a solvent can be provided at temperature less than room temperature. For example, a solvent can be provided at a temperature of from about 0° C. to about 25° C., from about 5° C. to about 25° C., from about 10° C. to about 25° C., from about 15° C. to about 25° C., from about 0° C. to about 10° C., or of less than about 0° C.

In one aspect, addition of the injection mixture decreases the temperature of the reaction mixture to less than about 300° C., for example, to less than about 270° C., to less than about 250° C., to less than about 225° C., to less than about 200° C., to less than about 175° C., to less than about 150° C., or to less than about 125° C. In a further aspect, addition of the injection mixture decreases the temperature of the reaction mixture to from about 150° C. to about 300° C., from about 150° C. to about 250° C., from about 150° C. to about 200° C., from about 200° C. to about 250° C., or from about 250° C. to about 300° C.

It is understood that both solvent temperature and solvent addition rate can influence the temperature of the combined mixture and, thus the kinetics of nanocrystal initiation and nanocrystal growth. In one aspect, the temperature of the combined mixture is decreased to less than a temperature within a time after adding the solvent to the combined mixture. For example, the temperature can be about 330° C., about 320° C., about 310° C., about 300° C., about 290° C., about 280° C., about 270° C., about 260° C., about 250° C., about 240° C., about 230° C., about 220° C., about 210° C., about 200° C., about 190° C., about 180° C., about 170° C., about 160° C., or about 150° C. For example, the time can be about 90 seconds, about 60 seconds, about 30 seconds, about 20 seconds, about 10 seconds, or about 5 seconds.

It is also understood that external cooling can be used to decrease the temperature of the combined mixture, both in place of and in concert with the cooling effect of the addition of a solvent.

In one aspect, the solvent comprises at least one $C_1$ to $C_{12}$ alcohol. For example, the alcohol can be methanol, ethanol, propanol, or butanol. The alcohol can be straight-chain or branched and can be substituted or unsubstituted. In a further aspect, mixtures of alcohols can be used. As a further example, the $C_1$ to $C_{12}$ alcohol can be a diol or a triol. In a further aspect, the solvent comprises at least one $C_5$ to $C_{12}$ hydrocarbon or $C_5$ to $C_{12}$ cyclic hydrocarbon or a mixture thereof. The hydrocarbon can be straight-chain or branched and can be substituted or unsubstituted. In a further aspect, mixtures of hydrocarbons can be used. In a further example, the solvent can be an aromatic solvent. For example, the solvent can be at least one of benzene, toluene, or xylene or a mixture thereof. As a further example, halogenated solvents can be used. In a further aspect, toluene can be added to the reaction mixture so as to decrease the temperature of the reaction mixture to less than about 150° C.

It is also understood that the use of temperature control solvents can be absent from the invention.

5. Combined Injection Method

In one aspect, the invention relates to a method of preparing an inorganic nanoparticle comprising the sequential steps of heating a composition comprising a source of cadmium or zinc and a source of selenium, sulfur, or tellurium to a temperature sufficient to initiate nanoparticle formation and sufficient to support nanoparticle growth; cooling the composition to a temperature insufficient to initiate nanoparticle formation but sufficient to support nanoparticle growth; and cooling the composition to a temperature insufficient to initiate nanoparticle formation and insufficient to support nanoparticle growth. In a further aspect, the composition can further comprise at least one of a $C_4$ to $C_{20}$ trialkyl- or triarylphosphine oxide, a $C_8$ to $C_{20}$ alkylamine or arylamine, a $C_4$ to $C_{22}$ alkyl- or arylphosphonic acid, a $C_2$ to $C_{16}$ trialkyl- or triarylphosphine, or a $C_6$ to $C_{24}$ hydrocarbon or a mixture thereof. It is understood that the various components, reactants, solvents, temperatures, and conditions of the invention can also be used in connection with the combined injection method to produce the nanoparticles of the invention.

In a further aspect, a temperature sufficient to initiate nanoparticle formation and sufficient to support nanoparticle growth can be from about 250° C. to about 400° C., for example, from about 275° C. to about 350° C., from about 300° C. to about 350° C., from about 325° C. to about 350° C., from about 300° C. to about 375° C., or from about 300° C. to about 400° C. In a further aspect, a temperature insufficient to initiate nanoparticle formation but sufficient to support nanoparticle growth can be from about 150° C. to about 350° C., for example, from about 200° C. to about 300° C., from about 225° C. to about 300° C., from about 250° C. to about 300° C., from about 275° C. to about 300° C., or from about 275° C. to about 325° C. In a further aspect, a temperature insufficient to initiate nanoparticle formation and insufficient to support nanoparticle growth can be from about 100° C. to about 300° C., for example, from about 150° C. to about 250° C., from about 175° C. to about 250° C., from about 200° C. to about 250° C., from about 225° C. to about 250° C., from about 200° C. to about 225° C., from about 175° C. to about 200° C., from about 150° C. to about 200° C., less than about 200° C., less than about 175° C., or less than about 150° C.

In one aspect, the heating step can comprise the steps of heating a reaction mixture to a temperature sufficient to initiate nanoparticle formation and sufficient to support nanoparticle growth, and adding to the reaction mixture an injection mixture comprising a source of cadmium or zinc and a source of selenium, sulfur, or tellurium. In a further aspect, the heating step can comprise the steps of heating a reaction mixture comprising a source of cadmium or zinc to a temperature sufficient to initiate nanoparticle formation and sufficient to support nanoparticle growth, and adding to the reaction mixture an injection mixture comprising a source of selenium, sulfur, or tellurium.

D. Theoretical

Typically, the ultrasmall nanocrystals of the invention do not exhibit the strong band edge emission feature that is observed in conventional CdSe nanocrystals, but do exhibit strong band edge absorption features indicative of high quality CdSe nanocrystals. Without wishing to be bound by theory, it is believed that the broad emission can be attributed to charge recombination from surface midgap states that arise from the presence of non-coordinated surface selenium sites. See, e.g., Hill, N. A.; Whaley, K. B. *J. Chem. Phys.* 1994, 100, 2831-2837. While band edge emission can occur by direct recombination of the electron and hole within a nanocrystal, deep trap emission can occur when a photogenerated hole, trapped in a midgap state, encounters an electron before it can relax non-radiatively to the ground state. See, e.g., Underwood, D. F.; Kippeny, T. C.; Rosenthal, S. J., *Journal of Physical Chemistry B* 2001, 105, 436-443. That is, without wishing to be bound by theory, it is believed that the observed properties are the direct result of the extreme surface-to-volume ratio forcing the electron and hole to predominately interact at the nanocrystal surface.

This phenomenon of hole trapping to the selenium surface sites has been studied by ultrafast fluorescence upconversion spectroscopy. Underwood, D. F.; Kippeny, T. C.; Rosenthal, S. J., *Journal of Physical Chemistry B* 2001, 105, 436-443. Typically, as nanocrystal size decreases, the amount of hole trapping increases. Without wishing to be bound by theory, it is believed that this is due not only to the reduced physical distance the hole must travel to reach the surface, but also to an increased surface-to-volume ratio resulting in more available surface sites. Accordingly, as nanocrystal size continues to decrease, an even larger population of photoexcited excitons can be funneled toward the hole-trapping decay pathway, ultimately making it the dominant mode of radiative relaxation. Ultrasmall nanocrystals are so small that the electron wave function can have significant overlap with the selenium surface sites. Brus, L. E. *J. Chem. Phys* 1984, 80; Brus, L. *J. Phys. Chem.* 1986, 90, 2555-2560. Therefore, any hole trapped on the surface would likely encounter the electron before non-radiatively relaxing to the ground state. Underwood, D. F.; Kippeny, T. C.; Rosenthal, S. J. *Journal of Physical Chemistry B* 2001, 105, 436-443. Compounding this situation, in the present invention, nanocrystal growth time is so short (typically, from about 10 seconds to about 20 seconds) that surface reconstruction and high temperature annealing have little time to occur. Without wishing to be bound by theory, it is believed that this results in a surface that is likely defect-ridden. Furthermore, unlike larger nanocrystals, the diameter of the ultrasmall nanocrystal and the length of the ligand are quite comparable. Again, without wishing to be bound by theory, it is believed that coupling of vibrational modes of the ligand to surface atoms, as well as collisional relaxation, can provide further avenues for energy dissipation, thereby providing more effective trap sites and potentially contributing to the broad lognormal emission line shape.

Figure 2:
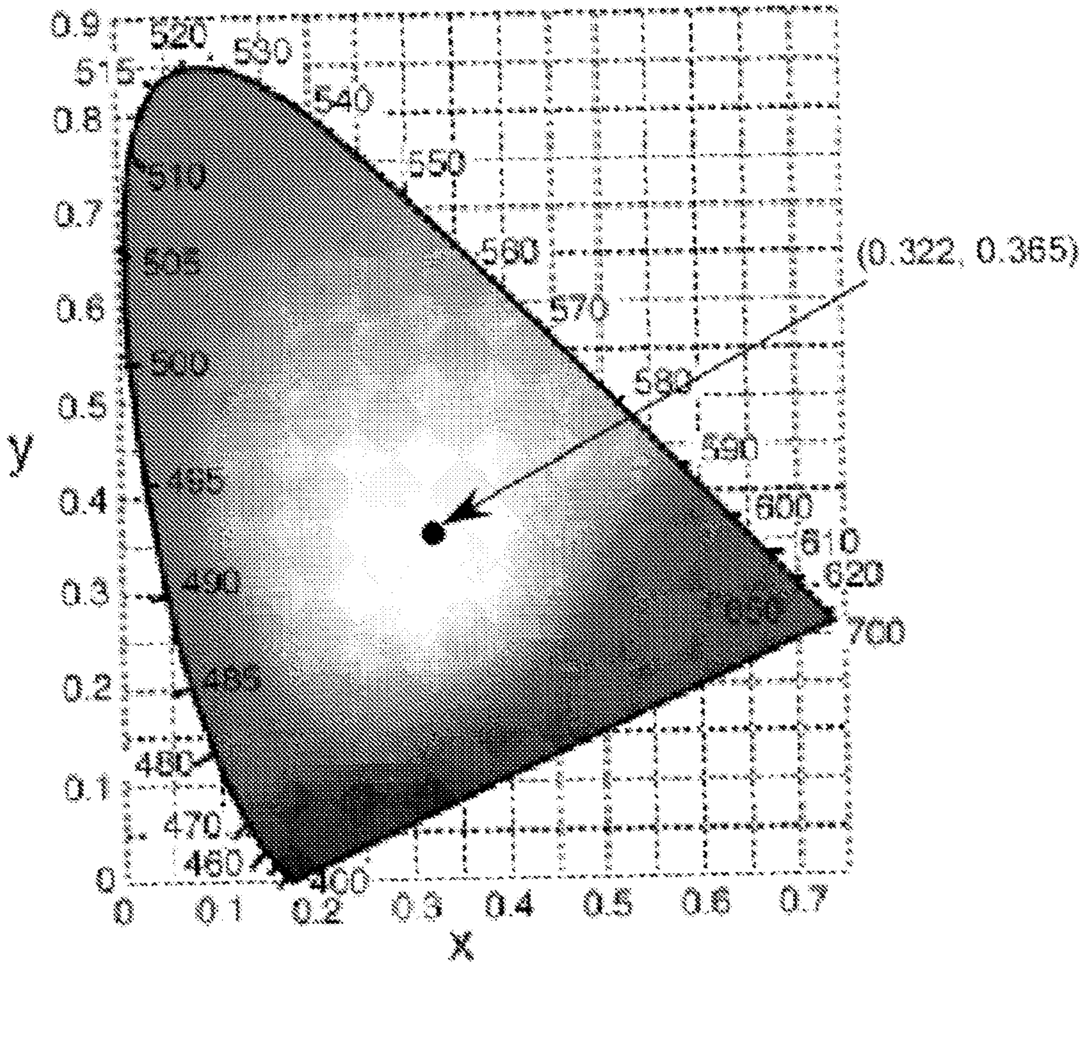
FIG. 2 shows a C. I. E. 1931 chromaticity diagram. The chromaticity diagram illustrates all of the colors of the visible spectrum corrected for the response of the human eye. The dot indicates the chromaticity coordinates of the nanoparticles of the invention. This figure illustrates that the nanoparticles produce a slightly warm white light that is comparable to that of a tungsten light bulb.
Figure 3:
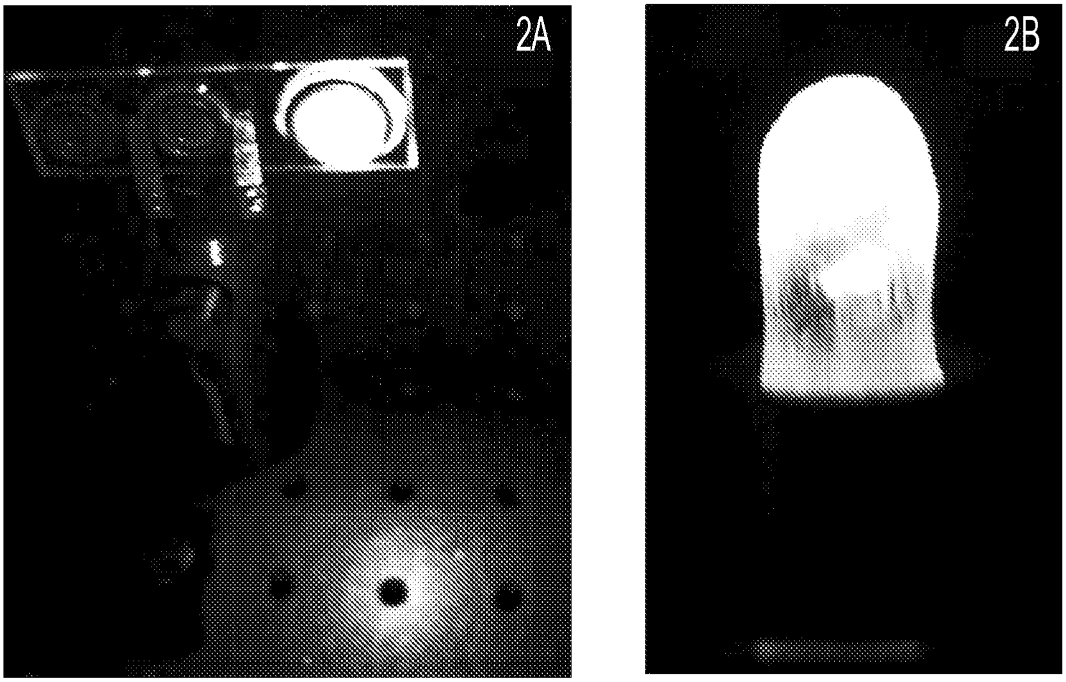
FIG. 3 shows white-light emission from CdSe nanoparticles of the invention. (Left panel) Thin film of ultrasmall CdSe in polyurethane excited by a frequency doubled titanium:sapphire laser (400 nm) with white-light clearly seen reflecting off the table surface. (Right panel) 5 mm commercial UV LED (400 nm) illuminating a thin coating of ultrasmall CdSe in polyurethane.
Figure 4:
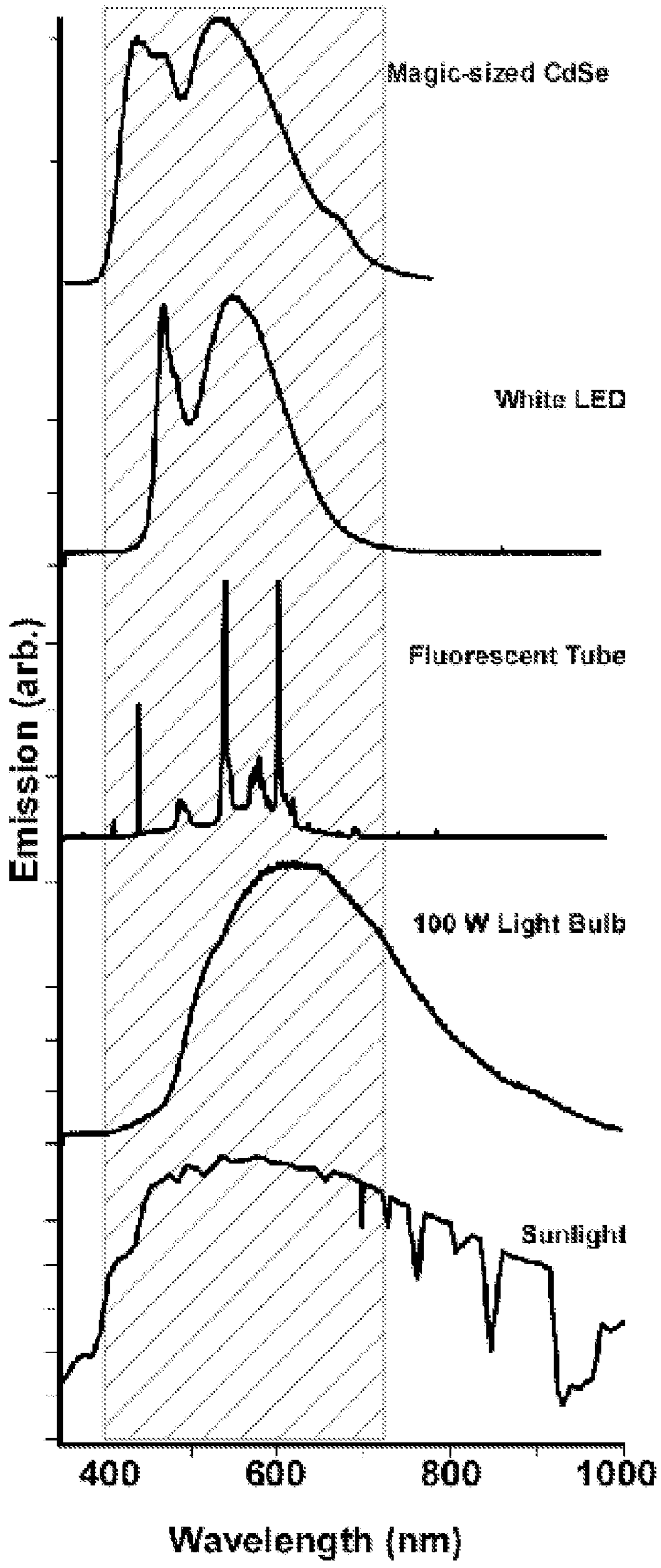
FIG. 4 shows a comparison of conventional tungsten and fluorescent lighting emission spectra with the AM 1.5 solar spectrum, a commercial white LED and ultrasmall CdSe nanocrystals. The CdSe nanoparticles of the invention exhibit a broad emission covering most of the visible spectrum. Unlike conventional tungsten sources, no energy is wasted producing wavelengths beyond the visible spectrum.

While deep trap emission can be quite common in small (<30 Å) nanocrystals, it is typically accompanied by a large band edge emission feature. Landes, C. F.; Braun, M.; El-Sayed, M. A. *J. Phys. Chem. B* 2001, 105, 10554-10558; Murray, C. B.; Norris, D. J.; Bawendi, M. G. *J. Am. Chem. Soc.* 1993, 115, 8706-8715. In contrast to that observed in the present invention, the presence of a strong band edge feature can bias the white-light emission toward a particular color, thereby reducing the quality of the white light produced. The band edge emission feature of the nanoparticles of the invention is greatly diminished, providing a more balanced white-light emission with chromaticity coordinates of 0.322, 0.365, which fall well within the white region of the 1931 CIE diagram (FIG. 2). See also http://hyperphysics.phy-astr.gsu.edu/hbase/vision/cie.html#c2. Examples of the white-light emission are shown in FIG. 3. FIG. 4 compares the emission spectrum of ultrasmall CdSe nanocrystals to conventional tungsten (General Electric 100 W) and fluorescent lighting (Sylvania Octron® #F032) emission spectra with the AM 1.5 solar spectrum, and a commercial white LED (Photon MicroLight®, Photon Light.com). The visible spectrum is denoted by the shaded area.

E. Surface-Modified Ultrasmall Nanocrystals With Enhanced Quantum Yield

The synthesis, and subsequent functionality, of semiconductor nanocrystals for a variety of applications has become a topic of broad scientific interest. [Kuno, M.; Lee, J. K.; Dabbousi, B. O.; Mikulec, F. V.; Bawendi, M. G., The band edge luminescence of surface modified CdSe nanocrystallites: Probing the luminescing state. Journal of Chemical Physics 1997, 106, (23), 9869-9882.; Murray, C. B.; Norris, D. J.; Bawendi, M. G., Synthesis and Characterization of Nearly Monodisperse Cde (E=S, Se, Te) Semiconductor Nanocrystallites. Journal of the American Chemical Society 1993, 115, (19), 8706-8715.; Peng, Z. A.; Peng, X. G., Formation of high-quality CdTe, CdSe, and CdS nanocrystals using CdO as precursor. Journal of the American Chemical Society 2001, 123, (1), 183-184.; Yin, Y.; Alivisatos, A. P., Colloidal nanocrystal synthesis and the organic-inorganic interface. Nature 2005, 437, (7059), 664-670.; Peng, X. G.; Manna, L.; Yang, W. D.; Wickham, J.; Scher, E.; Kadavanich, A.; Alivisatos, A. P., Shape control of CdSe nanocrystals. Nature 2000, 404, (6773), 59-61.; Rosenthal, S. J.; McBride, J.; Pennycook, S. J.; Feldman, L. C., Synthesis, surface studies, composition and structural characterization of CdSe, core/shell and biologically active nanocrystals. Surface Science Reports 2007, 62, 111-157.] In particular, colloidal nanocrystals have been investigated for use as light harvesters in photovoltaic devices, [Greenham, N.C.; Shinar, J.; Partee, J.; Lane, P. A.; Amir, O.; Lu, F.; Friend, R. H., Optically detected magnetic resonance study of efficient two-layer conjugated polymer light-emitting diodes. Physical Review B 1996, 53, (20), 13528-13533.; Erwin, M. M.; Kadavanich, A. V.; McBride, J.; Kippeny, T.; Pennycook, S.; Rosenthal, S. J., Material characterization of a nanocrystal based photovoltaic device. European Physical Journal D 2001, 16, (1-3), 275-277.; Smith, N. J.; Emmett, K. J.; Rosenthal, S. J., Photovoltaic cells fabricated by electrophoretic deposition of CdSe nanocrystals. Applied Physics Letters 2008, 93, (4).; Nozik, A. J., Multiple exciton generation in semiconductor quantum dots. Chemical Physics Letters 2008, 457, (1-3), 3-11.; Klimov, V. I., Spectral and dynamical properties of multilexcitons in semiconductor nanocrystals Annual Review of Physical Chemistry 2007, 58, 635-673.; Schaller, R. D.; Klimov, V. I., High efficiency carrier multiplication in PbSe nanocrystals: Implications for solar energy conversion. Physical Review Letters 2004, 92, (18).; Ellingson, R. J.; Beard, M. C.; Johnson, J. C.; Yu, P. R.; Micic, O.I.; Nozik, A. J.; Shabaev, A.; Efros, A. L., Highly efficient multiple exciton generation in colloidal PbSe and PbS quantum dots. Nano Letters 2005, 5, (5), 865-871.] as biological labels, [Bruchez, M.; Moronne, M.; Gin, P.; Weiss, S.; Alivisatos, A. P., Semiconductor nanocrystals as fluorescent biological labels. Science 1998, 281, (5385), 2013-2016.; Rosenthal, S. J.; et al., Targeting cell surface receptors with ligand-conjugated nanocrystals. Journal of the American Chemical Society 2002, 124, (17), 4586-4594.; Warnement, M. R.; Tomlinson, I. D.; Rosenthal, S. J., Fluorescent imaging applications of Quantum Dot probes. Current Nanoscience 2007, 3, (4), 273-284.; Chan, W. C. W.; Nie, S. M., Quantum dot bioconjugates for ultrasensitive nonisotopic detection. Science 1998, 281, (5385), 2016-2018.; Jaiswal, J. K.; Mattoussi, H.; Mauro, J. M.; Simon, S. M., Long-term multiple color imaging of live cells using quantum dot bioconjugates. Nature Biotechnology 2003, 21, (1), 47-51.; Kim, S.; et al. Near-infrared fluorescent type II quantum dots for sentinel lymph node mapping. Nature Biotechnology 2004, 22, (1), 93-97.] and as the emissive material in light-emitting diodes (LED). [Colvin, V. L.; Schlamp, M. C.; Alivisatos, A. P., Light-Emitting-Diodes Made from Cadmium Selenide Nanocrystals and a Semiconducting Polymer. Nature 1994, 370, (6488), 354-357.; Achermann, M.; Petruska, M. A.; Kos, S.; Smith, D. L.; Koleske, D. D.; Klimov, V. I., Energy-transfer pumping of semiconductor nanocrystals using an epitaxial quantum well. Nature 2004, 429, (6992), 642-646.; Firth, A. V.; Cole-Hamilton, D. J.; Allen, J. W., Optical properties of CdSe nanocrystals in a polymer matrix. Applied Physics Letters 1999, 75, (20), 3120-3122.; Schreuder, M. A.; Gosnell, J. D.; Smith, N. J.; Warnement, M. R.; Weiss, S. M.; Rosenthal, S. J., Encapsulated white-light CdSe nanocrystals as nanophosphors for solid-state lighting. Journal of Materials Chemistry 2008, 18, (9), 970-975.; Anikeeva, P. O.; Madigan, C. F.; Halpert, J. E.; Bawendi, M. G.; Bulovic, V., Electronic and excitonic processes in light-emitting devices based on organic materials and colloidal quantum dots. Physical Review B 2008, 78, (8).; Coe, S.; Woo, W. K.; Bawendi, M.; Bulovic, V., Electroluminescence from single monolayers of nanocrystals in molecular organic devices. Nature 2002, 420, (6917), 800-803.]

Initial investigations of nanocrystals focused on the crystal structure and size as the sole source of the unique optoelectronic properties observed. However, it has been determined that the surface ligands on the nanocrystal are not only useful for their tethering and solubility properties, but are also a factor in the photoluminescent (PL) properties. [Kuno, M.; Lee, J. K.; Dabbousi, B. O.; Mikulec, F. V.; Bawendi, M. G., The band edge luminescence of surface modified CdSe nanocrystallites: Probing the luminescing state. Journal of Chemical Physics 1997, 106, (23), 9869-9882.; Murray, C. B.; Norris, D. J.; Bawendi, M. G., Synthesis and Characterization of Nearly Monodisperse Cde (E=S, Se, Te) Semiconductor Nanocrystallites. Journal of the American Chemical Society 1993, 115, (19), 8706-8715.; Yin, Y.; Alivisatos, A. P., Colloidal nanocrystal synthesis and the organic-inorganic interface. Nature 2005, 437, (7059), 664-670.; Pradhan, N.; Reifsnyder, D.; Xie, R. G.; Aldana, J.; Peng, X. G., Surface ligand dynamics in growth of nanocrystals. Journal of the American Chemical Society 2007, 129, (30), 9500-9509.; Bullen, C.; Mulvaney, P., The effects of chemisorption on the luminescence of CdSe quantum dots. Langmuir 2006, 22, (7), 3007-3013.; Landes, C.; Braun, M.; Burda, C.; El-Sayed, M. A., Observation of large changes in the band gap absorption energy of small CdSe nanoparticles induced by the adsorption of a strong hole acceptor. Nano Letters 2001, 1, (11), 667-670.; Munro, A. M.; Ginger, D. S., Photoluminescence quenching of single CdSe nanocrystals by ligand adsorption. Nano Letters 2008, 8, (8), 2585-2590.; Munro, A. M.; Plante, I. J. L.; Ng, M. S.; Ginger, D. S., Quantitative study of the effects of surface ligand concentration on CdSe nanocrystal photoluminescence. Journal of Physical Chemistry C 2007, 111, (17), 6220-6227.; Liu, I. S. et al., Enhancing photoluminescence quenching and photoelectric properties of CdSe quantum dots with hole accepting ligands. Journal of Materials Chemistry 2008, 18, (6), 675-682.; Munro, A. M.; Bardecker, J. A.; Liu, M. S.; Cheng, Y. J.; Niu, Y. H.; Plante, I. J. L.; Jen, A. K. Y.; Ginger, D. S., Colloidal CdSe quantum dot electroluminescence: ligands and light-emitting diodes. Microchimica Acta 2008, 160, (3), 345-350.; Ji, X. H.; Copenhaver, D.; Sichmeller, C.; Peng, X. G., Ligand bonding and dynamics on colloidal nanocrystals at room temperature: The case of alkylamines on CdSe nanocrystals. Journal of the American Chemical Society 2008, 130, (17), 5726-5735.; Kim, S. M.; Kyhm, K.; Yang, H. S.; Hong, K. S., Optical properties and surface conditions of CdSe quantum dots. Journal of the Korean Physical Society 2006, 49, S688-S691.; Smith, A. M.; Duan, H. W.; Rhyner, M. N.; Ruan, G.; Nie, S. M., A systematic examination of surface coatings on the optical and chemical properties of semiconductor quantum dots. Physical Chemistry Chemical Physics 2006, 8, (33), 3895-3903.; Ozel, T. et al., Selective enhancement of surface-state emission and simultaneous quenching of interband transition in white-luminophor CdS nanocrystals using localized plasmon coupling. New Journal of Physics 2008, 10, (8), 083035.; Chen, X. B.; Samia, A. C. S.; Lou, Y. B.; Burda, C., Investigation of the crystallization process in 2 nm CdSe quantum dots. Journal of the American Chemical Society 2005, 127, 4372-4375.; Wang, W.; Banerjee, S.; Jia, S. G.; Steigerwald, M. L.; Herman, I. P., Ligand control of growth, morphology, and capping structure of colloidal CdSe nanorods. Chemistry of Materials 2007, 19, (10), 2573-2580.; Washington, A. L.; Strouse, G. F., Microwave synthesis of CdSe and CdTe nanocrystals in nonabsorbing alkanes. Journal of the American Chemical Society 2008, 130, (28), 8916-8922.; Park, J.; Joo, J.; Kwon, S. G.; Jang, Y.; Hyeon, T., Synthesis of monodisperse spherical nanocrystals. Angewandte Chemie-International Edition 2007, 46, 4630-4660.

Initially, conventional methodology used dimethylcadmium as the cadmium precursor in CdSe nanocrystal synthesis. [Murray, C. B.; Norris, D. J.; Bawendi, M. G., Synthesis and Characterization of Nearly Monodisperse Cde (E=S, Se, Te) Semiconductor Nanocrystallites. Journal of the American Chemical Society 1993, 115, (19), 8706-8715.] However, due to the cost and hazards associated with the use of dimethylcadmium, other precursors have been developed. [Peng, Z. A.; Peng, X. G., Formation of high-quality CdTe, CdSe, and CdS nanocrystals using CdO as precursor. Journal of the American Chemical Society 2001, 123, (1), 183-184.; Rosenthal, S. J.; McBride, J.; Pennycook, S. J.; Feldman, L. C., Synthesis, surface studies, composition and structural characterization of CdSe, core/shell and biologically active nanocrystals. Surface Science Reports 2007, 62, 111-157.; Hambrock, J.; Birkner, A.; Fischer, R. A., Synthesis of CdSe nanoparticles using various organometallic cadmium precursors. Journal of Materials Chemistry 2001, 11, (12), 3197-3201.; Qu, L. H.; Peng, Z. A.; Peng, X. G., Alternative routes toward high quality CdSe nanocrystals. Nano Letters 2001, 1, (6), 333-337.] Specifically, CdO combined with a phosphonic acid to form a Cd-phosphonate precursor complex was suggested as a more cost effective and green alternative. [Peng, Z. A.; Peng, X. G., Formation of high-quality CdTe, CdSe, and CdS nanocrystals using CdO as precursor. Journal of the American Chemical Society 2001, 123, (1), 183-184.] As a result of this synthetic innovation, the effects of the phosphonic acid as a component of the Cd precursor and as a surface ligand have been explored. [Nair, P. S.; Fritz, K. P.; Scholes, G. D., A multiple injection method for exerting kinetic control in the synthesis of CdSe nanorods. Chemical Communications 2004, 2084-2085.; Liu, H. T.; Owen, J. S.; Alivisatos, A. P., Mechanistic study of precursor evolution in colloidal group II-VI semiconductor nanocrystal synthesis. Journal of the American Chemical Society 2007, 129, (2), 305-312.; Kanaras, A. G.; Sonnichsen, C.; Liu, H. T.; Alivisatos, A. P., Controlled synthesis of hyperbranched inorganic nanocrystals with rich three-dimensional structures. Nano Letters 2005, 5, (11), 2164-2167.] Phosphonic acid ligands were shown to affect the growth kinetics and shape of the nanocrystals. [Wang, W.; Banerjee, S.; Jia, S. G.; Steigerwald, M. L.; Herman, I. P., Ligand control of growth, morphology, and capping structure of colloidal CdSe nanorods. Chemistry of Materials 2007, 19, (10), 2573-2580.; Yong, K. T.; Sahoo, Y.; Swihart, M. T.; Prasad, P. N., Growth of CdSe quantum rods and multipods seeded by noble-metal nanoparticles. Advanced Materials 2006, 18, (15), 1978-+.; Nair, P. S.; Fritz, K. P.; Scholes, G. D., Evolutionary shape control during colloidal quantum-dot growth. Small 2007, 3, (3), 481-487.]

Ab-initio and first principles calculations have since determined that phosphonic acid is the most strongly bound ligand on nanocrystals, leading to the surface coating being composed almost exclusively of them. [Manna, L. et al., First-principles modeling of unpassivated and surfactant-passivated bulk facets of wurtzite CdSe: A model system for studying the anisotropic growth of CdSe nanocrystals. Journal of Physical Chemistry B 2005, 109, (13), 6183-6192.; Peng, Z. A.; Peng, X. G., Nearly monodisperse and shape-controlled CdSe nanocrystals via alternative routes: Nucleation and growth. Journal of the American Chemical Society 2002, 124, (13), 3343-3353.; Puzder, A.; Williamson, A. J.; Zaitseva, N.; Galli, G.; Manna, L.; Alivisatos, A. P., The effect of organic ligand binding on the growth of CdSe nanoparticles probed by Ab initio calculations. Nano Letters 2004, 4, (12), 2361-2365.; Kopping, J. T.; Patten, T. E., Journal of the American Chemical Society 2008, 130, (17), 5689-5698.]

Figure 12:
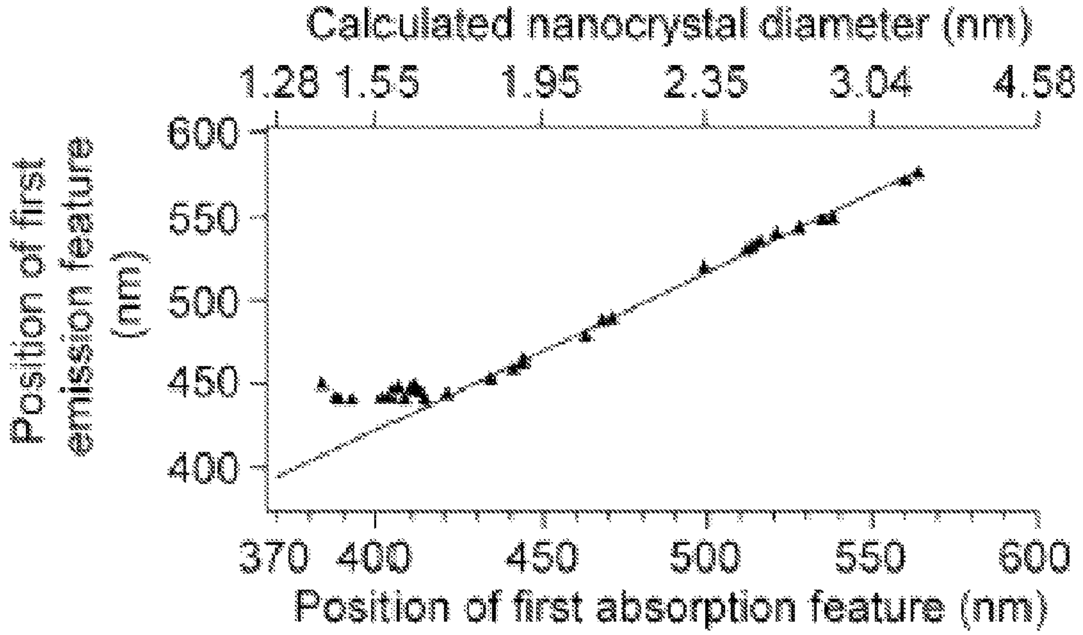
FIG. 12 shows the first emission peak of ultrasmall CdSe nanocrystals plotted vs. the band-edge absorption peak. Note that below 1.7 nm the emission ceases to blue-shift, though the absorption feature does blue-shift.

Without wishing to be bound by theory, for CdSe nanocrystals, the conventional paradigm has been that as the nanocrystal diameter decreased, the band-edge absorption and band-edge emission shifted to higher energies, due to quantum confinement. [Rossetti, R.; Ellison, J. L.; Gibson, J. M.; Brus, L. E., Size Effects in the Excited Electronic States of Small Colloidal Cds Crystallites. Journal of Chemical Physics 1984, 80, (9), 4464-4469.] In contrast, for white-light emitting CdSe nanocrystals, as shown in FIG. 12 (ultrasmall sizes, <1.7 nm), the emission is no longer dominated by the band-edge emission. [Bowers, M. J.; McBride, J. R.; Rosenthal, S. J., White-light emission from ultrasmall cadmium selenide nanocrystals. Journal of the American Chemical Society 2005, 127, (44), 15378-15379.] It has been shown that although the absorption continues to blue-shift, indicating smaller diameters, the bluest emission feature appears to be pinned at a specific energy/wavelength (FIG. 12). [Dukes, A. D.; Schreuder, M. A.; Sammons, J. A.; McBride, J. R.; Smith, N. J.; Rosenthal, S. J., Pinned emission from ultrasmall cadmium selenide nanocrystals. Journal of Chemical Physics 2008, 129, (12).] This pinned emission is believed to be due to trap states on the surface of the nanocrystal, influenced by the surface ligands. [Bowers, M. J.; McBride, J. R.; Rosenthal, S. J., White-light emission from ultrasmall cadmium selenide nanocrystals. Journal of the American Chemical Society 2005, 127, (44), 15378-15379.; Dukes, A. D.; Schreuder, M. A.; Sammons, J. A.; McBride, J. R.; Smith, N. J.; Rosenthal, S. J., Pinned emission from ultrasmall cadmium selenide nanocrystals. Journal of Chemical Physics 2008, 129, (12).]

Previous reports have differed over whether the emission of these ultrasmall nanocrystals can be altered through ligand modification. [Nag, A.; Sarma, D. D., White light from $Mn^{2+}$-doped Cds nanocrystals: A new approach. Journal of Physical Chemistry C 2007, 111, 13641-13644.; Singh, S. et al., Structure, microstructure and physical properties of ZnO based materials in various forms: bulk, thin film and nano. Journal of Physics D-Applied Physics 2007, 40, 6312-6327.] These discussions have generally centered on a difference of opinion as to the source of this broad emission. Defect emission coming from either interstitial atoms or vacancies in the core of the nanocrystals would not be altered by varying the surface ligands. CdSe nanocrystals with these types of defects would typically be more amorphous than crystalline due to the small number of inner atoms. Chen et al. have previously studied the absorption and emission of nanocrystals of amorphous character. [Chen, X. B.; Samia, A. C. S.; Lou, Y. B.; Burda, C., Investigation of the crystallization process in 2 nm CdSe quantum dots. Journal of the American Chemical Society 2005, 127, 4372-4375.] This work showed that amorphous nanocrystal defect emission should be accompanied by absorption of mid-gap states, as well as a blue-shift in the absorption peak maxima due to crystallization over time. [Chen, X. B.; Samia, A. C. S.; Lou, Y. B.; Burda, C., Investigation of the crystallization process in 2 nm CdSe quantum dots. Journal of the American Chemical Society 2005, 127, 4372-4375.] However, it has been shown that with the disclosed methods, these ultrasmall nanocrystal's absorption maxima red-shifts due to growth of the crystal and not preliminary crystallization. [Dukes, A. D.; Schreuder, M. A.; Sammons, J. A.; McBride, J. R.; Smith, N. J.; Rosenthal, S. J., Pinned emission from ultrasmall cadmium selenide nanocrystals. Journal of Chemical Physics 2008, 129, (12).] This work, along with the large Stokes shift seen in this ultrasmall size regime, has led to the discovery that the broad-emission comes from surface states, indicating that this emission could be tuned by changing the ligand environment around those states.

Figure 13:
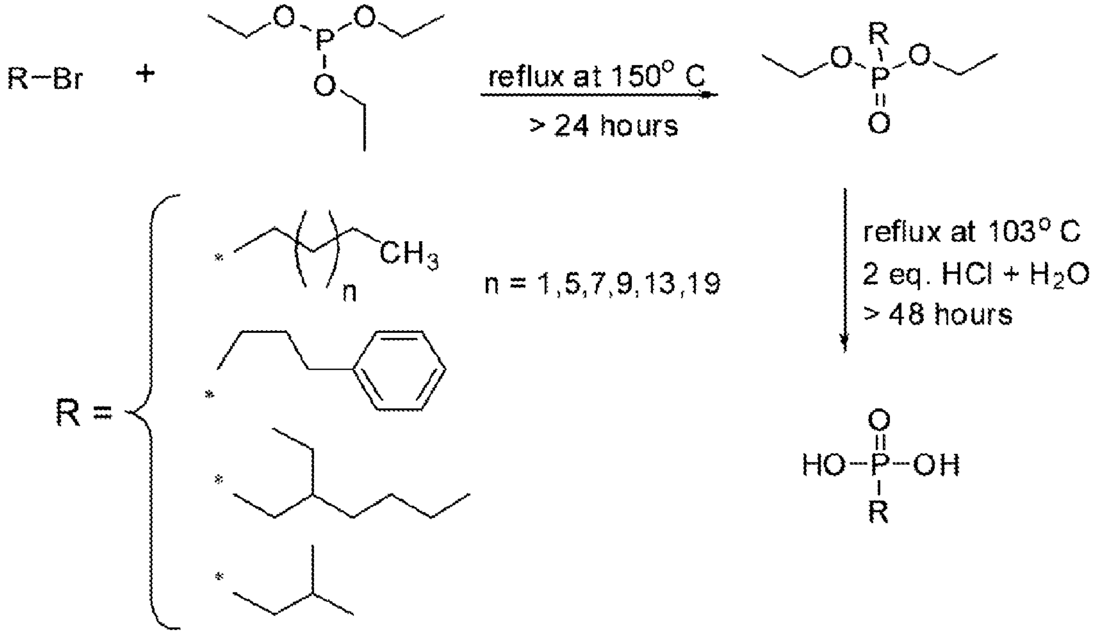
FIG. 13 shows the Michaelis-Arbuzov reaction used to synthesize various phosphonic acids and the structures of said phosphonic acids. Phenyl and hexyl phosphonic acid are not included, as they were purchased.

In the disclosed methods, the effects that eleven different phosphonic acid ligands (FIG. 13) have on the photoluminescence properties of white-light emitting nanocrystals are evaluated. Changing the phosphonic acid ligand on the surface of these ultrasmall nanocrystals allows tuning of the highest energy peak in the emission and affects the quantum yield. In addition to the fundamental interest in controlling trap-state emission, tuning this emission will allow for color control over white solid-state light sources that employ nanocrystals as the emissive source.

F. Frequency Converters

In one aspect, the invention relates to a frequency converter. That is, at least one quantum dot of the invention, nanoparticle of any of the invention, plurality of nanoparticles of the invention, or product of the methods of the invention, or mixture thereof, can be dispersed within a matrix, for example a polymeric or glass matrix, and placed within the emission path of an energy source providing light above the band gap energy of the nanoparticle of the invention. Thus, the nanoparticles of the invention can act as frequency down-converters when excited by light above the band gap energy (see FIG. 1). Accordingly, the nanoparticles can emit white-light when encapsulated in a polymer matrix and excited by, for example, an ultraviolet (UV) emitting light-emitting diode (LED) (see FIG. 3). Different polymers (e.g., polyurathane, polycarbonate, polymethylmethacralate, polyesters) as well as varied nanocrystal loading, can be employed to optimize the performance of a frequency converter device and, therefore, obtain peak efficiencies. In one aspect, a commercially available polyurethane, such as that found in MINWAX®, can be used to provide the polymeric matrix.

In one aspect, a frequency converter can be constructed by encapsulating at least one nanoparticle of the invention within a polymer matrix (e.g., polyurethane) and positioning the resulting composition within the emission path of an energy source providing light above the band gap energy of the nanoparticle of the invention.

In one aspect, the polymer matrix can comprise any polymer known to those of skill in the art. For example, the polymer matrix can comprise at least one of a polyurethane, a polyacrylate, a polymethacrylate, a polycarbonate, a polyester, a polyamide, a polyimide, a polyether, a polyolefin, a polystyrene, a polythiophene, a polysiloxane, or a polyfluoroethylene, or a mixture thereof, or a copolymer thereof. In one aspect, the polymer is substantially transparent to visible light. In a further aspect, the polymer is substantially transparent to ultraviolet light. In one aspect, the polymer matrix comprises a photocurable polymer. In a further aspect, a condensation polymer is substantially absent from the polymer matrix. It is also understood that the polymer can include additives to modify the physical or chemical properties of the polymer. In one aspect, the polymer matrix can be formed by any method known to those of skill in the art, for example, by solution casting or by injection molding. Further, the polymer matrix can be provided in any desired shape, for example, the polymer matrix can be provided as a film or a lens. Alternatively, the polymer matrix can be formed by performing a polymerization reaction in the presence of at least one nanoparticle of the invention.

In one aspect, the matrix can comprise any glass known to those of skill in the art. For example, the glass matrix can comprise borosilicate glass. In a further aspect, the glass matrix can further comprise at least one additive known to those of skill in the art to modify the physical or optical properties of the glass matrix. In a further aspect, an additive can be selected and included in the glass of the glass matrix such that the additive improves the strength of the glass matrix or such that the additive absorbs particular wavelengths of light emitted by the energy source or the nanoparticles of the invention. For example, the matrix—polymeric or glass—can be supplemented with an additive that is opaque with respect to ultraviolet energy, yet transparent to visible light.

In a further aspect, the frequency converter of the invention can further comprise at least one phosphor, additional quantum dot or mixture thereof. In such aspects, the at least one phosphor, additional quantum dot, or mixture thereof can be selected such that the at least one phosphor, additional quantum dot, or mixture thereof can absorb energy from the energy source providing light above the band gap energy of the nanoparticle of the invention or from the emission of the nanoparticle of the invention and can emit energy of the same or of a different frequency as the nanoparticle of the invention, thereby modifying the emission of the frequency converter. For example, the phosphor can comprise at least one white phosphor or yellow phosphor or a mixture thereof. In such an aspect, the phosphor can absorb energy from the energy source (e.g., UV light) and emit visible light of a frequency intrinsic to the at least one white phosphor or yellow phosphor or a mixture thereof.

In a further aspect, the additional quantum dot can be a quantum dot of other than the nanoparticle of the invention. In such an aspect, the additional quantum dot can absorb energy from the energy source providing light above the band gap energy of the nanoparticle of the invention or from the emission of the nanoparticle of the invention and can emit energy of the same or of a different frequency as the nanoparticle of the invention, thereby modifying the emission of the frequency converter.

In a further aspect, the additional quantum dot can function as an energy cascade system of the invention, as disclosed herein, and is capable of absorbing energy of a wavelength outside the first electromagnetic region and capable of emitting energy in the first electromagnetic region. That is, in such an aspect, the additional quantum dot can absorb energy emitted by the energy source providing light above the band gap energy of the nanoparticle of the invention and can emit energy within the absorption region of the nanoparticle of the invention, thereby increasing the amount of energy for absorption by the nanoparticle of the invention and, therefore, increasing the energy emitted by the frequency converter. For example, the additional quantum dot can be capable of absorbing energy of a wavelength of from about 100 nm to about 290 nm and capable of emitting energy of a wavelength of from about 290 nm to about 400 nm. As another example, the additional quantum dot can be capable of absorbing energy of a wavelength of from about 100 nm to about 320 nm and capable of emitting energy of a wavelength of from about 320 nm to about 400 nm. In one aspect, the additional quantum dot comprises at least one of cadmium sulfide, cadmium selenide, cadmium telluride, zinc selenide, zinc sulfide, or zinc telluride or a mixture thereof. For example, the quantum dot can comprise a single material (e.g., cadmium sulfide), a core/shell or two or more materials (e.g., cadmium sulfide/zinc sulfide), or an alloy of two or more materials.

G. Light Emitting Diode Devices

In one aspect, a light emitting diode device can be provided by using the frequency converter of the invention with an energy source, for example a light emitting diode, capable of providing energy above the band gap energy of the nanoparticle of the invention. That is, the frequency converter can be positioned within the emission path of such, thereby providing a light emitting diode device.

Therefore, in one aspect, the invention relates to a light emitting diode device comprising a light emitting diode (LED) capable of emitting energy of a first wavelength, and the frequency converter of the invention positioned within an emission path of the light emitting diode, wherein the frequency converter is capable of absorbing energy of the first wavelength. In a further aspect, the first wavelength comprises energy within the first electromagnetic region of the nanoparticle of the invention employed in the frequency converter of the invention. For example, the first wavelength can comprise light having a wavelength of from about 200 nm to about 500 nm, of from about 300 nm to about 450 nm, of from about 100 nm to about 290 nm, of from about 290 nm to about 400 nm, of from about 100 nm to about 320 nm, or of from about 320 nm to about 400 nm.

In a further aspect, the light emitting diode device of the invention can further comprise at least one phosphor, additional quantum dot or mixture thereof. In such aspects, the at least one phosphor, additional quantum dot, or mixture thereof can be selected such that the at least one phosphor, additional quantum dot, or mixture thereof can absorb energy from the energy source providing light above the band gap energy of the nanoparticle of the invention or from the emission of the nanoparticle of the invention and can emit energy of the same or of a different frequency as the nanoparticle of the invention, thereby modifying the emission of the light emitting diode device. For example, the phosphor can comprise at least one white phosphor or yellow phosphor or a mixture thereof. In such an aspect, the phosphor can absorb energy from the energy source (e.g., UV light) and emit visible light of a frequency intrinsic to the at least one white phosphor or yellow phosphor or a mixture thereof.

In a further aspect, the additional quantum dot can be a quantum dot of other than the nanoparticle of the invention. In such an aspect, the additional quantum dot can absorb energy from the energy source providing light above the band gap energy of the nanoparticle of the invention or from the emission of the nanoparticle of the invention and can emit energy of the same or of a different frequency as the nanoparticle of the invention, thereby modifying the emission of the light emitting diode device.

In a further aspect, the additional quantum dot can function as an energy cascade system of the invention, as disclosed herein, and is capable of absorbing energy of a wavelength outside the first electromagnetic region and capable of emitting energy in the first electromagnetic region. That is, in such an aspect, the additional quantum dot can absorb energy emitted by the energy source providing light above the band gap energy of the nanoparticle of the invention and can emit energy within the absorption region of the nanoparticle of the invention, thereby increasing the amount of energy for absorption by the nanoparticle of the invention and, therefore, increasing the energy emitted by the light emitting diode device. For example, the additional quantum dot can be capable of absorbing energy of a wavelength of from about 100 nm to about 290 nm and capable of emitting energy of a wavelength of from about 290 nm to about 400 nm. As another example, the additional quantum dot can be capable of absorbing energy of a wavelength of from about 100 nm to about 320 nm and capable of emitting energy of a wavelength of from about 320 nm to about 400 nm. In one aspect, the additional quantum dot comprises at least one of cadmium sulfide, cadmium selenide, cadmium telluride, zinc selenide, zinc sulfide, or zinc telluride or a mixture thereof. For example, the quantum dot can comprise a single material (e.g., cadmium sulfide), a core/shell or two or more materials (e.g., cadmium sulfide/zinc sulfide), or an alloy of two or more materials.

In one aspect, the light emitting diode device can be provided by a method comprising the step of positioning the frequency converter of the invention within an emission path of a light emitting diode (LED) capable of emitting energy of a first wavelength, wherein the frequency converter is capable of absorbing energy of the first wavelength. In a further aspect, the positioning step can comprises the steps of dissolving at least one polymer and dispersing at least one quantum dot of the invention, nanoparticle of any the invention, plurality of nanoparticles of the invention, or product of the invention, or mixture thereof into a solvent, thereby producing a solution-dispersion; applying the solution-dispersion within the emission path of the light emitting diode; and removing the solvent. That is, in one aspect, a light emitting diode device of the invention can be provided by solution-casting a solution-dispersion of the nanoparticle of the invention and a polymer onto at least a portion of the surface of and within the emission path of a light emitting diode (LED).

In a further aspect, the positioning step can comprise the steps of dissolving at least one polymer and dispersing at least one quantum dot of the invention, nanoparticle of the invention, plurality of nanoparticles of any of the invention, or product of the methods of the invention, or mixture thereof into a solvent, wherein the polymer is a photocurable polymer at the first wavelength, thereby producing a photocurable solution-dispersion; contacting the emission path of the light emitting diode with the photocurable solution-dispersion; and energizing the light emitting diode, thereby photocuring at least a portion of the photocurable solution-dispersion. That is, in one aspect, a light emitting diode device of the invention can be provided by photocuring (also referred to as photocrosslinking) a solution-dispersion of the nanoparticle of the invention and a polymer onto at least a portion of the surface of and within the emission path of a light emitting diode (LED). Photocurable polymers are well-known to those of skill in the art, and it is understood that any photocurable polymer can be used in connection with the light emitting diode device of the invention. For example, the photocurable polymer can comprise polybutadiene or a copolymer of polybutadiene. In one aspect, the resulting photocured polymer is substantially transparent to visible light. In a further aspect, the resulting photocured polymer is substantially transparent to ultraviolet light.

In a further aspect, the positioning step can comprise the steps of dissolving at least one monomer and at least one photoactive initiator and dispersing at least one quantum dot of the invention, nanoparticle of the invention, plurality of nanoparticles of the invention, or product of the methods of the invention, or mixture thereof into a solvent, wherein the photoactive initiator is active at the first wavelength and the photoactive initiator can initiate polymerization of the monomer, thereby producing a photopolymerizable solution-dispersion; contacting the emission path of the light emitting diode with the photopolymerizable solution-dispersion; and energizing the light emitting diode, thereby photopolymerizing at least a portion of the monomer dissolved in the photopolymerizable solution-dispersion. That is, in one aspect, a light emitting diode device of the invention can be provided by photopolymerizing a solution-dispersion of the nanoparticle of the invention and a polymer onto at least a portion of the surface of and within the emission path of a light emitting diode (LED). Photoactive initiators and photopolymerizable polymers are well-known to those of skill in the art, and it is understood that any photoactive initiator and/or photopolymerizable polymer can be used in connection with the light emitting diode device of the invention. For example, the photopolymerizable polymer can comprise polymethyl methacrylate initiated by 2,2-dimethoxy-2-phenylacetophenone and 1-hydroxycyclohexylphenyl ketone. In one aspect, the resulting photopolymerizable polymer is substantially transparent to visible light. In a further aspect, the resulting photopolymerizable polymer is substantially transparent to ultraviolet light.

H. Modified Fluorescent Light Sources

In one aspect, the invention relates to a modified fluorescent light source. That is, a modified fluorescent light source can be provided by substituting the nanoparticle of the invention for the phosphor employed within a conventional fluorescent light source. In such an aspect, a modified fluorescent light source can comprise a substantially optically transparent and substantially hermetically sealed tube having a first end, a second end, an interior surface, an exterior surface, and a lumen extending therethrough; a first electrode positioned at the first end; a second electrode positioned at the second end; inert gas vapor and mercury vapor within the lumen of the tube; a phosphor substitute comprising at least one frequency converter of the invention, quantum dot of the invention, nanoparticle of the invention, plurality of nanoparticles of any of the invention, or product of the methods of the invention, or mixture thereof substantially coating the interior surface or the exterior surface of the tube.

In one aspect, the modified fluorescent light source operates in a manner similar to the operation of a conventional fluorescent light source. For example, by establishing a current between the first electrode positioned at the first end and the second electrode positioned at the second end, a plasma is established from the inert gas vapor and mercury vapor within the lumen of the substantially optically transparent and substantially hermetically sealed tube. In one aspect, the inert gas can comprise any inert gas capable of establishing a plasma under electrical current sustainable under conventional electrical loads; for example, the inert gas can comprise argon gas. As well-known to those of skill in the art, a plasma comprising mercury emits ultraviolet light at a wavelength of 254 nm. In a conventional fluorescent light source, the emitted ultraviolet light excites the phosphor coating at the interior surface of the tube, and the phosphor absorbs the ultraviolet light and then emits visible light at discrete wavelengths (see FIG. 4). It is also understood that other ultraviolet sources—for example, Xenon or one or more halogens—can be used in connection with the invention.

In contrast, in one aspect, in the modified fluorescent light source of the invention, the phosphor is replaced or supplemented by the nanoparticle of the invention. That is, the phosphor substitute can be present at the surface of the tube in combination with the phosphor or the phosphor substitute can replace the phosphor. In one aspect, the phosphor is absent from the modified fluorescent light source. In one aspect, the emitted ultraviolet light excites the nanoparticle of the invention coating at the surface(s) of the tube, and the nanoparticle absorbs the ultraviolet light and then emits broad emission visible light (see FIG. 4). In a further aspect, in the modified fluorescent light source of the invention, the optically transparent and substantially hermetically sealed tube can comprise an ultraviolet light opaque material and the phosphor substitute can substantially coat the interior surface of the tube. In a further aspect, the optically transparent and substantially hermetically sealed tube can comprise an ultraviolet light transparent material and the phosphor substitute can substantially coat the exterior surface of the tube.

In a further aspect, the modified fluorescent light source of the invention can further comprise at least one phosphor, additional quantum dot or mixture thereof. In such aspects, the at least one phosphor, additional quantum dot, or mixture thereof can be selected such that the at least one phosphor, additional quantum dot, or mixture thereof can absorb energy from the mercury emission or from the emission of the nanoparticle of the invention and can emit energy of the same or of a different frequency as the nanoparticle of the invention, thereby modifying the emission of the modified fluorescent light source. For example, the phosphor can comprise at least one white phosphor or yellow phosphor or a mixture thereof. In such an aspect, the phosphor can absorb energy from the mercury emission (e.g., UV light) and emit visible light of a frequency intrinsic to the at least one white phosphor or yellow phosphor or a mixture thereof.

In a further aspect, the additional quantum dot can be a quantum dot of other than the nanoparticle of the invention. In such an aspect, the additional quantum dot can absorb energy from the mercury emission or from the emission of the nanoparticle of the invention and can emit energy of the same or of a different frequency as the nanoparticle of the invention, thereby modifying the emission of the modified fluorescent light source.

In a further aspect, the additional quantum dot can function as an energy cascade system of the invention, as disclosed herein, and is capable of absorbing energy of a wavelength outside the first electromagnetic region and capable of emitting energy in the first electromagnetic region. That is, in such an aspect, the additional quantum dot can absorb energy emitted by the mercury emission and can emit energy within the absorption region of the nanoparticle of the invention, thereby increasing the amount of energy for absorption by the nanoparticle of the invention and, therefore, increasing the energy emitted by the modified fluorescent light source. For example, the additional quantum dot can be capable of absorbing energy of a wavelength of from about 100 nm to about 290 nm and capable of emitting energy of a wavelength of from about 290 nm to about 400 nm. As another example, the additional quantum dot can be capable of absorbing energy of a wavelength of from about 100 nm to about 320 nm and capable of emitting energy of a wavelength of from about 320 nm to about 400 nm. In one aspect, the additional quantum dot comprises at least one of cadmium sulfide, cadmium selenide, cadmium telluride, zinc selenide, zinc sulfide, or zinc telluride or a mixture thereof. For example, the quantum dot can comprise a single material (e.g., cadmium sulfide), a core/shell or two or more materials (e.g., cadmium sulfide/zinc sulfide), or an alloy of two or more materials.

I. Electroluminescent Devices Based on Broad-Emission Nanocrystals

The unique optical properties of the nanoparticles of the invention make them ideal materials for incorporation into solid state lighting applications in the form of light emitting diodes (LEDs). LEDs can be made by incorporating an intrinsic emitting layer into a p-n junction device. When under forward bias, electrons and holes are injected into the intrinsic layer, where they recombine to emit light. Lumileds™: *Light From Silicon Valley*, Craford, M. G. (2004). The wavelength of the emitted photon is determined by the intrinsic layer or phosphor. Typically, phosphors are limited to monochromatic emission, requiring a mixture of phosphors or a complex doping scheme to achieve white-light. Yang, W.-J.; Luo, L.; Chen, T.-M.; Wang, N.-S. *Chem. Mater.* 2005, 17, 3883-3888.

An ideal material for a white-light emitting intrinsic layer would be robust, emit over the entire visible spectrum, have high quantum efficiency, not suffer from self absorption, be easy to produce on a large scale, and not waste energy producing wavelengths beyond the visible spectrum (e.g., tungsten). Taking these criteria into consideration, semiconductor nanocrystals, in particular the nanoparticles of the invention, are attractive candidate materials for applications in solid state lighting. Unlike commercial phosphors, emission color can be tuned by simply controlling the nanocrystal size. Further, white-light emission can be provided by employing the nanoparticles of the invention.

Nanocrystal-based LEDs have been demonstrated showing colored-light emission. One example developed by Klimov et al. utilizes core/shell nanocrystals deposited onto an InGaN quantum well. The quantum well is pumped by laser emission, generating electrons and holes which, through energy transfer, cause the nanocrystals to emit light at their fundamental band edge energy. Achermann, M.; Petruska, M. A.; Kos, S.; Smith, D. L.; Koleske, D. D.; Klimov, V. I. *Nature* 2004, 429, 642-646. While intuitive, simply mixing several colors of nanocrystals together to achieve white light results in an overall reduction of device efficiency through self-absorption between the various sizes of nanocrystals. This can be especially detrimental for device designs requiring a thickness of more than several monolayers. Mueller, A. H.; Petruska, M. A.; Achermann, M.; Werder, D. J.; Akhadov, E. A.; Koleske, D. D.; Hoffbauer, M. A.; Klimov, V. I. *Nano Lett.* 2005, 5, 1039-1044. The large Stokes shift and narrow size distribution of these ultrasmall nanocrystals, along with the broad emission spectrum, would alleviate any efficiency loss attributed to self-absorption from mixing nanocrystal sizes.

In contrast to conventional mixed-nanocrystal-based electroluminescent devices, the nanoparticle of the invention, in one aspect, when used as an intrinsic layer, can provide a broadband emission, thereby providing white light while avoiding an overall reduction of device efficiency through self-absorption between the various sizes of nanocrystals 1. Structure In one aspect, the electroluminescent device comprises an n-type semiconductor, a p-type semiconductor, and a quantum dot layer in electrical or photonic communication with the n-type semiconductor and the p-type semiconductor, wherein the quantum dot layer comprises at least one quantum dot of the invention, nanoparticle of the invention, plurality of nanoparticles of any of the invention, product of the methods of the invention, or frequency converter of the invention, or mixture thereof (see, e.g., an exemplary electroluminescent device structure in FIG. 5). It is understood that n-type semiconductor and p-type semiconductor materials—both inorganic and organic (e.g., N,N'-diphenyl-N,N'-bis(3-methylphenyl)-(1,1'-biphenyl)-4,4'-diamine (TPD), aluminum tris(8-hydroxyquinoline) ($Alq_3$), or other known polymeric semiconductors)—known to those of skill in the art can be used in connection with the nanoparticles of the invention. In a further aspect, the quantum dot layer can be in contact with and in electrical communication with the n-type semiconductor and the p-type semiconductor. That is, in one aspect, the nanoparticle of the invention can be excited through contact-based energy transfer interactions. In a further aspect, the quantum dot layer can be in contact with the n-type semiconductor or the p-type semiconductor and in electrical or photonic communication with the n-type semiconductor and the p-type semiconductor. That is, in one aspect, the nanoparticle of the invention can be excited through non-contact-based energy transfer interactions.

In a further aspect, the electroluminescent device of the invention can further comprise at least one phosphor, additional quantum dot or mixture thereof. In such aspects, the at least one phosphor, additional quantum dot, or mixture thereof can be selected such that the at least one phosphor, additional quantum dot, or mixture thereof can absorb energy from the light emitted by recombination of electrons and holes injected into the intrinsic layer under forward bias or from the emission of the nanoparticle of the invention and can emit energy of the same or of a different frequency as the nanoparticle of the invention, thereby modifying the emission of the electroluminescent device. For example, the phosphor can comprise at least one white phosphor or yellow phosphor or a mixture thereof. In such an aspect, the phosphor can absorb energy from the light emitted by recombination of electrons and holes injected into the intrinsic layer under forward bias (e.g., UV light) and emit visible light of a frequency intrinsic to the at least one white phosphor or yellow phosphor or a mixture thereof.

In a further aspect, the additional quantum dot can be a quantum dot of other than the nanoparticle of the invention. In such an aspect, the additional quantum dot can absorb energy from the light emitted by recombination of electrons and holes injected into the intrinsic layer under forward bias or from the emission of the nanoparticle of the invention and can emit energy of the same or of a different frequency as the nanoparticle of the invention, thereby modifying the emission of the electroluminescent device.

In a further aspect, the additional quantum dot can function as an energy cascade system of the invention, as disclosed herein, and is capable of absorbing energy of a wavelength outside the first electromagnetic region and capable of emitting energy in the first electromagnetic region. That is, in such an aspect, the additional quantum dot can absorb energy emitted by the light emitted by recombination of electrons and holes injected into the intrinsic layer under forward bias and can emit energy within the absorption region of the nanoparticle of the invention, thereby increasing the amount of energy for absorption by the nanoparticle of the invention and, therefore, increasing the energy emitted by the electroluminescent device. For example, the additional quantum dot can be capable of absorbing energy of a wavelength of from about 100 nm to about 290 nm and capable of emitting energy of a wavelength of from about 290 nm to about 400 nm. As another example, the additional quantum dot can be capable of absorbing energy of a wavelength of from about 100 nm to about 320 nm and capable of emitting energy of a wavelength of from about 320 nm to about 400 nm. In one aspect, the additional quantum dot comprises at least one of cadmium sulfide, cadmium selenide, cadmium telluride, zinc selenide, zinc sulfide, or zinc telluride or a mixture thereof. For example, the quantum dot can comprise a single material (e.g., cadmium sulfide), a core/shell or two or more materials (e.g., cadmium sulfide/zinc sulfide), or an alloy of two or more materials.

2. Device Fabrication

Figure 5:
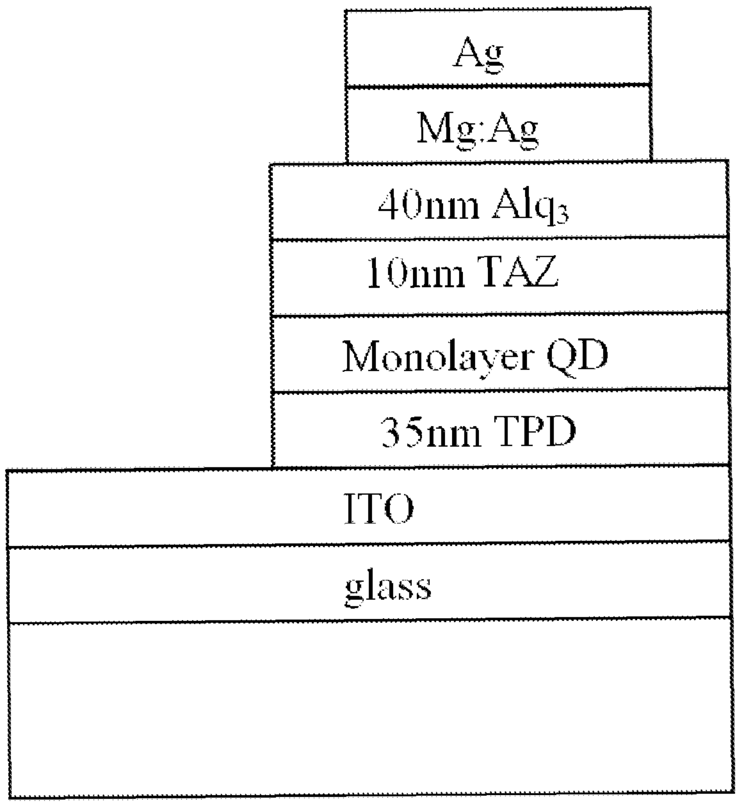
FIG. 5 shows a schematic of an electroluminescent device with nanoparticles of the invention as the emitting layer.

Electroluminescent devices of the invention can be prepared by methods analogous to those reported in the work of Coe et al., who employ a relatively inorganic approach to nanocrystal-based electroluminescent devices (FIG. 5). Coe, S.; Woo, W.; Bawendi, M.; Bulovic, V.; "Electroluminescence from single monolayers of nanocrystals in molecular organic devices," *Nature* 420 800-803 (2002). Briefly, a chloroform solution of ultrasmall CdSe and N,N'-diphenyl-N,N'-bis(3-methylphenyl)-(1,1'-biphenyl)-4,4'diamine (TPD), can be spin-cast onto a clean indium tin oxide (ITO) coated glass substrate. The nanocrystal and TPD concentrations can be adjusted to yield a monolayer of nanocrystals, on top of an about 35 nm TDP layer, when spin-cast. An approximately 40 nm thick film of aluminum tris(8-hydroxyquinoline) ($Alq_3$) can then be thermally evaporated; followed by an approximately 1 mm diameter, approximately 75 nm thick Mg:Ag (10:1 by mass) cathode with a 50 nm Ag cap. An additional layer of 3-(4-biphenyl)-4-phenyl-5-t-butylphenyl-1,2,4-triazole (TAZ) and/or bathocuprione (BCP) with a nominal thickness of 10 nm can be added between the nanocrystals and the $Alq_3$ layer or between the $Alq_3$ layer and the metal cathode layers. All of these processes are typically carried out in a dry box under air-free nitrogen atmosphere. More advanced designs can incorporate Bragg mirrors or other photonic crystal structures, which can enhance the brightness, efficiency, and directionality of light emission. In these devices, a bottom mirror can essentially reflect back any light emitted toward the substrate and therefore increase the light extraction through top surface.

3. Device Characterization

The properties that can be evaluated for the broad-emission nanocrystal-based LEDs in solid state lighting applications are luminous intensity, luminous efficacy, color temperature, and lifetime. In order to measure these properties, photometric experiments that measure optical radiation as perceived by the human eye can be performed. A photometric quantity can be obtained as follows: $P=\int K(\lambda)R(\lambda)d\lambda$, where P represents the photometric quantity (e.g., luminous flux in lumens), R represents the corresponding radiometric quantity that can be measured directly (e.g., radiant flux in Watts), and $K(\lambda)$ represents the visual response of the eye as a function of wavelength. Therefore, photometric experiments can use either a broadband detector with a special photopic filter that is calibrated to mimic the spectral response of the human eye (i.e., photometer) or a photodiode array with associated computer software that takes into account the spectral luminous efficacy of the human eye (i.e., spectroradiometer). Spectroradiometers are more accurate, especially at the edges of the visual response curve.

Figure 6:
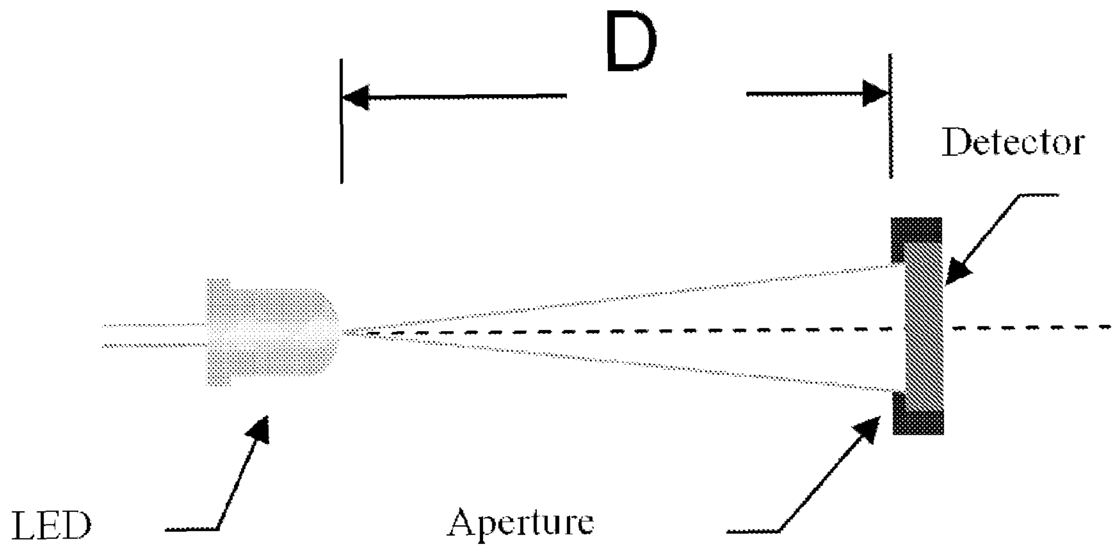
FIG. 6 shows a schematic of the geometry for electroluminescent and frequency converting LED device characterization.

Traditional light source testing methods are typically insufficient for characterizing LEDs due to the complicated spatial light distribution that is typical for LEDs. Special consideration is taken to avoid large discrepancies in measurements from different metrology laboratories. Therefore, in addition to maintaining a constant temperature environment and drive current, specific geometrical measurement conditions are imposed to ensure reproducibility. The International Commission on Illumination (CIE) sets the standards for characterizing an LED's performance. FIG. 6 illustrates one such configuration. The LED can be placed in a fixed position with its mechanical center aligned to the middle of the detector, which is located at a distance, D, from the LED. The optical center, meaning the location of the center of the emission cone of light, is not necessarily coincident with the mechanical center. Consequently, in order to enable reproducible measurements, all LEDs are tested at their mechanical center. The CIE has suggested the A and B criterion for setting the distance, D. Measurements are taken at D equal to 316 mm (A) and 100 mm (B). While the two conditions should give the same results for a Lambertian source that emits light uniformly in all directions, the emission of LEDs tends to be non-uniform and directional so the two measurements need to be averaged to determine the standardized LED performance. The configuration shown in FIG. 6 can be used to measure average luminous intensity (lm/sr), which loosely correlates to brightness as perceived by the human eye.

A second configuration is necessary to measure the total luminous flux (lm), lifetime, and color. By placing the LED in the center of an integrating sphere, the flux emitted in all directions can be detected. Given the electrical power input to the LED and the measured luminous flux output, the efficiency of the device can be determined. The industry target for luminous efficacy, as specified in the OIDA Solid-State LED Roadmap, is 75 lm/W by 2007 and 200 lm. Light Emitting Diodes (LEDs) for General Illumination: An OIDA Technology Roadmap Update 2002 (http://lighting.sandia.gov/lightingdocs/OIDA_SSL_LED_Roadmap_Full.pdf). For comparison, an incandescent lamp has an efficiency of approximately 16 lm/W, a commercial white light LED operates at approximately 30 lm/W, and a research-grade white light LED has been demonstrated at approximately 80 lm/W for very low drive currents. See http://www.lumileds.com; N. Narendran, Y. Gu, J. P. Freyssinier-Nova, and Y. Zhu, "Extracting phosphor-scattered photons to improve white LED efficiency," Phys. Stat. Sol. A 202, R60—R62 (2005). Internal quantum efficiency, light extraction efficiency, and phosphor down-conversion efficiency are all contributing factors to luminous efficacy. The lifetime of a solid-state LED, considered to be the 50% lumen depreciation level, can also be determined using the integrating sphere. The target lifetime for solid-state LEDs is greater than 100,000 hours by 2020. Current white light LEDs have lifetimes greater than 50,000 hours. http://www.lumileds.com. If the integrating sphere is coupled with a spectroradiometer, a calculation of the chromaticity coordinates and color temperature can also be accomplished, which specifies the apparent color of the LED when viewed directly. The spectroradiometer performs a complete spectral power distribution of the source being measured from which the colorimetric parameters can be mathematically calculated.

J. Energy Cascade Systems

The nanoparticle of the invention typically absorbs energy within a first electromagnetic region and emits energy within a second electromagnetic region. When used in connection with an energy source, the first electromagnetic region of the nanoparticle of the invention can, in one aspect, can comprise wavelengths of energy other than the entire emission region of the energy source. That is, the energy source may emit light at one or more wavelengths outside of the absorbance band of the nanoparticle of the invention. In such aspects, an energy cascade system can be employed to accumulate energy for absorption by the nanoparticle. The resulting system can be termed a cascade of energy collected for use by the longer-wavelength-absorbing nanoparticle or quantum dot. Specifically, in one aspect, a nanocrystal or core/shell nanocrystal, including for example a nanoparticle of the invention, can be used to collect light at very low wavelengths, e.g., 250 nm. The core/shell can then emit light at a higher wavelength (e.g., within a first electromagnetic region), wherein a nanoparticle in the invention can absorb efficiently.

For example, in one aspect, when an energy source emits energy within a first absorption electromagnetic region and the nanoparticle or quantum dot absorbs energy within a second absorption electromagnetic region, wherein the first absorption electromagnetic region and the second absorption electromagnetic region do not wholly overlap, the nanoparticle or quantum dot cannot absorb all available energy emitted by the energy source. In such an aspect, at least two quantum dots in photonic or energetic communication, wherein the first quantum dot is capable of absorbing energy from a first absorption electromagnetic region and capable of emitting energy in a first emission electromagnetic region, wherein the second quantum dot is capable of absorbing energy from a second absorption electromagnetic region and capable of emitting energy in a second emission electromagnetic region, and wherein the first emission electromagnetic region overlaps with the second absorption electromagnetic region can be employed to make a greater amount of energy emitted by the energy source available for absorption by the nanoparticle or quantum dot.

The energy cascade systems of the invention can be used in connection with the nanoparticle of the invention as well as with nanoparticles of other than the invention. That is, in one aspect, the energy cascade system comprises a second quantum dot comprising the quantum dot of the invention, the nanoparticle of the invention, or the product of the methods of the invention. In a further aspect, both the first quantum dot and the second quantum dot are narrow band emission nanocrystals of other than the invention.

In one aspect, the invention relates to an energy cascade system comprising at least two quantum dots in photonic communication, wherein the first quantum dot is capable of absorbing energy from a first absorption electromagnetic region and capable of emitting energy in a first emission electromagnetic region, wherein the second quantum dot is capable of absorbing energy from a second absorption electromagnetic region and capable of emitting energy in a second emission electromagnetic region, and wherein the first emission electromagnetic region overlaps with the second absorption electromagnetic region.

In a further aspect, the first absorption electromagnetic region comprises wavelengths of from about 100 nm to about 290 nm and the first emission electromagnetic region comprises wavelengths of from about 290 nm to about 400 nm. In a yet further aspect, the first absorption electromagnetic region comprises wavelengths of from about 100 nm to about 320 nm and the first emission electromagnetic region comprises wavelengths of from about 320 nm to about 400 nm. In a still further aspect, the second absorption electromagnetic region comprises wavelengths of from about 290 nm to about 400 nm or from about 320 nm to about 400 nm. In one aspect, the second emission electromagnetic region comprises wavelengths of from about 400 nm to about 700 nm or from about 420 nm to about 710 nm.

In one aspect, the first quantum dot comprises at least one of cadmium sulfide, cadmium selenide, cadmium telluride, zinc selenide, zinc sulfide, or zinc telluride or a mixture thereof. For example, the quantum dot can comprise a single material (e.g., cadmium sulfide), a core/shell or two or more materials (e.g., cadmium sulfide/zinc sulfide), or an alloy of two or more materials.

In one aspect, the second quantum dot comprises the nanoparticle of the invention or at least one of cadmium sulfide, cadmium selenide, cadmium telluride, zinc selenide, zinc sulfide, or zinc telluride or a mixture thereof. For example, the quantum dot can comprise a single material (e.g., cadmium sulfide), a core/shell or two or more materials (e.g., cadmium sulfide/zinc sulfide), or an alloy of two or more materials.

K. Solid State Lighting

Solid state lighting, in the form of white light emitting diodes (LEDs), is an attractive replacement for current lighting technologies based on their potential for longer service lifetimes and lower power consumption. [The Promise of Solid State Lighting for General Illumination, Optoelectronics Industry Development Association, Washington, D.C., 2001.] This requires an LED that emits white light which is pleasing to the eye, similar to the output from incandescent light bulbs or sunlight. Most current white-light LEDs emit a harsh white color similar to fluorescent lights. The quality of the emitted white light can be evaluated by quantities such as CIE chromaticity coordinates, color rendering index (CRI), and correlated color temperature (CCT). Each of these measures is important for characterizing the unique properties of white-light LEDs. The CIE chromaticity coordinates (x, y) allow specification of the exact color of the emission as perceived by the human eye, where (0.33, 0.33) is the ideal value for white light. Color rendering index is a measure of the ability of a source to reproduce the colors of a variety of objects that it illuminates, presented on a scale of 0 to 100, representing the worst (0) and best (100) color rendering. Correlated color temperature is a measure of the temperature in degrees Kelvin where a blackbody radiator best matches the emission spectrum of the tested light source. Ideal CCT values for white-light LEDs range from warmer white (2500 K to 4500 K) to cooler white (4500 K to 6500 K). [D'Andrade, B. W.; Forrest, S. R. "White Organic Light-Emitting Devices for Solid-State Lighting." Adv. Mater. 16, 1585-1595, 2004.] The values for each of these quantities are given for common white-light sources in Table 1.

A 2001 Department of Energy study found that transitioning to solid state lighting, such as using white-light LEDs, would reduce carbon dioxide emission by 258 million metric tons and eliminate the need for over 100 new power stations over a 20 year period. [The Promise of Solid State Lighting for General Illumination, Optoelectronics Industry Development Association, Washington, D.C., 2001.] Generally, the goal is to decrease the global electricity usage for lighting by 50% while at the same time provide higher quality lighting. Over the same 20 year period, this could save 760 GW of energy in the U.S. alone, which would result in a financial savings of over $115 billion dollars.

TABLE 1

CIE coordinates, CRI, and CCT for common white-light sources. [D'Andrade, B. W.; Forrest, S. R. "White Organic Light-Emitting Devices for Solid-State Lighting." Adv. Mater. 16, 1585-1595, 2004.] The Inova commercial white-light LED was measured in a Labsphere SLMS-LED-1050 integrating sphere system.

| White-Light Source | CIE x | CIE y | CRI | CCT (K) |
|---|---|---|---|---|
| Incandescent Bulb | 0.448 | 0.408 | 100 | 2854 |
| Fluorescent, cool white | 0.375 | 0.367 | 89 | 4080 |
| Fluorescent, warm white | 0.440 | 0.403 | 72 | 2940 |
| Daylight (CIE Standard Illuminant $D_{65}$) | 0.313 | 0.329 | 90 | 6500 |
| Inova commercial white-light LED | 0.308 | 0.300 | 76 | 7137 |

1. White-Light LEDs

A current problem with transitioning to solid state lighting is the lack of an efficient LED that is easy to manufacture and possesses sufficient color properties for general lighting. Several approaches have been reported toward the development of a viable solid state white-light LED. One technique utilizes a blue light-emitting InGaN LED coated with cerium-doped yttrium aluminum garnet ($Ce^{3+}$:YAG) crystals, which function as a yellow phosphor. [Tamura, T.; Setomoto, T.; Taguchi, T. "Illumination characteristics of lighting array using 10 candela-class white LEDs under AC 100 V operation." Journal of Luminescence 87-89, 1180-1182, 2000.; Schlotter, P., et al., "Fabrication and characterization of GaN:InGaN:AlGaN double heterostructure LEDs and their application in luminescence conversion LEDs." Mat. Sci. and Eng. B 59, 390-394, 1999.] The crystals convert some of the blue LED light to yellow light, creating a mixture of yellow and blue light that gives the appearance of white light. This light is considered to be cool white because it has a color temperature of about 5000 K. The lack of emission in the red region of the spectrum results in an inferior white light compared to incandescent bulbs, which is a significant obstacle to overcome before achieving the transition to solid state lighting. In order to enable a more tunable form of white light, a combination of red, green, and blue phosphors can be pumped with a UV LED. [Steigerwald, D. A., et al., "Illumination With Solid State Lighting Technology." IEEE J. on Sel. Top. in Quant. Elec. 8, 310-320, 2002.; Sheu, J. K., et al., "White-Light Emission From Near UV InGaN—GaN LED Chip Precoated With Blue/Green/Red Phosphors." IEEE Photonics Technology Letters 15, 18-20, 2003.] However, by using three phosphors instead of one, the complexity of fabricating these devices is greatly increased.

White-light LEDs have also been demonstrated without the use of phosphors by growing homoepitaxial zinc selenide (ZnSe) on a ZnSe substrate. Some of the greenish-blue light (485 nm) from the active region of the p-n junction is absorbed by the substrate and re-emitted as yellow light (centered on 585 nm) via self-activated emission, resulting from distant donor-acceptor pair transitions. [Katayama, K., et al., "ZnSe-based white LEDs." Journal of Crystal Growth 214/215, 1064-1070, 2000.; Shirakawa, T. "Effect of defects on the degradation of ZnSe-based white LEDs." Mater. Sci. and Eng. B 91-92, 470-475, 2002.; Thomas, A. E.; Russell, G. J.; Woods, J. "Self-activated emission in ZnS and ZnSe." J. Phys. C: Solid State Phys. 17, 6219-6228, 1984.] However, the color rendering of these devices is poor due to a CRI of 68, which is not high enough for general room illumination. White-light LEDs have also been fabricated with higher color rendering by using separate red, green, and blue LEDs to produce white light with a CRI greater than 80. [Muthu, S.; Schuurmans, F. J.; Pashley, M. D. "Red, Green, and Blue LEDs for White Light Illumination." IEEE J. on Sel. Top. In Quant. Elec. 8, 333-338, 2002.; Chhajed, S.; Xi, Y.; Li, Y.-L.; Gessmann, Th.; Schubert, E. F. "Influence of junction temperature on chromaticity and color-rendering properties of trichromatic white-light sources based on light-emitting diodes." J. of Appl. Phy. 97, 054506, 2005.] However, these devices are expensive and complex to produce because of the complicated feedback system that is necessary to maintain the proper color balance as the red, green, and blue LEDs degrade at different rates over time.

2. CdSe Nanocrystal-Based LEDs

For more than a decade, monochromatic light emitting diodes have been fabricated using CdSe nanocrystals as the emitting layer of the device. Electrons are injected into the nanocrystal layer while holes are injected into a layer of a semiconducting polymer such as p-paraphenylene vinylene (PPV) or polyvinylcarbazole (PVK), resulting in light emission from both the polymer and the CdSe layer. [Colvin, V. L.; Schlamp, M. C.; Alivisatos, A. P. "Light-emitting diodes made from cadmium selenide nanocrystals and a semiconducting polymer." Nature 370, 354-357, 1994.; Dabbousi, B. O.; Bawendi, M. G.; Onitsuka, O.; Rubner, M. F. "Electroluminescence from CdSe quantum-dot/polymer composites." Appl. Phys. Lett. 66, 1316-1318, 1995.; Schlamp, M. C.; Peng, X.; Alivisatos, A. P. "Improved efficiencies in light emitting diodes made with CdSe.CdS.core/shell type nanocrystals and a semiconducting polymer." *J. of Appl. Phys.* 82, 5837-5842, 1997.; Mattoussi, H., et al., "Electroluminescence from heterostructures of poly(phenylene vinylene) and inorganic CdSe nanocrystals." J. of Appl. Phys. 83, 7965-7974, 1998.; Mattoussi, H., et al.,"Composite thin films of CdSe nanocrystals and a surface passivating/electron transporting block copolymer: Correlations between film microstructure by transmission electron microscopy and electroluminescence." *J. of Appl. Phys.* 86, 4390-4399, 1999.] Because of the poor charge conduction in CdSe nanocrystal layers, utilizing a single monolayer of CdSe nanocrystals has been shown to increase the external electroluminescence quantum efficiency of these devices from <0.01% to 1.1%. [Coe, S.; Woo, W.-K.; Bawendi, M.; Bulović, V. L. "Electroluminescence from single monolayers of nanocrystals in molecular organic devices." Nature 420, 800-803, 2002.; Coe-Sullivan, S.; Woo, W.-K.; Steckel, J. S.; Bawendi, M. G.; Bulović, V. L. "Tuning the performance of hybrid organic/inorganic quantum dot light-emitting devices." Org. Electron. 4, 123-130, 2003.] Recently, a new charge conduction mechanism has been demonstrated where CdSe nanocrystals are deposited onto an InGaN quantum well and electron-hole pairs are indirectly injected into the nanocrystals, resulting in an energy transfer and band edge emission by the nanocrystals. [Achermann, M.; Petruska, M. A.; Kos, S.; Smith, D. L.; Koleske, D. D.; Klimov, V. I. "Energy-transfer pumping of semiconductor nanocrystals using an epitaxial quantum well." Nature 429, 642-646, 2004.] In addition, CdSe nanocrystals have been used as the intrinsic layer of an all-inorganic LED when surrounded by n- and p-doped GaN to inject electrons and holes directly, avoiding the low carrier mobilities of organic materials. [Mueller, A. H. et al. "Multicolor Light-Emitting Diodes Based on Semiconductor Nanocrystals Encapsulated in GaN Charge Injection Layers." Nano Lett. 5, 1039-1044, 2005.]

3. White-Light Emitting CdSe Nanocrystals

Current white-light, nanocrystal-based devices rely on either a combination of nanocrystal and polymer emission or the mixing of several sizes of nanocrystals to achieve white light. It has been widely published that the color of the light emitted depends on the size of the nanocrystal. For example, CdSe nanocrystals with a diameter of 7 nm emit red light while CdSe nanocrystals with a diameter of 2 nm emit blue light. [Murray, C. B., Norris, D. J., Bawendi, M. G. "Synthesis and Characterization of Nearly Monodisperse CdE (E=S, Se, Te) Semiconductor Nanocrystallites." J. Am. Chem. Soc. 115, 8706-8715, 1993.; Alivisatos, A. P. "Semiconductor Clusters, Nanocrystals, and Quantum Dots." Science 271, 933-937, 1996.] The efficiency of white-light LEDs based on several sizes of nanocrystals is compromised due to the overlap of the emission and absorption spectra of the different size nanocrystals. The present approach to achieving high quality white-light LEDs that can be fabricated at low cost involves the use of white-light emitting CdSe nanocrystals that are a single ultrasmall size and exhibit broadband emission from 420-710 nm when illuminated with UV light, as seen in FIG. 1. These nanocrystals are monodisperse with a diameter of approximately 1.5 nm. Without wishing to be bound by theory, because the ultrasmall nanocrystals are believed to be approximately 1.5 nm in diameter, the emission in the blue part of the spectrum is believed due to the inherent size of the nanocrystals and is likely a result of internal exciton recombination processes. The broad emission in the yellow and red portions of the ultrasmall CdSe nanocrystal emission spectrum has been attributed to midgap states resulting from uncoordinated selenium atoms on the surface of the nanocrystals. [Bowers, M. J., II; McBride, J. R.; Rosenthal, S. J. "White-Light Emission from Ultrasmall Cadmium Selenide Nanocrystals." J. Am. Chem. Soc. 127, 15378-15379, 2005.]

In one aspect, the invention relates to a broad emission LED comprising at least one nanocrystal of the invention encapsulated within a polymer, for example, a polymer as disclosed herein, including but not limited to a perfluorocyclobutyl (PFCB) polymer. In various aspects, LEDs comprising the nanocrystals of the invention can emit produce white light from 420-710 nm.

4. Advantages of White-Light Nanocrystal-Based Devices

Single, ultrasmall CdSe nanocrystals, in one aspect, have a large Stokes shift separating the absorption and emission peaks. Consequently, devices based on these nanocrystals will not suffer from self-absorption, potentially resulting in higher device efficiency. Another advantage is that ultrasmall CdSe nanocrystal white-light LEDs would not require a mixture of phosphors or a complex feedback system to generate white light, resulting in much simpler devices. Furthermore, the addition of emission in the red portion of the spectrum gives higher color rendering than in devices emitting mostly blue and yellow light, such as the blue LED with yellow phosphor and the ZnSe-based devices. Encapsulating ultrasmall CdSe nanocrystals coated onto UV LEDs act as frequency downconverters to produce white light from 420-710 nm.

In the preparation of LEDs, the choice of encapsulant can play a role in the white-light emission spectrum. In the examples, the highest quality white-light spectra were observed when the ultrasmall CdSe nanocrystals are dispersed into PFCB polymer. Increasing the concentration of nanocrystals in PFCB typically results in the emission color changing from a cooler white to a warmer white. Furthermore, varying the wavelength of the LED used to excite the samples can have a small effect on the emission spectrum of the nanocrystals, with longer wavelengths LEDs causing a shift towards a cooler white color. Using a 385 nm LED to excite 2% CdSe nanocrystals in PFCB, chromaticity coordinates of (0.33, 0.30), CRI of 79, a color temperature of 5406 K, and luminous efficacy slightly below 0.5 lm/W have been measured. Incorporation of ultrasmall nanocrystals into an electroluminescent device can lead to higher quality and more economical solid state lighting devices.

L. Experimental

The following examples are put forth so as to provide those of ordinary skill in the art with a complete disclosure and description of how the compounds, compositions, articles, devices and/or methods claimed herein are made and evaluated, and are intended to be purely exemplary of the invention and are not intended to limit the scope of what the inventors regard as their invention. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

Acetonitrile, ethyl acetate, hexanes, toluene, methanol, hexanol, and butanol, all reagent grade, were purchased from Sigma-Aldrich. For the nanocrystal synthesis, phenyl phosphonic acid (PPA, 98%, Aldrich), hexyl phosphonic acid (97%, Strem), hexadecyl amine (HDA, technical grade 90%, Aldrich), CdO (99.99%, Strem), Se powder (200 mesh, 99.99%, Strem), and tributyl phosphine (TBP, 97%, Aldrich) were used as received, while other phosphonic acids were synthesized as described below. The various phosphonic acid syntheses required the use HCl (12.1 M, aqueous, EMD Chemicals), triethyl phosphite (TEP, 98%, Aldrich), and either Bromodocosane (96%, Aldrich), Bromohexadecane (97%, Aldrich), Bromododecane (97%, Aldrich), Bromodecane (98%, Aldrich), Bromooctane (99%, Acros-organics), Bromobutane (98%, Aldrich), 2-ethyl,hexyl bromide (95%, Aldrich), 3-methyl,butyl bromide (96%, Aldrich), or 3-phenyl,propyl bromide (98%, Acros-organics).

All $^{1}H$ and $^{13}C$ spectra were recorded on a Bruker 300 MHz spectrometer equipped with a 7 Tesla Oxford magnet controlled by a Bruker DPX-300 console at ambient temperature in deuterated DMSO, methanol, or $CDCl_3$. The spectra were analyzed using TopSpin 2.0 software. The IR spectra for all the phosphonic acids were recorded on a ThermoNicolet—IR300 spectrometer using EZOMNIC version 6.1 software. ESI-MS measurements were done on a FinniganMat—Electrospray Ionization LCQ Mass spectrometer system with TunePlus version 1.3 software. All absorption measurements were conducted on a Varian-Cary 50 Bio UV-Visible Spectrophotometer with accompanying software. The emission spectra were recorded using an ISS PC1 photon counting spectrofluorimeter, using Vinci version 1.6.SP5 software.

1. Synthesis of Ultrasmall Cadmium Selenide Nanocrystals a. Reagents

Tri-n-octylphosphine oxide (TOPO, 90% tech. grade), hexadecylamine (HDA, 90% technical grade) and octadecene (ODE, 90% technical grade) were purchased from Aldrich and used as received. CdO (99.999% Puratrem), tri-n-butylphosphine (TBP, 97%), and selenium powder (200 mesh) were purchased from Strem and used as received. Dodecylphosphonic acid (DPA) was synthesized via the Arbuzov reaction from triethylphoshite and 1-dodecylbromide followed by acid work up with concentrated HCl and recrystallization from cold ethyl acetate. [Maege, I.; Jaehne, E.; Henke, A.; Adler, H.-J. P.; Bram, C.; Jung, C.; Stratmann, M. "Self-assembling adhesion promoters for corrosion resistant metal polymer interfaces." Progress in Organic Coatings 34, 1-12, 1998.] All other solvents used were HPLC grade and purchased from Fisher Scientific, unless otherwise noted.

b. Procedure 1

A 1.0 M solution of selenium in TBP was produced by dissolving 7.896 g selenium powder in 100 mL of TBP. The 0.10 M injection mixture was made by dilution of the 1.0 M Se:TBP solution with ODE. This solution was stable for several days stored in a capped bottle, in ambient conditions at room temperature. The reaction solvent was mixed from a unit quantity of TOPO and HDA (7.2 g and 2.97 g respectively) along with 0.128 g of CdO and 0.496 g of DPA (scaled as necessary). These contents were heated in a 100 mL three neck flask under argon with vigorous stirring to 310° C. A needle was placed in the septum to allow for an argon purge until the reaction mixture reached 150° C., at which point the reaction vessel was considered water- and oxygen-free. Upon reaching reaction temperature (330° C.), 5 mL of the Se:TBP:ODE solution were swiftly injected and the temperature reduced to 270° C. as quickly as was possible without allowing the temperature to drop below 260° C. To achieve ultrasmall nanocrystals (e.g., <20 Å), a second syringe of toluene (typically 5 mL) was injected to reduce the reaction temperature to <150° C. within about 2 to about 10 seconds after the initial injection.

c. Procedure 2

As before, a 0.10 M injection mixture of selenium in TBP was produced by dissolving 7.896 g selenium powder in 100 mL of TBP and dilution of the 1.0 M Se:TBP solution with ODE. The reaction mixture was prepared from 2.97 g of HDA and 0.128 g of CdO and 0.496 g of DPA (scaled as necessary). These contents were heated in a 100 mL three neck flask under argon with vigorous stirring to 330° C., until the solution became colorless. The mixture was then purged with argon and cooled to approximately room temperature (i.e., about 25° C.). Then, 7.2 g of TOPO was added to the reaction mixture, which was then heated to reaction temperature (e.g., about 330° C.).

At reaction temperature, 5 mL of the Se:TBP:ODE injection mixture were injected and the temperature reduced to 270° C. as quickly as was possible without allowing the temperature to drop below 260° C. To achieve ultrasmall nanocrystals (e.g., <20 Å), a second syringe of toluene (typically 5 mL) was injected to reduce the reaction temperature to <150° C. within about 2 to about 10 seconds after the initial injection.

d. Characterization

FIG. 1 shows the absorption and emission properties of a sample of ultrasmall CdSe prepared by the methods of the invention. The first absorption feature is at 414 nm which has been assigned as a thermodynamically determined "magic size," on the order of 15 Å, for CdSe. Qu, L.; Yu, W. W.; Peng, X. *Nano Lett.* 2004, 4, 465-469; Landes, C.; Braun, M.; Burda, C.; El-Sayed, M. A. *Nano Lett.* 2001, 1, 667-670. The emission spectrum shows a band edge emission followed by two features attributed to emission from energetically different midgap states. The fluorescence quantum yield for this example is on the order of 2% to 3%, with a calculated extinction coefficient of 22311 per mole of nanocrystals. Yu, W. W.; Qu, L.; Guo, W.; Peng, X. *Chem. Mater.* 2003, 15, 2854-2860. Additionally, the material demonstrated good photostability. Thin films of ultrasmall CdSe (neat on a glass slide) were able to maintain their optical properties after ten days of exposure to intense UV light from a 1000 μW, 370 nm LED (LEDtronics) under ambient conditions (air at room temperature).

2. Preparation of Nanocrystals by Etching (Comparative)

Figure 7:
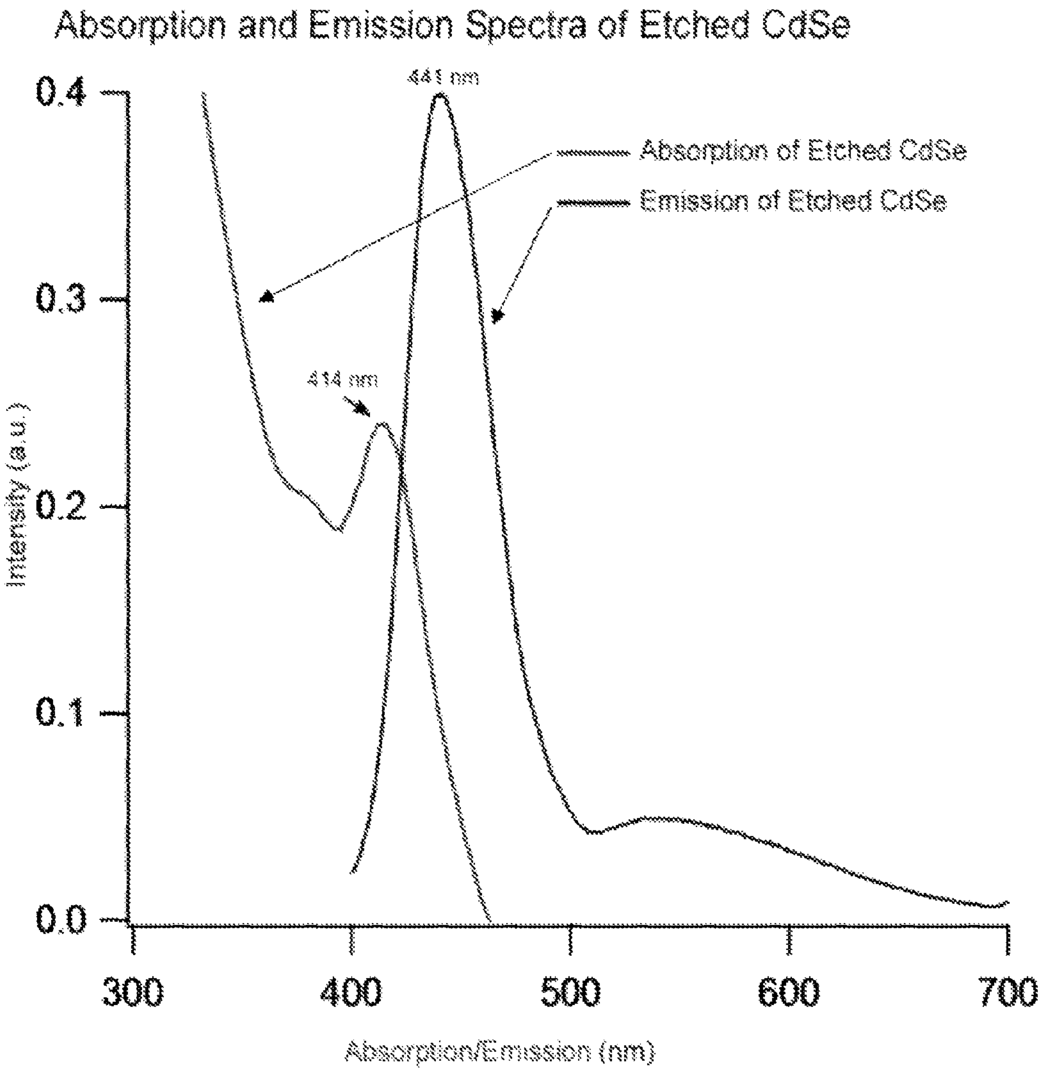
FIG. 7 shows an absorption/emission spectrum of CdSe nanocrystals prepared by an etching process.

A solution of 456 nm absorbing CdSe nanocrystals in toluene was mixed with butylamine. The final butylamine concentration was approximately 0.9M. The etching process was carried out at room temperature over four days. The absorption and emission spectra were collected once the primary absorption peak had reached 414 nm. The spectrum of the resulting nanocrystals is shown in FIG. 7.

3. Ultrasmall Cadmium Selenide Nanocrystals Having Improved Quantum Yield a. Reagents Tri-n-octylphosphine oxide (TOPO, 90% tech. grade), hexadecylamine (HDA 90% tech. grade) and octadecene (ODE, 90% tech. grade) were purchased from Aldrich and used as received. CdO (99.999% Puratrem), tri-n-butylphosphine (TBP, 97%), and selenium powder (200 mesh) were purchased from Strem and used as received. Dodecylphosphonic acid (DPA) was synthesized via the Abruzov reaction from triethylphoshite and 1-dodecylbromide followed by acid work up with concentrated HCl and recrystallization from cold ethyl acetate. All other solvents were HPLC grade and purchased from Fisher Scientific unless otherwise noted.

b. Synthesis

A 1.0 M solution of selenium in TBP was produced by dissolving 7.896 g selenium powder in 100 mL of TBP. The 0.20 M injection solution was made by dilution of the 1.0 M Se:TBP solution with TBP. This solution was stable for several days stored in a sealed bottle, in ambient conditions at room temperature. The reaction solvent was mixed from a unit quantity of TOPO and HDA (7.0 g and 3.0 g respectively) along with 0.128 g of CdO and 0.496 g of DPA. These contents were heated in a 100 mL three neck flask under argon with vigorous stirring to 330° C. A needle was placed in the septum to allow for an argon purge until the reaction solution reached 150° C. at which point the reaction vessel was considered water and oxygen free. Upon reaching reaction temperature (330° C.), the reaction continued stirring until the red color from the CdO disappeared. The temperature was then reduced to 315° C. and the heating mantle was removed. 4.5 mL of the 0.2 M Se:TBP along with 2 mL ODE were swiftly injected. A second syringe of butanol (typically 10 mL) was injected to reduce the reaction temperature to <150° C. within 2-10 seconds after the initial injection. Time is determined by the observed color of the reaction vessel. That is, for example, the alcohol solution can be added at the first appearance of a yellow color in the solution. This addition, in one aspect, can also have the effect of precipitating the nanocrystals. This reaction may be scaled to produce larger or smaller quantities.

c. Isolation

Nanocrystals are divided into equally into two 11 dram vials. The vials are filled to the top with methanol and centrifuged. The liquid is discarded and a small amount of hexyl alcohol is added the vial and then centrifuged again. The nanocrystals are removed by the hexyl alcohol leaving behind the excess HDA. The liquid is poured into two clean 11 dram vials and the nanocrystals are precipitated by addition of methanol and collected by centrifugation. The solvent is discarded and the nanocrystals are re-dissolved in the nonpolar solvent of choice (toluene, hexanes, chloroform, etc.).

d. Characterization

Figure 8:
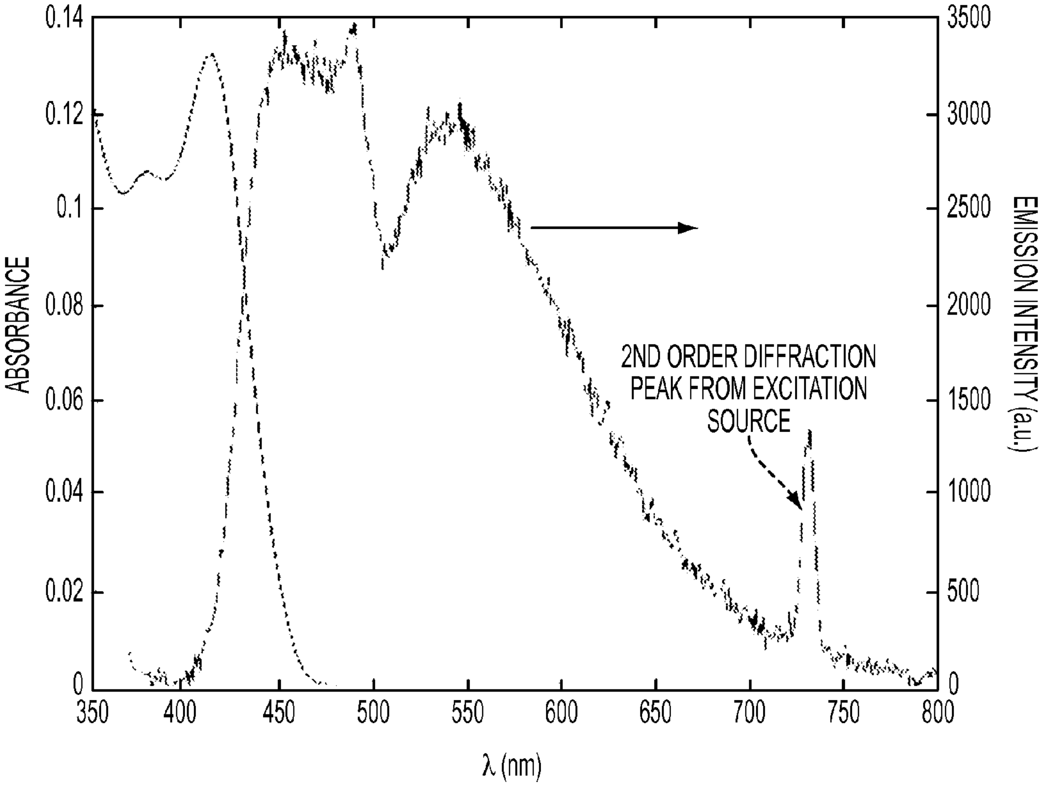
FIG. 8 shows an absorption/emission spectrum of ultrasmall cadmium selenide nanocrystals having improved quantum yield.

The nanocrystals of this example exhibit a broad emission spectrum. An exemplary spectrum is shown as FIG. 8.

e. Quantum Yield

Nanocrystals produced in this example exhibit average quantum yields (i.e., light in to light out ratios) of at least 10%. That is, in this example, nanocrystals produced by the methods of the invention can have a quantum yield of grater than about 10%.

4. Encapsulation a. Nanocrystal Synthesis

A 1.0 M stock solution of selenium in TBP was produced by dissolving 11.84 g selenium powder in 150 mL of TBP. The injection solution was produced by further diluting a 0.2 M Se:TBP solution with TBP. This solution was stable for several days stored in a capped bottle, under nitrogen or argon at room temperature. The reaction solvent was mixed from a unit quantity of TOPO and HDA (7.0 g and 3.0 g respectively) along with 0.128 g of CdO and 0.496 g of DPA (scaled as necessary). These chemicals were placed in a 100 mL three neck flask, with a temperature probe, a bump trap, and a septum in the three necks. A needle was placed in the septum to allow for an argon purge until the reaction solution reached 150° C., at which point the reaction vessel was considered water and oxygen free.

The reaction continued to be heated under argon with vigorous stirring up to 320° C. Upon reaching reaction temperature, 4.25 mL of the 0.2 M Se:TBP solution along with 2.00 mL of ODE solution were mixed in a syringe and swiftly injected. Following this injection the temperature of the reaction flask was maintained between 270° C. and 240° C. To achieve ultrasmall nanocrystals (e.g., <20 Å), a second syringe of butanol (typically 10 mL) was injected to reduce the reaction temperature to <130° C. within 2-10 seconds after the initial injection (depending on the desired size). Further cooling using compressed air, applied to the outside of the reaction flask, cooled the solution to <100° C. The nanocrystals were then removed from the coordinating solvents using methanol and hexanol washes, before being suspended in toluene.

b. Sample Preparation

A range of different encapsulant materials were chosen based on their ability to add phosphor materials to them before curing and on their color after curing, preferably clear. The encapsulants were prepared according to the instructions provided using the following materials: Easy Cast clear casting epoxy (Environmental Technology Inc.), RTVS 61 clear silicone (Insulcast), Epo-Tek epoxy resin (Epoxy Technology), perfluorocyclobutyl (PFCB) polymer (Tetramer Technologies), EP 691 clear epoxy resin (Resinlab), and EP 965 clear epoxy resin (Resinlab). Other materials were tested but are not listed due to incomplete mixing with the nanocrystal solution or insufficient hardening at room temperature after addition of the nanocrystals. The CdSe nanocrystals were added while in solution (toluene) and mixed thoroughly before the encapsulant was cured. Aggregation was monitored via fluorescence microscopy, where the emitted white light blinking on and off from a thin film of nanocrystals in the encapsulant was observed. This on/off or intermittency behavior is based on an Auger ionization process and is only seen in single nanocrystal emission, indicating little or no aggregation. [Nirmal, M.; Dabbousi, B. O.; Bawendi, M. G.; Macklin, J. J.; Trautman, J. K.; Harris, T. D.; Brus, L. E. "Fluorescence intermittency in single cadmium selenide nanocrystals." Nature 383, 802-804, 1996.; Blanton, S. A.; Hines, M. A.; Guyot-Sionnest, P. "Photoluminescence wandering in single CdSe nanocrystals." Appl. Phys. Lett. 69, 3905-3907, 1996.]

For curing, vials of samples were placed inside a lab oven at 65-100° C. for 3-24 hours depending on the curing schedule of the encapsulant. After hardening, the samples were removed from the oven and left to cool to room temperature before testing. If the encapsulant material did not adhere to the glass vial, the sample was removed from the vial before testing. However, if the encapsulant did adhere to the glass, the sample was tested while still inside the vial. The Easy Cast, RTVS 61, Epo-Tek samples were tested after being removed from the vial, while the PFCB, EP 691, and EP 965 samples were tested in the vial.

c. Sample Testing

Absorption and photoluminescence were recorded for all samples. The UV-V is absorbance measurements were performed in air using a Varian Cary Bio 100 UV-Vis spectrophotometer. Photoluminescence measurements were carried out using either a spectrofluoremeter or an integrating sphere with a fiber-coupled spectrometer. Multiple excitation sources were used for the photoluminescence measurements, including a 300 W high-pressure xenon arc lamp with monochromator, and UV or blue LEDs in wavelengths of 365, 375, 385, 395, 405, 410, and 423 nm (Roithner LaserTechnik) The LEDs were powered at 20 mA and 4 V using a Keithley 2400 sourcemeter.

Figure 9:
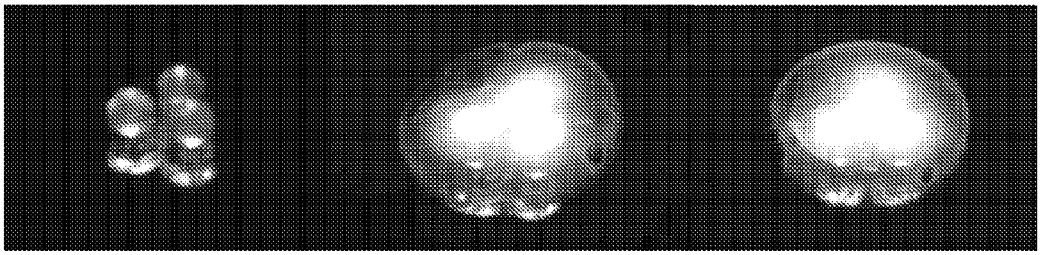
FIG. 9 shows images of (a) three 385 nm LEDs powered at 20 mA each, and white-light CdSe nanocrystals in PFCB polymer at concentrations of (b) 1% nanocrystals in PFCB and (c) 2% nanocrystals in PFCB, with three 385 nm LEDs illuminating the samples from underneath.

The first photoluminescence apparatus utilized an ISS PC 1 photon counting spectrofluoremeter in air. The nanocrystals in solution were excited by the xenon white-light source using a monochromator. The samples of nanocrystals in encapsulant were excited using commercial UV and blue LEDs. Images of the LEDs and then the samples on top of the LEDs can be seen in FIG. 9, which shows the white light being emitted by the samples. The absorption and emission spectra of these samples can be seen in FIG. 10 and FIG. 11, respectively. The second photoluminescence apparatus consisted of a Labsphere SLMS-LED-1050 integrating sphere system. The samples were placed on top of the LEDs in the center of the integrating sphere. The integrating sphere was fiber-optically coupled to a CDS 500 CCD-based spectrometer that measured emission from 350-850 nm. The provided software calculated radiant flux, luminous flux, CIE chromaticity coordinates, correlated color temperature (CCT), and color rendering index (CRI).

Though many encapsulant materials were tested, the polymer PFCB typically performed the best due to the high UV absorption by the samples with CdSe nanocrystals at low thicknesses (several millimeters). To achieve this same level of absorption in other materials, most needed to be several centimeters thick, which is much larger than is typically acceptable for a commercial product. Ideally, either a very thin coating of the encapsulant with nanocrystals would be applied to the outside of a commercial UV LED, or the nanocrystals in the encapsulant would replace the commercial clear epoxy bulb and encase a UV LED die. In either case, it is typically desirable to have as little as possible UV light leak out of the device. In addition to the high absorbance, the nanocrystals mixed thoroughly and easily in PFCB while curing in a matter of hours. Based on its better performance than the other encapsulants, the data will be presented only for PFCB samples.

d. Absorption

Figure 10:
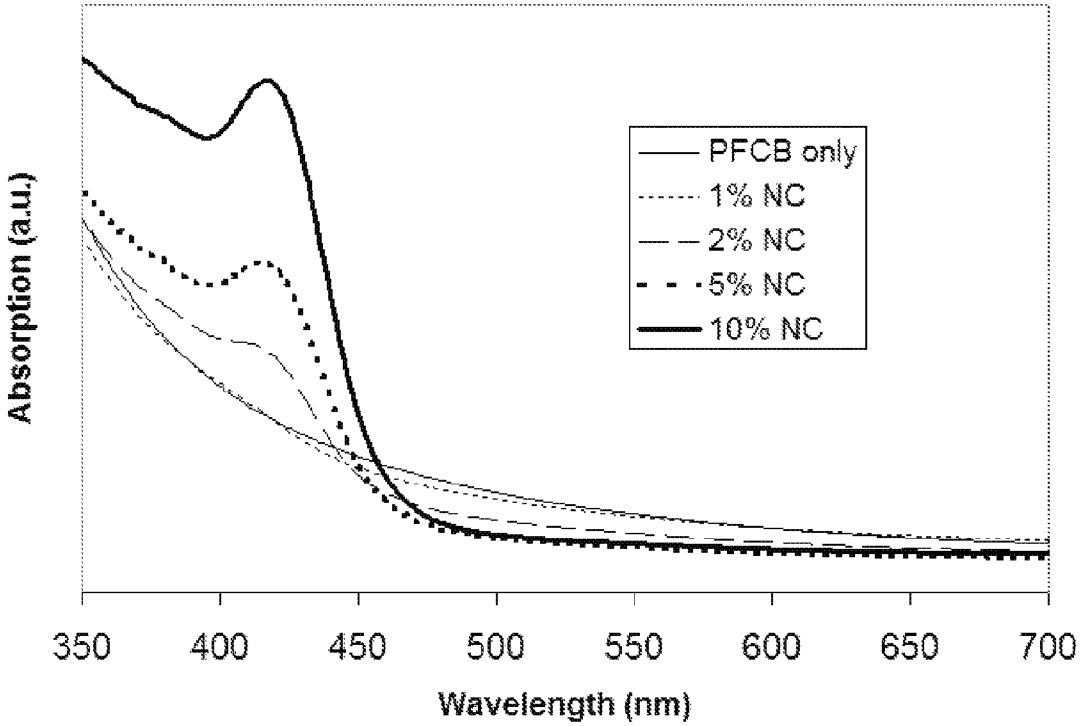
FIG. 10 shows absorption spectra of PFCB, and 1%, 2%, 5%, and 10% by weight ultrasmall CdSe nanocrystals dispersed in PFCB.

FIG. 10 shows the absorption spectra for PFCB alone, and PFCB with 1%, 2%, 5%, and 10% nanocrystals by weight. The PFCB curve shows a gradual decrease in absorption from 350 nm to 700 nm with no visible peaks. The nanocrystals in solution show a strong band edge absorption feature at 414 nm, which is typical for ultrasmall CdSe nanocrystals with a diameter of 1.5 nm, as seen in FIG. 1. The nanocrystals with PFCB curves show the same general trend of the PFCB only curve with the addition of the band edge absorption feature at 414 nm, which shows that the nanocrystals have not grown in size and are dispersed into the polymer matrix. At only 1% nanocrystals by weight, the absorption spectrum is almost identical to the polymer only absorption spectrum. At 2% nanocrystals in PFCB, the band edge absorption peak of the CdSe nanocrystals can be observed. As the ratio of the nanocrystals to the polymer increases, the absorption spectrum more strongly resembles that of pure, ultrasmall CdSe nanocrystals in solution.

e. Photoluminescence

Figure 11:
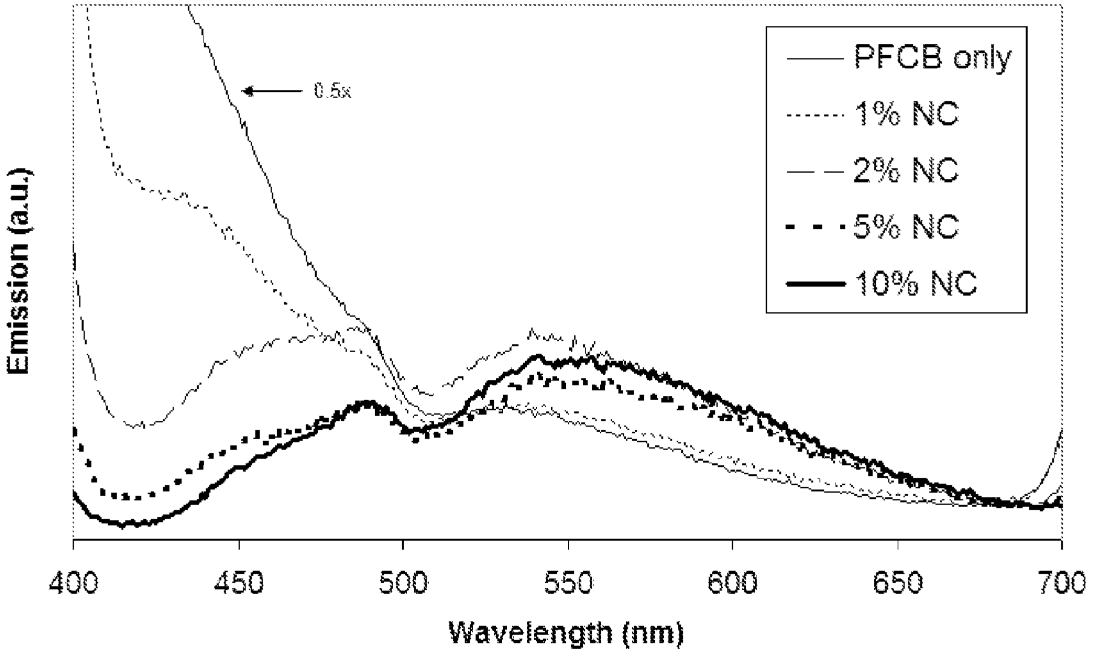
FIG. 11 shows emission spectra of PFCB, and 1%, 2%, 5%, and 10% by weight ultrasmall CdSe nanocrystals dispersed in PFCB. The PFCB only curve was multiplied by ½ for scaling purposes.

FIG. 11 shows the emission spectra for PFCB alone and for PFCB with 1%, 2%, 5%, and 10% nanocrystals by weight. A 365 nm LED was used as the excitation source and the LED emission was detected with the photon counting spectrofluoremeter. The PFCB curve shows a strong emission in the blue portion of the spectrum up to about 500 nm, with very little emission at higher wavelengths. At only 1% nanocrystals in PFCB, the emission spectrum shows a similar trend to the polymer only curve but with a slightly lower amount of blue emission. The samples with concentrations of 2%, 5%, and 10% nanocrystals display a decreasing amount of blue emission at higher concentrations of nanocrystals in PFCB. Like the absorbance, an increase in the amount of nanocrystals in the sample causes the emission to appear more like the nanocrystal only emission spectrum and less like the PFCB only emission spectrum.

The color characteristics of CIE coordinates, CRI, and CCT as well as the luminous efficacy for the PFCB with nanocrystal samples are reported in Table 2. The luminous efficacy is calculated as total luminous flux divided by the electrical power used to light the UV LEDs, in lm/W. The 1% and 2% concentration of nanocrystals in PFCB had CIE coordinates of (0.289, 0.260) and (0.328, 0.296) respectively when illuminated with 385 nm LEDs, as seen in Table 2, which are within the white-light range and are similar to the other samples since the nanocrystals alone in solution have coordinates of (0.322, 0.365). [Bowers, M. J., II; McBride, J. R.; Rosenthal, S. J. "White-Light Emission from Magic-Sized Cadmium Selenide Nanocrystals." J. Am. Chem. Soc. 127, 15378-15379, 2005.] The CR1 and CCT were typically about 80 and 3500-5000 K, respectively, and are also in the ideal range for white-light LEDs. [Steigerwald, D. A., et al., "Illumination With Solid State Lighting Technology." IEEE J. on Sel. Top. in Quant. Elec. 8, 310-320, 2002.] The luminous efficacy of the exemplary devices is under 1 lm/W, which is partly due to the low quantum yield (10%) of the white-light nanocrystals. This yield is typically lower than the single-color CdSe nanocrystal emission quantum yield.

TABLE 2

CIE coordinates, CRI, and CCT for 1%, 2%, 5%, and 10% by weight ultrasmall CdSe nanocrystals in PFCB when excited with three 365 nm, 375 nm, or 385 nm LEDs.

| LED | Concentration | CIE x | CIE y | CRI | CCT (K) | Luminous Efficacy (lm/W) |
|---|---|---|---|---|---|---|
| 365 nm | 1% | 0.3566 | 0.4234 | 71.4 | 4779 | 0.05 |
| | 2% | 0.3759 | 0.4143 | 78.1 | 4299 | 0.05 |
| | 5% | 0.4167 | 0.4896 | 66.7 | 3881 | 0.04 |
| | 10% | 0.4412 | 0.4993 | 60.4 | 3549 | 0.03 |
| 375 nm | 1% | 0.3390 | 0.3817 | 81.2 | 5065 | 0.29 |
| | 2% | 0.3855 | 0.4156 | 81.0 | 4029 | 0.29 |
| | 5% | 0.4217 | 0.4499 | 78.2 | 3559 | 0.27 |
| | 10% | 0.4377 | 0.4565 | 78.5 | 3346 | 0.25 |
| 385 nm | 1% | 0.2886 | 0.2603 | 76.1 | 9497 | 0.49 |
| | 2% | 0.3277 | 0.2955 | 79.0 | 5406 | 0.46 |
| | 5% | 0.3634 | 0.3407 | 80.5 | 4139 | 0.43 |
| | 10% | 0.3920 | 0.3675 | 81.1 | 3554 | 0.41 |

Results indicate that the excitation wavelength had a small effect on the emission properties of the devices. As the peak wavelength of the LED increased, more blue light was emitted by the LED, resulting in a cooler white color. This trend can be seen in Table 2, with higher color temperatures resulting from excitation with longer wavelength LEDs. In contrast, an increase in the concentration of nanocrystals in PFCB caused a small decrease in the amount of blue emission from the device, partly due to self absorption of the nanocrystals. This resulted in a warmer white color or lower color temperature at higher concentrations of nanocrystals in PFCB, also seen in Table 2. The luminous efficacy of the devices was similarly affected by these same factors. The level of UV light absorbance by the samples varies with wavelength as shown in FIG. 10, which causes a change in the amount of emission power and device efficiency depending on the peak wavelength of the LED. In the same way, the concentration of nanocrystals alters the efficiency of the samples. By adding more nanocrystals to the same amount of polymer, more UV light can be absorbed as well as emitted by the devices when their concentration is below 10%. In addition to the LED wavelength and concentration, the emission of the devices can be affected by the encapsulant material used. Some of the materials used had a large amount of emission in the visible spectrum and can cause the color emitted to become much more blue or yellow, depending on the encapsulant material. Though this effect can be undesirable since the nanocrystals emit white light on their own, this additional emission allows for tuning of the light to become cooler (more blue) or warmer (more yellow) in future applications. However, UV light absorbed by the encapsulant can affect the longevity of the encapsulant.

5. Surface Modification of Nanocrystals a. Phosphonic Acid Preparation

A Michaelis-Arbuzov reaction followed by acidic hydrolysis was used to synthesize the various phosphonic acids employed and is described briefly as follows (FIG. 13). [Engel, R., Synthesis of Carbon-Phosphorus Bonds. CRC Press, Inc.: Boca Raton, Fla., 1988; p 229.; Kosolapoff, G. M., Organophosphorus compounds. Wiley: New York, N.Y., 1950; p 376.] Molar equivalents of the bromoalkane of interest and TEP were refluxed at ~150° C. for at least 24 hours in order to ensure near complete $S_N2$ substitution. The reaction was considered complete when the evolution of bromoethane was no longer evident. In general, a slight yellow color in the reaction was also noted. The reaction mixture was cooled to 80° C., followed by the addition of 2.1 molar equivalents HCl. In a few cases a small amount of deionized water was added to the reaction mixture in order to increase the overall reaction volume. Post-hydrolysis, this excess water was removed via vacuum distillation. The reaction was then refluxed for at least 48 hours at 103° C.; in the cases of the longer chain phosphonic acids, solid product was noted falling out of solution upon completion of the hydrolysis. The reaction was then cooled, and the product phosphonic acid was recrystallized using acetonitrile, ethyl acetate, or hexanes. The crystals were collected via vacuum filtration, washed with cold solvent, and allowed to dry. The collected crystals were then placed under vacuum to remove any remaining solvent.

The purity of the phosphonic acid product was verified using nuclear magnetic resonance spectroscopy (NMR), infrared spectroscopy (IR), negative mode electrospray ionization mass spectrometry (ESI-MS), and melting point measurements (Supplemental information). Using negative mode ESI-MS for the phosphonic acids commonly gave dimer, trimer, and sodiated peaks in addition to the phosphonic acid minus one peak. The IR spectra of each phosphonic acid showed alkyl stretches corresponding to the carbon chain, P—O—H stretches in the 1040-910 $cm^{-1}$ region, P═O stretches in the 1200-1100 $cm^{-1}$ region, in addition to the 2350-2080, 1740-1600, and 1040-917 $cm^{-1}$ peak regions, common to all phosphonic acids. [Nakanishi, K.; Solomon, P. H., Infrared Absorption Spectroscopy. 2nd ed.; Holden-Day, Inc.: San Fancisco, Calif., 1977; p 287.; Nakamoto, K., Infrared and Raman Spectra of Inorganic and Coordination Compounds. John Wiley and Sons: New York, N.Y., 1978; p 448.; Gunzler, H.; Gremlich, H. U., IR Spectroscopy. Wiley, VCH: Weinheim, Germany, 2002; p 361.] Proton and carbon NMR spectra were consistent with the expected number, location, and integration of peaks.

b. Nanocrystal Preparation

Nanocrystals were synthesized with slight modifications to previously published syntheses. [Peng, Z. A.; Peng, X. G., Formation of high-quality CdTe, CdSe, and CdS nanocrystals using CdO as precursor. Journal of the American Chemical Society 2001, 123, (1), 183-184.; Bowers, M. J.; McBride, J. R.; Rosenthal, S. J., White-light emission from magic-sized cadmium selenide nanocrystals. Journal of the American Chemical Society 2005, 127, (44), 15378-15379.; Gosnell, J. D. et al., Eds. SPIE: 2006; p 63370A.] Since phosphonic acids have been found to be an impurity in tri-octyl phosphine oxide (TOPO), [Peng, X. G.; Manna, L.; Yang, W. D.; Wickham, J.; Scher, E.; Kadavanich, A.; Alivisatos, A. P., Shape control of CdSe nanocrystals. Nature 2000, 404, (6773), 59-61.] the synthesis was modified to use only HDA as the surfactant. In a three-neck, round bottom flask 10 g HDA, 1 mmol CdO, and 2 mmol phosphonic acid were heated to 145° C. under Ar purge. The flask contents were then heated to 325° C. under Ar with vigorous stirring. As the CdO and phosphonic acid converted to a Cd-phosphonate complex, the flask's contents became clear and colorless. After cooling to 310° C., 4 mL of a 0.2 M Se:TBP solution were quickly injected into the flask. To produce nanocrystals small enough to have band-edge absorption features less than 420 nm, this initial injection was rapidly followed by a second injection of 20 mL of butanol (kill-shot) to cool the reaction to ~130° C., followed by further cooling to below 100° C. using compressed air applied to the outside of the flask. [Bowers, M. J.; McBride, J. R.; Rosenthal, S. J., White-light emission from magic-sized cadmium selenide nanocrystals. Journal of the American Chemical Society 2005, 127, (44), 15378-15379.] For the larger nanocrystal sizes, the reaction was allowed to proceed until the desired size was achieved and subsequently cooled in the same way. Small aliquots (<500 μL) were taken from each reaction and diluted in toluene. These "dirty" nanocrystals were reserved for quantum yield (QY), UV-VIS absorption, and PL testing.

Unreacted precursor and solvents were removed from the nanocrystals via a three wash process. Initially, 15 mL of each reaction mixture was placed into a centrifuge tube and precipitated with methanol. The supernatant was discarded and the pellet was re-suspended in 8 mL of hexanol. This suspension was centrifuged in order to remove HDA and Cd-phosphonate. The supernatant (containing the nanocrystals) was then decanted into clean tubes, and the initial methanol/centrifugation step was repeated. The supernatant was again discarded and the nanocrystals suspended in toluene for further measurements, these nanocrystals hereafter will be referred to as "clean" nanocrystals.

c. Quantum Yield Determination

In order to determine the quantum yield of the nanocrystals synthesized, the emission of nanocrystals in toluene, dirty and clean, was compared to a standard dye. At nanocrystal sizes with band-edge absorption of 400-420 nm (ultrasmall nanocrystals), the nanocrystal solutions were diluted to have an absorption <0.1 at 375 nm. A solution of Coumarin 152A in hexanes (QY=1.00) [Bowers, M. J.; McBride, J. R.; Rosenthal, S. J., White-light emission from magic-sized cadmium selenide nanocrystals. Journal of the American Chemical Society 2005, 127, (44), 15378-15379.] [Nad, S.; Kumbhakar, M.; Pal, H., Photophysical properties of coumarin-152 and coumarin-481 dyes: Unusual behavior in nonpolar and in higher polarity solvents. Journal of Physical Chemistry A 2003, 107, (24), 4808-4816.] was diluted to the same optical density. Emission spectra were then collected of each solution using 375 nm as the excitation wavelength. For the ultrasmall nanocrystals, the emission intensity was integrated and compared to that of the Coumarin 152A solution. Larger nanocrystal sizes with band-edge absorption features from 540-570 nm were diluted to have an optical density <0.1 at 395 nm, the excitation wavelength used for the PL. These "traditional" nanocrystals were compared to a solution of Coumarin 503 in ethanol (QY=0.56). [Reynolds, G. A.; Drexhage, K. H., New Coumarin Dyes with Rigidized Structure for Flashlamp-Pumped Dye Lasers. Optics Communications 1975, 13, (3), 222-225.] The quantum yield of the nanocrystal solutions was then found using Equation 1:

$$QY_{NC}=\left(\frac{E_{NC}/A_{NC}}{E_{STD}/A_{STD}}\right)\times\left(\frac{(\eta_{NC})^2}{(\eta_{STD})^2}\right)\times QY_{STD} \quad (1)$$

In this equation $E_{NC}$ is the nanocrystals integrated emission intensity, $A_{NC}$ is the nanocrystals optical density at the excitation wavelength, $E_{STD}$ is the standard's integrated emission intensity, $A_{STD}$ is the standard's optical density at the excitation wavelength, $\eta_{NC}$ is toluene's refractive index, $\eta_{STD}$ the standard's solvent's refractive index, and $QY_{STD}$ is the standard's literature quantum yield. All QY measurements were performed on six different batches of nanocrystals for each phosphonic acid to ensure accuracy.

In order to monitor emission pinning and avoid slight batch-to-batch variations, an average of 21 batches per phosphonic acid were synthesized that had band-edge absorption features below 420 nm. Absorption and PL spectra were acquired for each batch and the data fit with a Gaussian curve to determine the center wavelength for the band-edge absorption and the highest energy emission feature.

d. Results and Discussion

Figure 14:
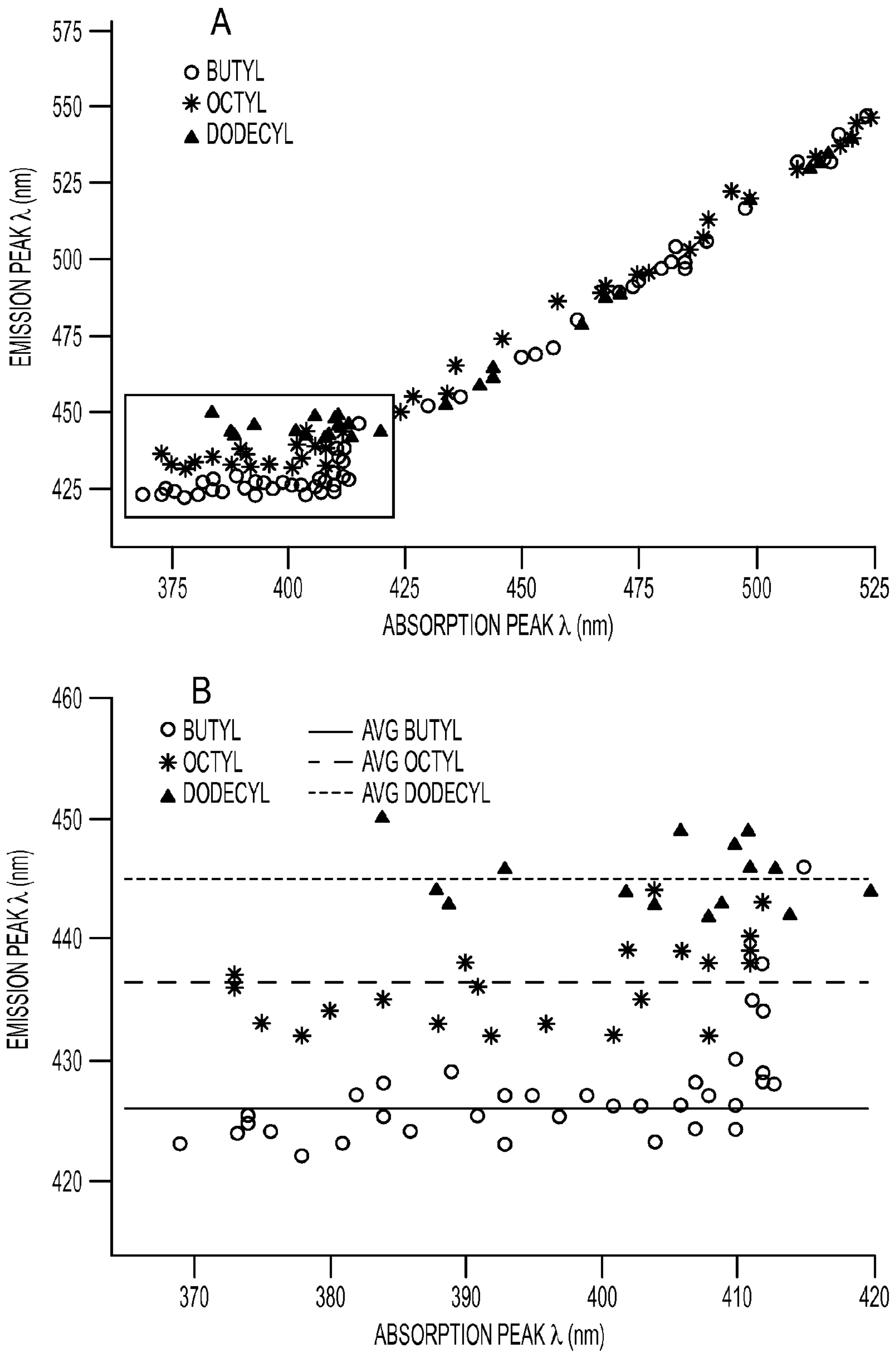
FIG. 14 shows the first emission feature λ vs. band-edge absorption feature λ. A) Traditional and pinned nanocrystal sizes; the boxed area is the pinned region. B) Enlarged area from A showing the pinned emission feature.

Initially seven phosphonic acids with unbranched alkyl chains (FIG. 13) were used to synthesize broad band-emitting nanocrystals. These early experiments were intended to show pinning of the emission of nanocrystals with diameters less than ~1.7 nm, using different phosphonic acids compared to the pinning previously seen with dodecyl phosphonic acid. [Dukes, A. D.; Schreuder, M. A.; Sammons, J. A.; McBride, J. R.; Smith, N. J.; Rosenthal, S. J., Pinned emission from ultrasmall cadmium selenide nanocrystals. Journal of Chemical Physics 2008, 129, (12).] Plotting the wavelength of the first emission feature vs. the wavelength of the band-edge absorption clearly showed a region of pinned emission (FIG. 14). It is important to note the slope change from the traditional size regime of nanocrystals (>1.7 nm) to the ultrasmall nanocrystals. In the traditional nanocrystal sizes the emission red-shifts with red-shifting band-edge absorption and increasing diameter. For the ultrasmall nanocrystals, the different sizes do not show a change in the wavelength of the emission from the highest energy trap state, despite changes in the wavelength of the band-edge absorption feature. [Dukes, A. D.; Schreuder, M. A.; Sammons, J. A.; McBride, J. R.; Smith, N. J.; Rosenthal, S. J., Pinned emission from ultrasmall cadmium selenide nanocrystals. Journal of Chemical Physics 2008, 129, (12).] The average and standard deviation for the wavelength at which the first emission feature was located were obtained for each set of nanocrystal batches made with different phosphonic acids.

It was noted during the synthesis that it was possible to make the smallest nanocrystals, as determined using Peng et al.'s nanocrystal sizing equations, [Yu, W. W.; Qu, L. H.; Guo, W. Z.; Peng, X. G., Experimental determination of the extinction coefficient of CdTe, CdSe, and CdS nanocrystals. Chemistry of Materials 2003, 15, (14), 2854-2860.] with the shortest chain phosphonic acid. Table 3 lists the shortest wavelength absorption feature achieved with each phosphonic acid. These smallest sizes for each phosphonic acid were achieved by reducing the time between the Se:TBP injection and the "kill-shot" described previously. The time between the injections was approximately the same (~1 second) for all the smallest sizes, yet different sizes of nanocrystals were achieved. This trend indicated that the shorter the alkyl chain on the phosphonic acid, the slower the reaction would proceed. The slower reaction kinetics allowed for smaller sizes to be obtained using the short chain phosphonic acids than were achievable with the longer alkyl chains.

TABLE 3

Shortest wavelength band-edge absorption obtained for each phosphonic acid

| Phosphonic acid name | Bluest λ band-edge absorption obtained (nm) |
|---|---|
| Butyl PA | 359 |
| Hexyl PA | 371 |
| Octyl PA | 373 |
| Decyl PA | 376 |
| Dodecyl PA | 384 |
| Hexadecyl PA | 395 |
| Docosyl PA | 392 |
| 2-ethyl,hexyl PA (2-EHPA) | 378 |
| 3-methyl,butyl PA (3-MBPA) | 371 |
| Phenyl PA | 374 |
| 3-phenyl,propyl PA (3-PPPA) | 376 |

The growth kinetics of the CdSe nanocrystals depend on the reactivity of the Cd and Se precursors. [Peng, Z. A.; Peng, X. G., Nearly monodisperse and shape-controlled CdSe nanocrystals via alternative routes: Nucleation and growth. Journal of the American Chemical Society 2002, 124, (13), 3343-3353.; Qu, L. H.; Yu, W. W.; Peng, X. P., In situ observation of the nucleation and growth of CdSe nanocrystals. Nano Letters 2004, 4, (3), 465-469.] Intuitively, the rate at which Cd atoms are added to the initial nanocrystal seeds is dependent on the rate the Cd-phosphonate can be separated, generating a reactive Cd species; this rate should depend on the strength of the Cd—O—P bond. Accordingly, it was hypothesized that the shorter ligands would bind the strongest to Cd in the Cd-phosphonate precursor and to the nanocrystal surface.

Figure 15:
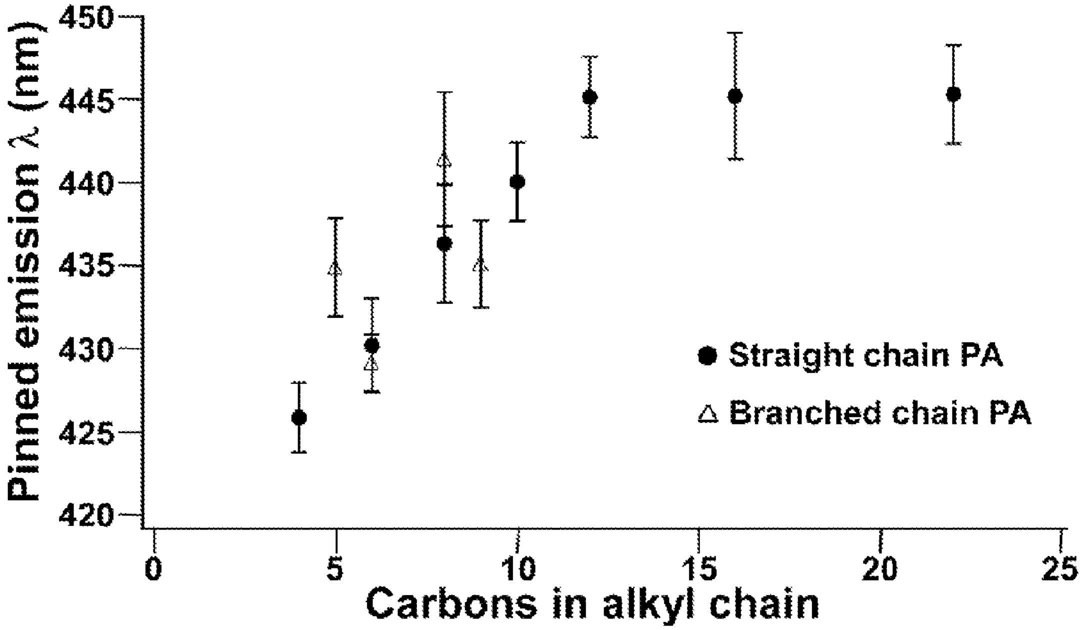
FIG. 15 shows the wavelength of pinned first emission feature vs. number of carbons in the alkyl chain of the phosphonic acid used during synthesis.

In addition to influencing the nanocrystal growth kinetics, one would expect the Cd—O—P bond would affect the energy of a Cd surface trap state. In a previous study, Whaley et al. calculated that the density of states for the Cd rich surface of a nanocrystal would be affected by the bonding of the Cd atoms on that surface, including any dangling orbitals (Cd surface trap sites). [Hill, N. A.; Whaley, K. B., A Theoretical-Study of the Influence of the Surface on the Electronic-Structure of Cdse Nanoclusters. Journal of Chemical Physics 1994, 100, (4), 2831-2837.] The trend that was observed in the current experiments was that the shorter alkyl phosphonic acids blue-shift one of the emission features. This trend was seen after locating the shortest wavelength (highest energy) emission feature of the white-light emitting nanocrystals for each of the phosphonic acids (FIG. 15). Each of these ligands gives a statistically (99% confidence level) different emission wavelength, except dodecyl, hexadecyl, and docosyl phosphonic acid. These three phosphonic acid ligands give the nanocrystals' a statistically similar emission feature, and by association the same emission energy level. This is not surprising since an energetic difference seen between chain lengths of 12, 16, or 22 carbons would indicate the trap-states interact with atoms through more than 14 bonds. Although, any trend past 3 bonds is surprising in and of itself.

Four branched chain phosphonic acids were also evaluated. The pinning results from these phosphonic acids indicated that it is not only the number of carbons in the alkyl chain that is important; the arrangement of these carbons also has an influence on the wavelength of the light emitted from the nanocrystals. Table 4 illustrates the pinned wavelengths for all the phosphonic acids tested. Of particular note, although 3-methyl, butyl PA, octyl PA, and 3-phenyl, propyl PA all have different numbers of carbons in their alkyl chain, the wavelength of the pinned emission they cause are indistinguishable.

TABLE 4

Pinned emission λ of nanocrystals made with each phosphonic acid

| Phosphonic acid | Emission λ (nm) |
|---|---|
| Butyl PA | 425.8 ± 2.1 |
| Hexyl PA | 430.2 ± 2.8 |
| Octyl PA | 436.3 ± 3.5 |
| Decyl PA | 440.0 ± 2.3 |
| Dodecyl PA | 445.1 ± 2.4 |
| Hexadecyl PA | 445.1 ± 3.8 |
| Docosyl PA | 445.2 ± 2.9 |
| 2-EHPA | 441.3 ± 4.0 |
| 3-MBPA | 434.8 ± 2.9 |
| Phenyl PA | 429.1 ± 1.7 |
| 3-PPPA | 435.1 ± 2.6 |

Figure 16:
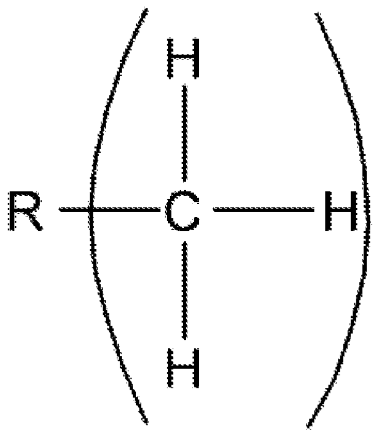
FIG. 16 shows the chemical structures and the corresponding calculated grouped electronegativities for each structure.
Figure 16:
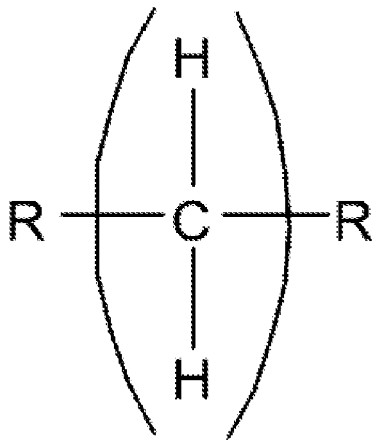
Figure 16:
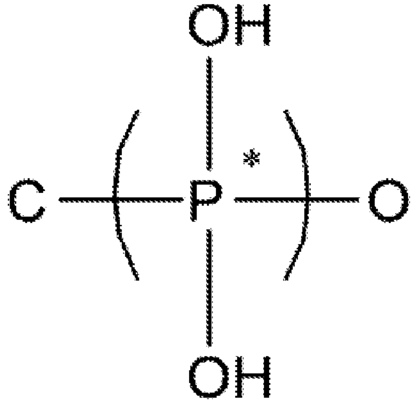
Figure 16:
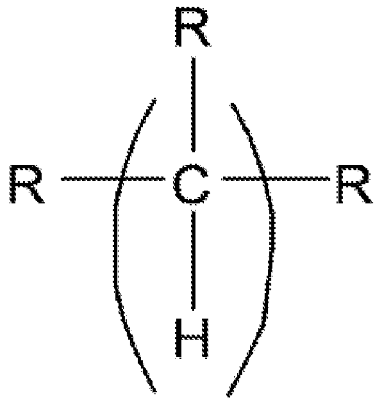
Figure 16:
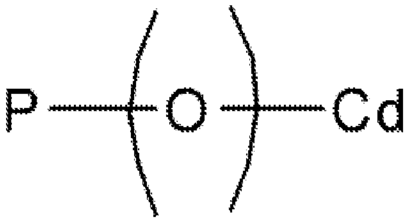
Figure 16:
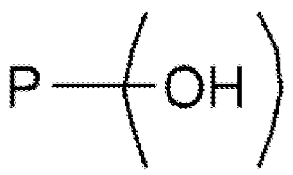

Without wishing to be bound by theory, the effect seen in the optical properties of ultrasmall nanocrystals is believed to be a consequence of electronegativity. The electronegativity of individual atoms affects the strength of bonds between atoms. In addition, the electronegativity of individual atoms is influenced by the atoms that surround the atom of interest. This theory of electronegativity modification is known as inductive electronegativity and is a large factor in many analytical measurements, such shielding and de-shielding in NMR spectroscopy. [Jacobsen, N. E., NMR Spectroscopy explained: simplified theory, applications, and examples for organic chemistry and structural biology. Wiley-Interscience: Hoboken, N.J., 2007; p 668.; Kemp, W., Organic Spectroscopy. 2nd ed.; Macmillan: 1987; p 299.] Using Bratsch's "Group Electronegativity Method," [Bratsch, S. G., A Group Electronegativity Method with Pauling Units. Journal of Chemical Education 1985, 62, (2), 101-103.] the electronegativity of each phosphonic acid with an attached Cd was determined. First, the ligands were broken into groups of ethyl carbons, methyl carbons, branched carbons, hydroxyl groups, phosphorous atoms, and single oxygens (FIG. 16). The electronegativity ($X_G$) was calculated for each of these groups using Equation 2, where $N_G$ is the number of atoms in the group, ν is the number of a specific type of atom, and χ is the electronegativity of each atom in Pauling units. The individual group electronegativities were then combined using Equation 3 to determine the ligand's overall equalized electronegativity ($X_{eq}$), where N is the total number of atoms and $N_G$ is the number of atoms in each group.

$$X_G = \frac{N_G}{\sum \frac{v}{x}} \quad (2)$$

$$X_{eq} = \frac{N}{\sum \frac{N_G}{X_G}} \quad (3)$$

Figure 17:
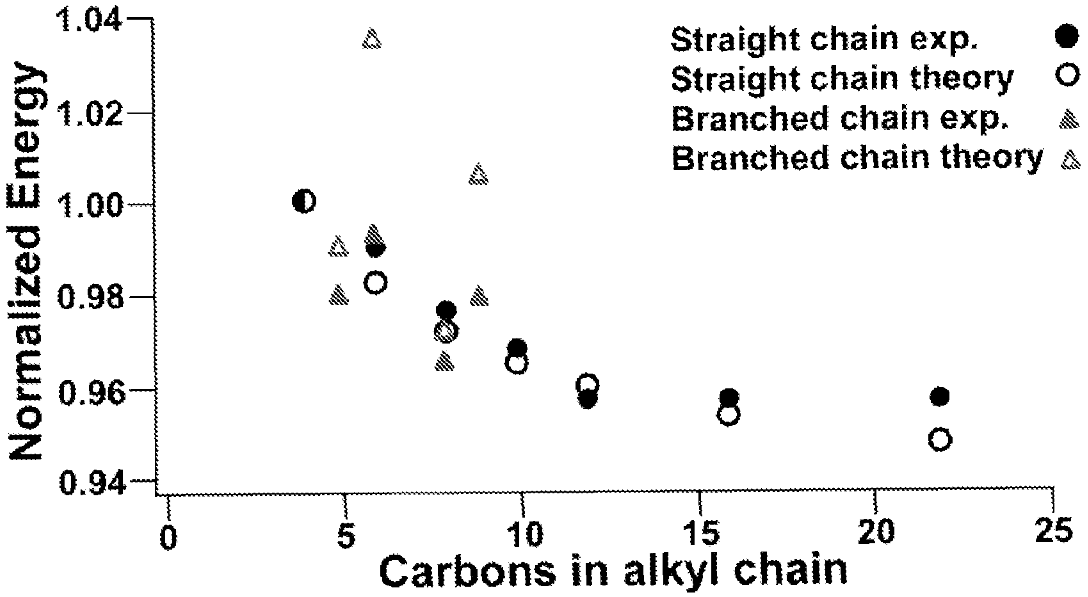
FIG. 17 shows the normalized energy of pinned emission feature and electronegativity of each phosphonic acid vs. number of carbons in the alkyl chain. The experimental and theoretical values are normalized to the respective butyl phosphonic acid energies of each set.

Inductive electronegativity generally is not thought to have an effect on atoms more than a few bonds away. However, for electron traps on surface Cd atoms affected by the phosphonic acid ligand, this does seem to be the case. When the experimental data set and theoretical data set were normalized to the each set's respective butyl PA ligand energy and setting this value to one, this theoretical data matched up well with the experimental emission data for the straight chain ligands and two branched chain ligands (FIG. 17). For the two ligands tested that included phenyl groups, this theoretical treatment did not yield consistent results, in all likelihood due to the conjugation in the ligand's alkyl chain.

The pinned emission peak in these broad band-emitting nanocrystals is believed to be due to trap state emission. [Bowers, M. J.; McBride, J. R.; Rosenthal, S. J., White-light emission from magic-sized cadmium selenide nanocrystals. Journal of the American Chemical Society 2005, 127, (44), 15378-15379.; Dukes, A. D.; Schreuder, M. A.; Sammons, J. A.; McBride, J. R.; Smith, N. J.; Rosenthal, S. J., Pinned emission from ultrasmall cadmium selenide nanocrystals. Journal of Chemical Physics 2008, 129, (12).] Previously, surface cadmiums have been suggested as electron traps in nanocrystals. [Lifshitz, E.; Dag, I.; Litvitn, I. D.; Hodes, G., Optically detected magnetic resonance study of electron/hole traps on CdSe quantum dot surfaces. Journal of Physical Chemistry B 1998, 102, (46), 9245-9250.; Chestnoy, N.; Harris, T. D.; Hull, R.; Brus, L. E., Luminescence and Photophysics of Cds Semiconductor Clusters—the Nature of the Emitting Electronic State. Journal of Physical Chemistry 1986, 90, (15), 3393-3399.] Additionally, it has been shown that the trapping of charge carriers can cause emission from discrete energy states. [Lifshitz, E.; Dag, I.; Litvitn, I. D.; Hodes, G., Optically detected magnetic resonance study of electron/hole traps on CdSe quantum dot surfaces. Journal of Physical Chemistry B 1998, 102, (46), 9245-9250.; Chestnoy, N.; Harris, T. D.; Hull, R.; Brus, L. E., Luminescence and Photophysics of Cds Semiconductor Clusters—the Nature of the Emitting Electronic State. Journal of Physical Chemistry 1986, 90, (15), 3393-3399.; Lifshitz, E.; Dag, I.; Litvin, I.; Hodes, G.; Gorer, S.; Reisfeld, R.; Zelner, M.; Minti, H., Properties of CdSe nanoparticle films prepared by chemical deposition and sol-gel methods. Chemical Physics Letters 1998, 288, (2-4), 188-196.; Underwood, D. F.; Kippeny, T.; Rosenthal, S. J., Ultrafast carrier dynamics in CdSe nanocrystals determined by femtosecond fluorescence upconversion spectroscopy. Journal of Physical Chemistry B 2001, 105, (2), 436-443.] The trapping energy of an electron on a surface Cd will be affected by the available orbitals and the electron density around the nucleus. [Hill, N. A.; Whaley, K. B., A Theoretical-Study of the Influence of the Surface on the Electronic-Structure of Cdse Nanoclusters. Journal of Chemical Physics 1994, 100, (4), 2831-2837.; Hill, N. A.; Whaley, B., Electronic-Structure of Semiconductor Nanoclusters—a Time-Dependent Theoretical Approach. Journal of Chemical Physics 1993, 99, (5), 3707-3715.] The electron density around a surface Cd will vary depending on the electron-donating or electron-withdrawing nature of any molecules bound to it. Accordingly, the difference in electronegativity of the phosphonic acids would explain the change in emission wavelength seen in these ultrasmall nanocrystals (FIG. 17). Experimentally, it appears that shorter alkane chain lengths cause higher energy emissions, due to the increased electron withdrawing nature of these ligands exerted on the Cd's adjacent dangling bond, previously suggested as being an electron trap. [Hill, N. A.; Whaley, K. B., A Theoretical-Study of the Influence of the Surface on the Electronic-Structure of Cdse Nanoclusters. Journal of Chemical Physics 1994, 100, (4), 2831-2837.; Lifshitz, E.; Dag, I.; Litvitn, I. D.; Hodes, G., Optically detected magnetic resonance study of electron/hole traps on CdSe quantum dot surfaces. Journal of Physical Chemistry B 1998, 102, (46), 9245-9250.; Klimov, V. I.; McBranch, D. W.; Leatherdale, C. A.; Bawendi, M. G., Electron and hole relaxation pathways in semiconductor quantum dots. Physical Review B 1999, 60, (19), 13740-13749.; Gomez, D. E.; van Embden, J.; Jasieniak, J.; Smith, T. A.; Mulvaney, P., Blinking and surface chemistry of single CdSe nanocrystals. Small 2006, 2, 204-208.]

Figure 18:
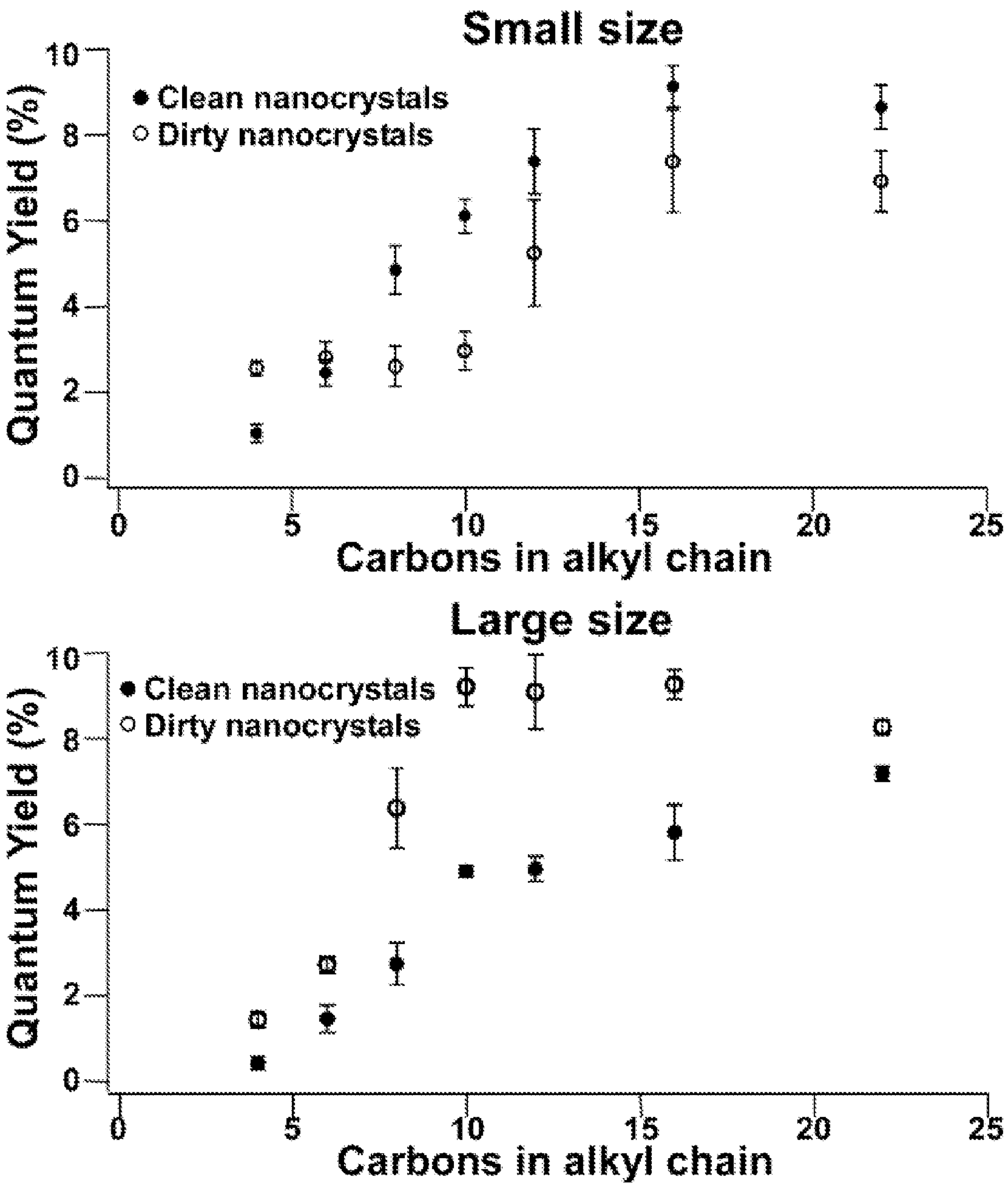
FIG. 18 shows the quantum yield of dirty and clean nanocrystals: (top) ultrasmall size and (bottom) traditional size regime. Clean and dirty refer to nanocrystal before and after the cleaning process.

In addition to altering the emission wavelength of the ultrasmall nanocrystals, the phosphonic acid ligand on the surface affected the QY (FIG. 18, Table 5). Initially, the QY changes with phosphonic acid were believed to be due only to the cleaning process, used to separate the nanocrystals from the coordinating solvent and precursors. However, it was noted that a similar trend was seen in "dirty" and "clean" nanocrystals when using the straight alkyl chain ligands. The branched and phenyl ring containing ligands did not fit into this trend once cleaned (Table 5). This could be explained by the conjugation in the chain, the cleaning process removing these ligands, or the steric size of these phosphonic acids reducing the surface coverage as compared with the straight chain ligands. It should be noted that the ligand's steric size is a possible cause for the QY effects, but is not likely to be the cause of the energetic differences, as discussed below.

TABLE 5

QY of nanocrystal's synthesized with each phosphonic acid

| Phosphonic acid | QY of small, dirty nanocrystals (%) | QY of small, clean nanocrystals (%) | QY of large, dirty nanocrystals (%) | QY of large, clean nanocrystals (%) |
|---|---|---|---|---|
| Butyl PA | 2.54 ± 0.17 | 1.03 ± 0.21 | 1.37 ± 0.18 | 0.37 ± 0.15 |
| Hexyl PA | 2.80 ± 0.37 | 2.44 ± 0.31 | 2.68 ± 0.19 | 1.40 ± 0.32 |
| Octyl PA | 2.59 ± 0.47 | 4.84 ± 0.56 | 6.35 ± 0.94 | 2.70 ± 0.50 |
| Decyl PA | 2.96 ± 0.45 | 6.10 ± 0.40 | 9.20 ± 0.45 | 4.88 ± 0.14 |
| Dodecyl PA | 5.24 ± 1.24 | 7.37 ± 0.76 | 9.08 ± 0.88 | 4.93 ± 0.29 |
| Hexadecyl PA | 7.37 ± 1.19 | 9.12 ± 0.50 | 9.26 ± 0.35 | 5.79 ± 0.66 |
| Docosyl PA | 6.91 ± 0.71 | 8.64 ± 0.51 | 8.25 ± 0.18 | 7.18 ± 0.18 |
| 2-EHPA | 3.18 ± 0.83 | 3.98 ± 0.99 | 10.17 ± 1.09 | 9.14 ± 1.74 |
| 3-MBPA | 5.00 ± 1.18 | 0.75 ± 0.59 | 3.91 ± 0.69 | 2.55 ± 0.39 |
| Phenyl PA | 2.95 ± 0.34 | 0.50 ± 0.29 | 2.21 ± 0.44 | 1.32 ± 0.35 |
| 3-PPPA | 2.45 ± 0.77 | 0.22 ± 0.05 | 5.47 ± 0.94 | 0.38 ± 0.17 |

Nanocrystals in the traditional size regime (>1.7 nm) made with each phosphonic acid demonstrated the known trend of longer emission wavelength with increased diameter. However, for these nanocrystals, a similar trend in the QY was seen with the straight chain phosphonic acids as in the small nanocrystals (FIG. 18, Table 5). Once again, the branched and phenyl containing ligands did not fit with the rest of the data.

The quantum yield is most likely impacted by the physical nature of the ligands rather than the electronic properties. For the traditional size regime, the nanocrystals have a lower QY when cleaned because some of the ligands are removed, decreasing the surface passivation and increasing the dangling bonds that trap charges. Since the emission in this size regime is mainly from band-edge recombination, this leads to a decrease in the QY. The increased QY caused by longer chain phosphonic acids could be due to these longer chains passivating of any surface states with portions of the alkyl ligand chain. [Berrettini, M. G.; Braun, G.; Hu, J. G.; Strouse, G. F., NMR analysis of surfaces and interfaces in 2-nm CdSe. Journal of the American Chemical Society 2004, 126, (22), 7063-7070.; Garrett, M. D. et al., Band edge recombination in CdSe, CdS and CdSxSel-x alloy nanocrystals observed by ultrafast fluorescence upconversion: The effect of surface trap states. Journal of Physical Chemistry C 2008, 112, (33), 12736-12746.] For the ultrasmall sizes, the cleaned nanocrystals exhibit a higher quantum yield due to the removal of ligands during the cleaning process, creating more emission trap states. The low QY caused by the shorter chain phosphonic acids may be due to the stronger bond that shorter chains have with Cd, consequently they are less likely to be removed, preventing trap states from being created.

Solvation dynamics and ligand steric were discarded as sources of the emission changes. If the emission changes were due to the solvation dynamics of the various ligands, then changing the nanocrystals to various solvents would change the wavelength at which the ultrasmall nanocrystals were pinned. When the nanocrystal emission was analyzed in hexanes, toluene, mesitylene, and chloroform the emission peak wavelengths were unchanged. Considering the data presented in Table 4 and FIG. 15, allowed for the elimination of steric considerations. Assuming that the steric size of the ligand is the most important factor in determining the location of the first peak, the most bulky ligand is phenyl phosphonic acid and butyl phosphonic acid is the smallest ligand. This should put the phenyl phosphonic acid nanocrystals on one edge of the pinning data, with lessening steric size down to butyl phosphonic acid nanocrystals at the other extreme. However, the phenyl nanocrystals had a pinned wavelength at ~430 nm, almost the exact middle of the data.

These ultrasmall nanocrystals likely consist of less than 25 Cd—Se pairs. At this small size, it is possible that the phosphonic acids not only affect the kinetics of the growth reaction, but also influences the crystal structure. Without wishing to be bound by theory, it is believed that a change in the crystal structure is a potential cause for the modulated emission shown here; although is less likely due to the ligand exchange data previously presented. [Dukes, A. D.; Schreuder, M. A.; Sammons, J. A.; McBride, J. R.; Smith, N. J.; Rosenthal, S. J., Pinned emission from ultrasmall cadmium selenide nanocrystals. Journal of Chemical Physics 2008, 129, (12).]

e. Conclusions

The emission of ultrasmall CdSe nanocrystals was shown to be pinned at different wavelengths depending on the phosphonic acid used during synthesis. For straight chain phosphonic acids, longer alkyl chains pinned the bluest emission feature at longer wavelengths than shorter chains. Surprisingly, the energy changes are shown to correlate with the electronegativity of the phosphonic acid ligands. In addition to shifting the wavelength of the pinned emission, these ligands are shown to influence the quantum yield of nanocrystals in both the ultrasmall and traditional size regime. The quantum yield for such white-light emitting nanocrystals can be increased to about 10%, or even higher.

This new size regime of ultrasmall nanocrystals has stimulated the idea that the nanocrystal and ligands may no longer be considered separately. At the sizes studied here, the ligand has become essential to the overall crystal's optical properties. This recognition requires a shift in thinking and experimentation. At this ultrasmall size, each atom becomes increasingly important regardless of whether it is part of the inner crystal, the nanocrystal surface, or the ligands. Further knowledge, along with controlling the placement of atoms at specific locations in these small crystals will allow for precise alteration of many of the physical, electronic, and optical properties of these nanocrystals. An advantage of utilizing the electronegativity effect is that it allows for the fine-tuning of the white-light emission from these nanocrystals.

6. Example Preparation of Nanocrystals with Phosphonic Acid Ligands a. Synthesis In a three-neck, round bottom flask 10 g hexadecylamine, 1 mmol CdO, and 2 mmol of hexadecyl phosphonic acid were heated to 145° C. under Ar purge. The flask contents were then heated to 325° C. under Ar with vigorous stirring. As the CdO and phosphonic acid converted to a Cd-phosphonate complex, the flask's contents became clear and colorless. After cooling to 310° C., 4 mL of a 0.2 M Se:tri-butyl phosphine solution were quickly injected into the flask. To produce nanocrystals small enough to have band-edge absorption features less than 420 nm, this initial injection was rapidly followed by a second injection of 20 mL of butanol ("kill-shot") to cool the reaction to ~130° C., followed by further cooling to below 100° C. using compressed air applied to the outside of the flask.

Unreacted precursor and solvents were removed from the nanocrystals via a three wash process. Initially, 15 mL of each reaction mixture was placed into a centrifuge tube and precipitated with methanol. The supernatant was discarded and the pellet was resuspended in 8 mL of hexanol. This suspension was centrifuged in order to remove HDA and Cd-phosphonate. The supernatant (containing the nanocrystals) was then decanted into clean tubes, and the initial methanol/centrifugation step was repeated. The supernatant was again discarded and the nanocrystals suspended in toluene for further treatments.

b. Post-Cleaning Treatment

About 125 mL of a 10 μM ultrasmall nanocrystal solution and a molar excess (2.5 mmol) of Zn acetate were added to a round bottom flask. While stirring this solution was heated at 60° C. for 15 minutes. The solution was cooled and a majority of the toluene was removed in vacuo (rotary evaporator). The remaining solution was divided into centrifuge tubes and these were filled with methanol. After centrifugation, the nanocrystals were re-suspended in toluene for analysis.

c. Results

The nanocrystals post-synthesis had an average quantum yield of 7.4%, which increased up to 9.2% after the initial cleaning process. The post-cleaning treatment described above has been shown to increase the quantum yield by as much as 80%, or yielding nanocrystals with a quantum yield of nearly 17%. Some other metal acetate treatments (Cd and Mn acetate) increased the quantum yield, while others (Pb and Hg acetate) decreased the quantum yield of these ultrasmall nanocrystals; however, Zn acetate showed the largest increase.

Additional examples were performed by using the disclosed post-treatment procedures. In certains aspects, formic acid caused the greatest overall increase in quantum yield compared to the other straight-chain carboxylic acids. The average post-treatment quantum yields from original nanocrystals (~8%) were as follows: formic 31±6.4% (n=31), acetic 19±2.5% (n=19), hexanoic 15±1.4% (n=2), octanoic 18±1.3% (n=2), and oleic 10% (n=1), wherein "n" is the number of experiments/iterations. Without wishing to be bound by theory, it is believed that this effect may be due to the shorter carbon chain length.

7. Example Approach for Enhancement of Light Emission Quantum Yield In Ultrasmall Broad Emission Spectrum Nanocrystals a. Synthesis In additional or alternative aspects of the subject disclosure, for the synthesis of ultrasmall white light-emitting CdSe nanocrystals, 4.000 g hexadecylamine (HDA, 90% technical grade), 6.000 g tri-n-octylphosphine oxide (TOPO, 90% technical grade), 0.500 g dodecylphosphonic acid (DPA), and 0.128 g (1 mmol) cadmium oxide (CdO) were combined in a 100 mL three-neck, round-bottom flask on a stir-plate with a heating mantle. Combination of such reagents form a reaction solution. A temperature probe was inserted into a first neck of the flask, and a second neck was closed with a rubber septum. The center of the flask was attached to a self-washing bump trap, with argon gas flowing through the flask to purge and maintain an inert or substantially inert atmosphere. A purge needle provided, at least in part, a flow or amount of the argon gas. The reaction solution was heated to 330° C. after the purge needle was removed at 150° C. In response to the reaction solution changing from brown to clear and colorless, about 5 mL of 0.2 M selenium tributylphosphine solution (Se:TBP) was provided (e.g., injected) with a 12-gauge needle through the rubber septum into the reaction solution. After about four to seven seconds after adding the Se:TBP, 20 mL butanol was provided (e.g., injected) with an 18-gauge needle. The flask was substantially immediately cooled to 88° C. to prevent further growth the nanocrystals. Time elapsed prior to addition of Se:TBP, 20 mL butanol is determined by the observed color of reaction solution. That is, for example, the alcohol solution can be added at the first appearance of a yellow color in the reaction solution. Such addition, in one aspect, also can have the effect of precipitating the nanocrystals. Synthesis process described herein can be scaled to produce larger or smaller quantities of nanocrystal.

Unreacted precursor and solvents were removed from the synthesized ultrasmall white light-emitting CdSe nanocrystals. In an aspect, nanocrystals were precipitated with methanol in four 50 mL centrifuge tubes, and collected by centrifugation at 6000 rpm for three minutes. The nanocrystal pellets were dried in the centrifuge tubes and then redispersed in about 6 mL of hexanol and centrifuged at 6000 rpm for 20 min. The supernatant containing the nanocrystals was then decanted into clean tubes, precipitated with methanol, and collected by centrifugation at 6000 rpm for 20 min. The final solid nanocrystals, referred to as "clean" nanocrystals, "as prepared" nanocrystals, or "as synthesized nanocrystals," were dried, dissolved in toluene, and stored in the dark.

It should be appreciated that through utilization of suitable precursor and reagents, as it would be readily apparent to one of ordinary skill in the art of quantum dot preparation and synthesis, the foregoing synthesis process can be applied to preparation of nanoparticles or nanocrystals comprising a first plurality of atoms from group II crystallized with a second plurality of atoms from group VI.

b. Characterization

Figure 19:
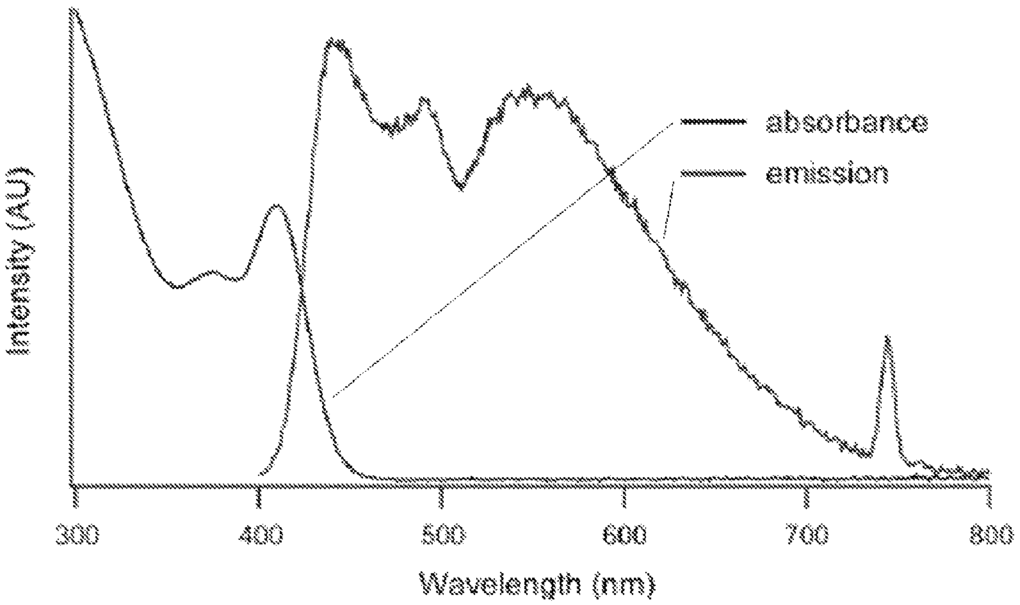
FIG. 19 illustrates example spectra of light absorbance (blue curve) and light emission (red curve) in CdSe nanocrystals synthesized in accordance with aspects of the subject disclosure.

Light absorption and emission spectra for white-light CdSe nanocrystals synthesized in accordance with aspects of the subject disclosure are shown in FIG. 19. Spectral intensities in the illustrated spectra are normalized. The CdSe nanocrystals present a band edge (e.g., gap) at about 409 nm. Emission spectra exhibits three distinctive features (e.g., peaks) at wavelengths of about 440 nm, 488 nm, and 550 nm, extending over the visible spectrum of electromagnetic radiation. Without wishing to be bound by theory or modeling, the first feature (e.g., peak) at about 440 nm generally is related to light emission aspects of surface-passivating phosphonic acid ligands. For CdSe nanocrystal with characteristic size of about 1.7 nm or less, such features appear to be pinned at about 440 nm, rather than blue-shifting with decreasing nanocrystal size (e.g., diameter size). Accordingly, and again without wishing to be bound by theory or modeling, such first feature in the emission spectrum of CdSe nanocrystals is believed to be a direct result of presence of the phosphonic acid ligands coupled (e.g., bonded or attached) to the surface of such nanocrystals. It is noted that such first feature is absent when a ligand different from phosphonic acid is employed in the synthesis of the CdSe nanocrystals. It is also noted that such first feature shifts spectrally in response to changes in length of the alkyl chain of the phosphonic acid ligand.). [A. D. Dukes III, M. A. Schreuder, J. A. Sammons, J. R. McBride, N. J. Smith, and S. J. Rosenthal, *J. Chem. Phys.,* 2008, 129, 121102. M. A. Schreuder, J. R. McBride, A. D. Dukes III, J. A. Sammons, and S. J. Rosenthal, *J. Phys. Chem. C,* 2009, 113, 8169-8176.] Regarding the second feature at about 488 nm, its origin remains marginally understood. However, without wishing to be bound by theory or modeling, it has been conjectured that such second feature originates from optical transitions related to electronic energy structure of surface states at the Se atoms present in the CdSe nanocrystals. In connection with the third feature at about 550 nm, and without intending to be bound by theory or modeling, it is believed to originate from optical transitions amongst deep trap states. [A. D. Dukes III, M. A. Schreuder, J. A. Sammons, J. R. McBride, N. J. Smith, and S. J. Rosenthal, *J. Chem. Phys.,* 2008, 129, 121102. M. J. Bowers II, J. R. McBride, and S. J. Rosenthal, *J. Am. Chem. Soc.,* 2005, 127, 15378-15379.] As illustrated, a fourth feature is prominent at about 750 nm. Such feature is a second order diffraction peak originating from the measurement instrument (e.g., diffraction grating in a fluorometer.)

Quantum yield of light emission for the CdSe nanocrystal producing the emission spectrum illustrated in FIG. 19 is about 8.2%. CIE coordinates associated with the illustrated emission spectrum are about (0.302, 0.337).

c. Treatment with Organocarboxylate Agent

In the subject disclosure, synthesized or otherwise obtained broad emission spectrum nanocrystals are treated with an organocarboxylate agent (e.g., formic acid). To at least such end, in certain embodiments, about 0.3 to about 1 mM solution of nanocrystals in toluene (e.g., about 3-10 mL) was added to a 50 mL three-neck, round-bottom flask. The flask was fitted with a heating mantle and temperature probe on a stir-plate while leaving two necks of the flask open. The organocarboxylate agent (e.g., formic acid) was added to the solution containing the nanocrystals in a 30,000 molar excess via syringe injection to the flask at substantially the same time that the heating started. The solution was heated from room temperature (generally considered to be about 21° C. to about 24° C.) to 60° C. in five to six minutes. Upon or after reaching a temperature of about 60° C., the flask was substantially immediately removed from heat and cooled with compressed air to a temperature of about 28° C. while still stirring. The resulting cloudy yellow solution was transferred to a glass vial and centrifuged at 2500 rpm for about 15 minutes (min) to separate excess amounts of organocarboxylate agent (e.g., formic acid) from the treated nanocrystals in toluene. In an aspect, the top or substantially the top nanocrystal layer was then transferred to 2 mL microtubes and centrifuged at about 15500 rpm for about 15 min to remove further excess amounts of organocarboxylate agent (e.g., formic acid).

Synthesis and treatment of nanocrystals in accordance with various aspects of the subject disclosure provide an approach to enhancing quantum yield of light emission (e.g., photoluminescence) of ultrasmall nanocrystals, e.g., nanocrystals with typical size below about 3.0 nm. In certain embodiments, such systematic approach includes an example method of increasing photoluminescence quantum yield, the method comprising the steps of: (a) providing a nanocrystal comprising a first plurality of atoms from group II and a second plurality of atoms from group VI; and (b) treating the nanocrystal with a molar excess of one or more organocarboxylate agents for a time period and at a temperature sufficient to increase nanocrystal photoluminescence quantum yield, compared with the nanocrystal before treatment. The molar excess can be regulated and can be is at least ten-fold, at least hundred-fold, or at least thousand-fold. In additional or alternative embodiments, the example method also can comprise excluding at least one of lauric acid, oxalic acid, or maleic acid. Moreover, in yet additional or alternative embodiments, the example method can comprise excluding lauric acid, oxalic acid, and maleic acid. In certain implementations, the method can comprise excluding stearic acid.

The nanocrystal generally is magic-sized and embodies a broad emission quantum dot. Moreover, the nanocrystal generally is ultrasmall and thus has at least one dimension smaller than about 3.0 nm. Yet, in additional or alternative aspects, all dimensions of the nanocrystal are less than about 3.0 nm. The group II atoms can be selected from cadmium and zinc, and the group VI atoms can be selected from selenium and sulfur. Moreover, the nanocrystal comprises cadmium, selenium, and cadmium crystallized with selenium. In scenarios in which the nanocrystal comprises comprises cadmium crystallized with selenium, the nanocrystal and can have has at least one dimension smaller than about 3.0 nm. In addition, all dimensions of such nanocrystal can be less than about 3.0 nm.

In an aspect, an organocarboxylate agent is a carboxylic acid or conjugate base thereof, wherein the carboxylic acid can be selected from formic acid, acetic acid, hexanoic acid, octanoic acid, oleic acid, and benzoic acid. In addition, the conjugate base can be a salt selected from sodium, potassium, calcium, cadmiu, lead, manganese, mercury, and zinc of the carboxylic acid selected from formic acid, the acetic acid, hexanoic acid, octanoic acid, oleic acid, and benzoic acid. In another aspect, the organocarboxylate agent is formic acid or a salt thereof. It is noted that aqueous acids and solid acids can be employed in the treating step.

Treating the nanocrystal in the example method for enhancing quantum yield of light emission is directed primarily, yet not exclusively, to coat the nanocrystal with ligands. In an aspect, the treating step can comprise coating at least a portion of the nanocrystal with the organocarboxylate agent. In certain implementations, the treating step is performed for a time period of at least about five minutes at a temperature of about 60° C. In additional or alternative implementations, the treating step can comprise heating a solution comprising the nanocrystal to a temperature of at least about 60° C.; and adding the organocarboxylate agent substantially concomitantly, or simultaneously, with heating the solution. In an aspect, such example method can comprise cooling the solution and agent to a temperature of at most about 28° C. Moreover, temperature of treatment of the nanocrystal can be regulated in order to accomplish, at least in part, a desired quantum yield. As an example, the temperature can be at least 40° C. As another example, the temperature is about 60° C. Likewise, the time period also can be regulated to determine, at least in part, various features of treatment of the nanocrystal. In certain implementations, the time period is at least about five minutes.

As described supra, various approaches can be utilized to provide a nanocrystal suitable for enhancement of QY of light emission (e.g., photoluminescence). In certain implementations, providing the nanocrystal can comprise one or more steps similar, yet not necessarily identical, to the various steps described hereinbefore in Sec. 5(b). In an aspect, providing the nanocrystal comprises the steps of heating, to a temperature of greater than about 300° C., a reaction mixture comprising a $C_4$ to $C_{22}$ alkyl- or aryl-phosphonic acid and a source of atoms from group II in a molar ratio of from about 1:5 to about 1:1 Cd/Zn:phosphonic acid; adding to the reaction mixture an injection mixture comprising a $C_2$ to $C_{16}$ trialkyl- or triarylphosphine and a source of atoms from group VI; and decreasing the temperature of the reaction mixture to less than about 300° C., yielding a nanocrystal comprising a first plurality of atoms from group II and a second plurality of atoms from group VI. In certain embodiments, the atoms from group II are cadmium or zinc atoms, and the atoms from group VI are selenium, sulfur, or tellurium atoms. The heating and adding steps can be performed either sequentially or substantially simultaneously.

d. Results

Nanocrystals provided and treated in accordance with various aspects of the example method of enhancing light emission (e.g., photoluminescence) of the subject disclosure exhibit various magnitudes of QY enhancement with respect to non-treated nanocrystals. In an aspect, quantum yield (QY) measurements were taken within 30 min of cooling a reaction solution resulting from treating nanocrystals with an organocarboxylate agents in accordance with aspects described hereinbefore. The QY of both the original nanocrystals and the acid-treated nanocrystals were taken in reference to either Coumarin 152A or Coumarin 153 as the dye standard.

Figure 20:
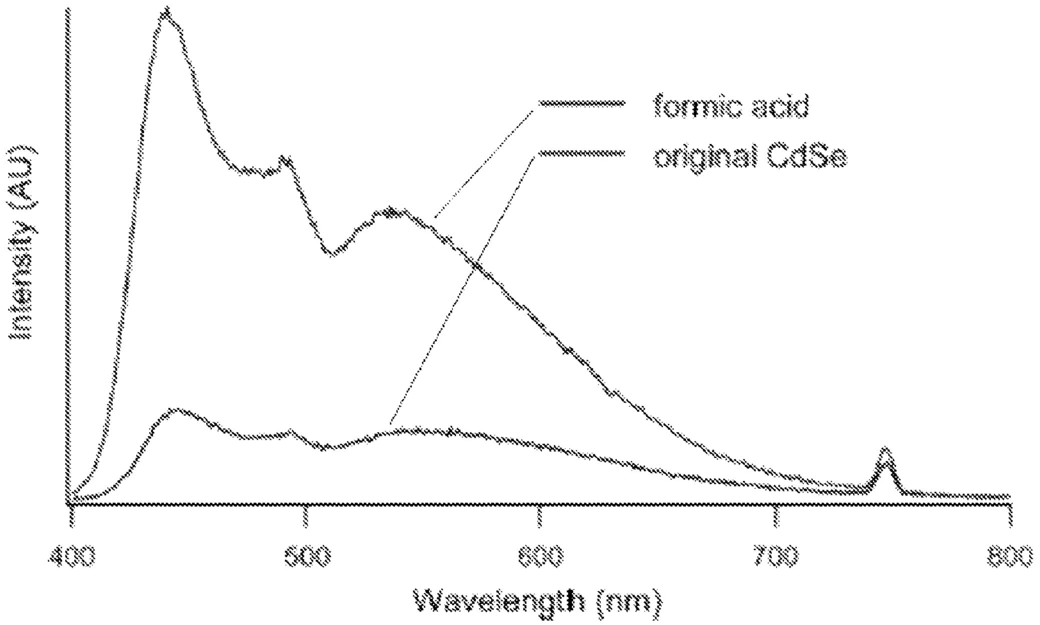
FIG. 20 illustrates example light emission spectra of as-synthesized CdSe nanocrystals (blue curve) and light emission of CdSe nanocrystals treated with formic acid (red curve) in accordance with aspects of the subject disclosure.

Certain treated nanocrystals exhibit an increase in nanocrystal photoluminescence quantum yield of at least double that of nanocrystals before treatment. For other treated nanocrystals, such increase is at least double that of nanocrystals before treatment. Yet other treated nanocrystals present an increase in nanocrystal photoluminescence quantum yield that is at least triple that of the nanocrystals before treatment. Additional or alternative treated nanocrystals exhibit an increase in nanocrystal photoluminescence quantum yield that is at least four-times that of the nanocrystals before treatment. FIG. 20 illustrates example light emission spectra of as-synthesized broad emission spectrum CdSe nanocrystals (blue curve) and broad-emission spectrum CdSe nanocrystals treated with formic acid (red curve) in accordance with aspects of the subject disclosure. It should be appreciated that the three features of the emission spectra of non-treated nanocrystals, and discussed hereinbefore, are preserved after treatment. Quantum yield of light emission increases from about 7.2% for the as-synthesized CdSe nanocrystal to about 30.4% in the CdSe treated with formic acid. CIE coordinates shift to a bluer light emission in response to treatment with formic acid: as-synthesized CIE coordinate shifts from about (0.304, 0.330) to about (0.263, 0.292).

In addition, nanocrystals synthesized, or otherwise provided, and treated in accordance with aspects of the subject disclosure, exhibit photoluminescence with varying quantum yields. Depending on particular organocarboxylate agents utilized, the quantum yields of the treated nanocrystals adopt values of at least about 20%, at least about 30%, or at least about 40%, and so forth. More specifically, as a non-limiting illustration, for broad emission spectrum CdSe nanocrystal the treatment with formic acid results in an average QY of approximately 29% (e.g., (29.0±5.4) %); treatment with chloroacetic acid results in an average QY of approximately 28%; treatment with citric acid results in an average QY of approximately 26%; treatment with dichloroacetic acid results in an average QY of approximately 15%. In an embodiment, broad emission spectrum CdSe nanocrystal treated with formic acid exhibit an average QY of approximately 42%. Treatment with certain organocarboxylate agents provided lesser enhancement of QY. As a non-limiting illustration, for broad emission spectrum CdSe nanocrystals with a QY of about 7%, treatment with acetic acid results in an average QY of approximately 19% (e.g., (19.0±2.5) %); treatment with benzoic acid results in an average QY of about 18%; treatment with octanoic acid results in an average QY of about 17%; treatment with hexanoic acid results in an average QY of about 16%; treatment with oleic acid provided an average QY of about 10%; and treatment with zinc acetate provided an average QY of nearly 14%. It is noted that treatment of nanocrystals with benzoic acid also resulted in formation of significant amount of non-quantum-dot (non-QD) solid material.

Figure 21:
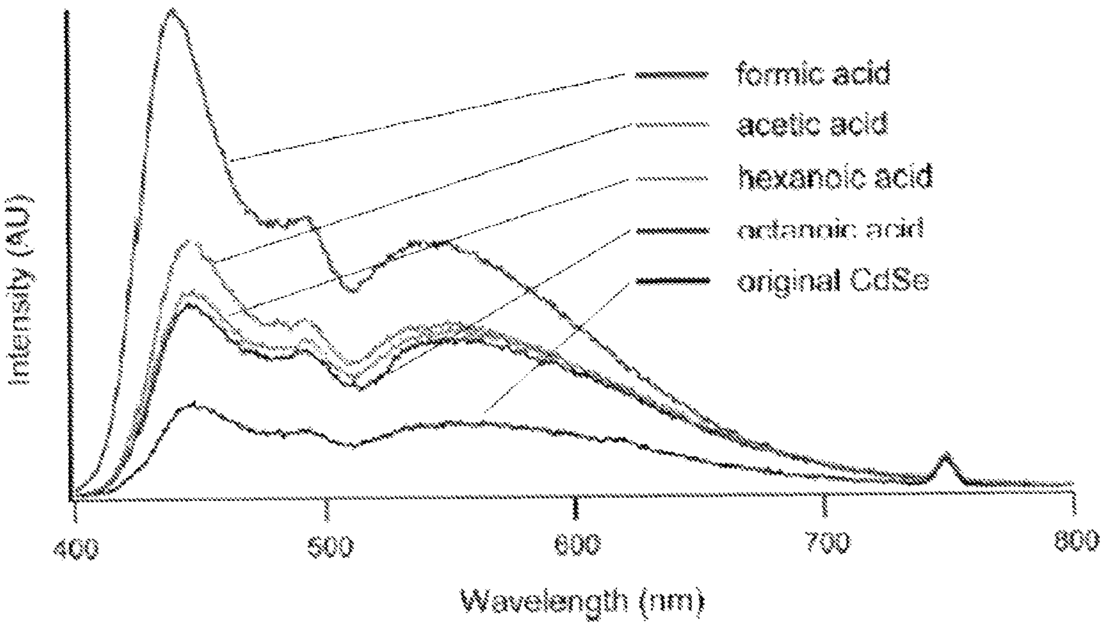
FIG. 21 illustrates example light emission spectra of as-synthesized, broad emission spectrum CdSe nanocrystals, and broad emission spectrum CdSe nanocrystals after treatment with several organocarboxylate agents in accordance with aspects of the subject disclosure.

FIG. 21 illustrates example light emission spectra of as-synthesized and treated broad emission spectrum CdSe nanocrystals. As illustrated, broad emission spectrum CdSe nanocrystals were treated in with several organocarboxylate agents comprising formic acid, acetic acid, hexanoic acid, and octanoic acid. Treatment of the CdSe nanocrystals was performed as described hereinbefore (see, e.g., Sec. 7(b)).

In certain embodiments, formic acid causes a greater increase in QY than other straight-chain carboxylic acids. Without wishing to be bound by theory or modeling, it is believed that such increase is due to shorter carbon chain length of formic acid with respect to other organocarboxylate agents, such as acetic acid, hexanoic acid, octanoic acid, and oleic acid, employed for treatment of a nanocrystal. Further, and without intending to be bound by theory or modeling, longer carbon chains are believed to hinder the ability of the acid to reach the nanocrystal surface beyond the bulky TOPO and the long-chain phosphonic acid and HDA ligands that are associated with the nanocrystal. The acid chain length also affects the pKa of the nanocrystal, increasing acidity with shorter alkyl chain lengths. Consequently, and without intend to be bound by theory or modeling, formic acid is substantially the most acidic of the various other organocarboxylate agents employed in treatment of nanocrystals in accordance with aspects described herein, and thus it believed that a correlation may exist between a more acidic ligand and a higher increase in quantum yield of naocrystals treated in accordance with aspects described herein. Moreover, based at least on the close proximity of quantum yields for the longer chain acids and nearly insignificant quantum yield increase for oleic acid, it is believed that the chain-length effect referred to hereinbefore becomes minimal or substantially minimal after hexanoic acid, with longer alkylcarboxylic acids eventually not producing a significant difference in quantum yield.

Figure 22:
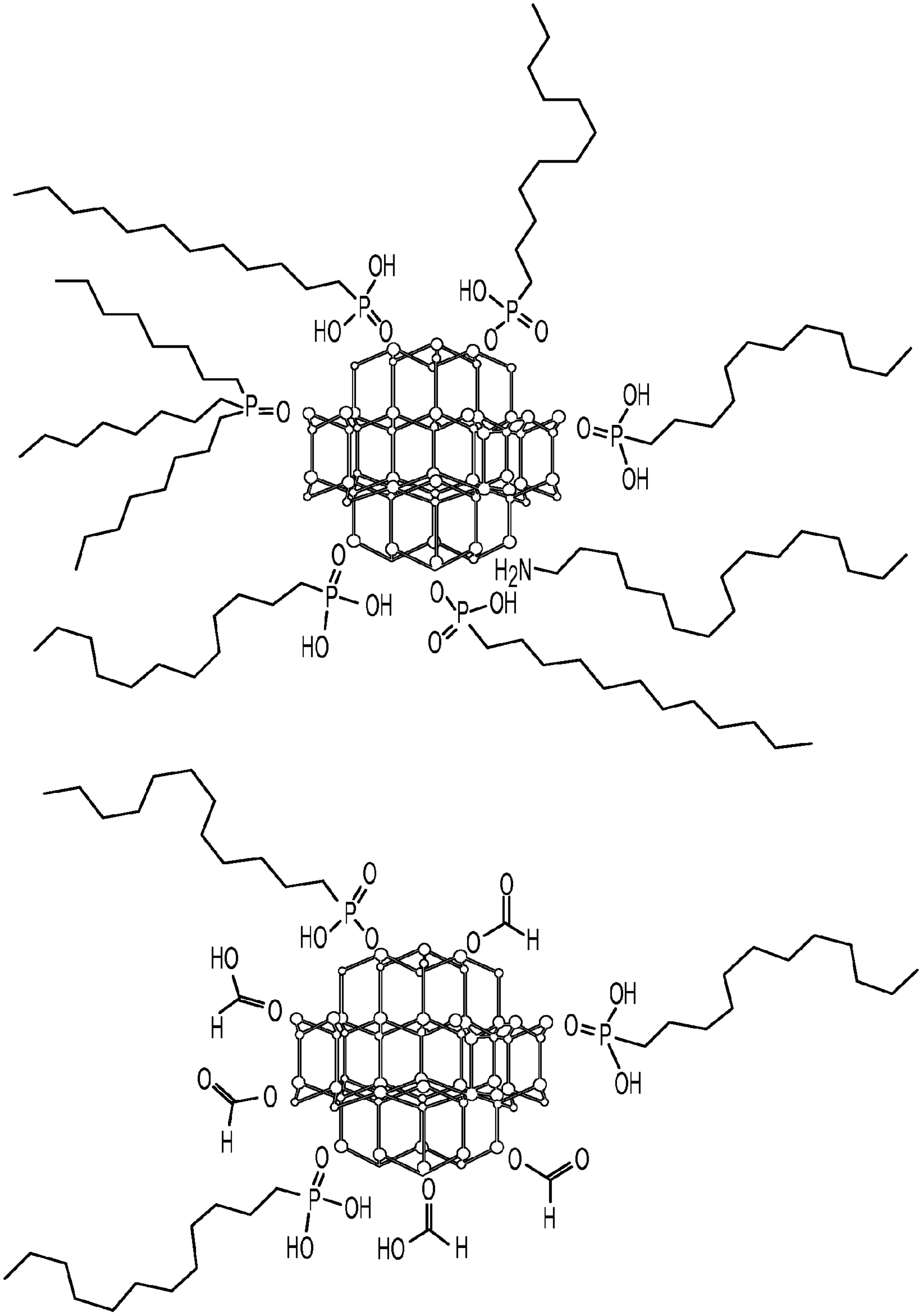
FIG. 22 represents a broad emission spectrum II-VI nanocrystal with ligands resulting from the synthesis process (top sketchl) and a broad emission spectrum II-VI nanocrystal treated with formic acid (bottom sketch) in accordance with aspects of the subject disclosure, illustrating an example ligand exchange mechanism for quantum yield enhancement as described herein.

Without wishing to be bound by theory or modeling, it is believed that enhancement of quantum yield of II-VI nanocrystals (e.g., CdSe nanocrystals) in response to treatment with organocarboxylate agent (e.g., formic acid) is due to a ligand exchange process on such nanocrystals; see FIG. 22. In an aspect, after synthesis and cleaning, a II-VI nanocrystal surface is mostly covered with phosphonic acid ligands and, to a lesser extent, tri-n-octylphosphine oxide (TOPO) and hexadecylamine (HDA). [A. D. Dukes III, M. A. Schreuder, J. A. Sammons, J. R. McBride, N. J. Smith, and S. J. Rosenthal, *J. Chem. Phys.,* 2008, 129, 121102. J. T. Kopping and T. E. Patten, *J. Am. Chem. Soc.,* 2008, 130, 5689-5698.] In response to treatment with an organocarboxylate agent (e.g., formic acid), a ligand exchange would dictate that the acid molecules cover most or all coverage of the II-VI nanocrystal surface, accomplishing at least in part exchange with and removal of other ligands covering the II-VI nanocrystal before treatment. In an aspect, a ligand exchange can occur readily and can be likely irreversible if the interaction between the new ligand and at least one atom at the surface of the nanocrystal is more energetically favorable (e.g., total energy of the nanocrystal and ligand system is lowered through addition of the new ligand) than the interaction amongst the at least one atom and an original ligand. In case of replacing a phosphonic acid, TOPO, or HDA ligand with a carboxylic acid (or, more generally, the organocarboxylate agent) interaction is less favorable, e.g., total energy of the nanocrystal and ligand system is increased through such replacement. In an aspect, the exchange most likely occurs initially because of the large molar excess of the acid that overwhelms the nanocrystals. In addition, the ligands on the nanocrystals and the extra ligands in the surrounding solution are in equilibrium with each other, wherein their relative quantities are mutually affected. In a scenario in which there are fewer ligands present in solution, the ligands on the surface of the II-VI nanocrystals should be released to maintain such equilibrium. Thus, when the excess original ligands are removed through a cleaning process that is effected, in certain embodiments, after synthesis of the II-VI nanocrystals, at least a portion of the ligands from the surface of the II-VI nanocrystals also will be lost, causing attachment of the organocarboxylate agent (e.g., formic acid) to be easier or more readily available.

In an aspect, relative to non-treated nanocrystals, light emission spectra of nanocrystals treated with formic acid in accordance with aspects of the subject disclosure deviate from pure white. For nanocrystals after treatment, CIE coordinates become more "blue" relative to the white (0.333, 0.333) center (see, e.g., FIG. 2 for a sketch of a CIE 1931 chromaticity diagram). Such feature of treatment is present for all or substantially all organocarboxylate agent, and is particularly, yet not exclusively, salient in treatment of nanocrystals with formic acid. In an aspect, such "blueing" effect can be compensated by modulating the color of non-treated nanocrystal(s) to initially exhibit a warmer white emission; after treating the original nanocrystal(s) with organocarboxylate agent as described herein, the resulting treated nanocrystal(s) are likely to exhibit a more balanced white emission.

As described hereinbefore, based on light emission characteristics, treatment with at least the following organocarboxylate agents should be excluded in view of poor or less desirable QY enhancement: (1) Lauric acid; while average QY of treated nanocrystals is nearly 16%, increase of QY with respect to untreated nanocrystal is marginal since the untreated nanocrystals were abnormally bright. (2) Oxalic; average QY is nearly 2%, significantly dimmer that nanocrystals before treatment. (3) Maleic acid; resulting nanocrystal exhibit substantially no light emission. (4) Stearic acid; light emission of treated nanocrystals is incipient, significant formation of non-QD solid material. (5) Phosphoric acid; treated nanocrystal exhibit no light emission.

Figure 23:
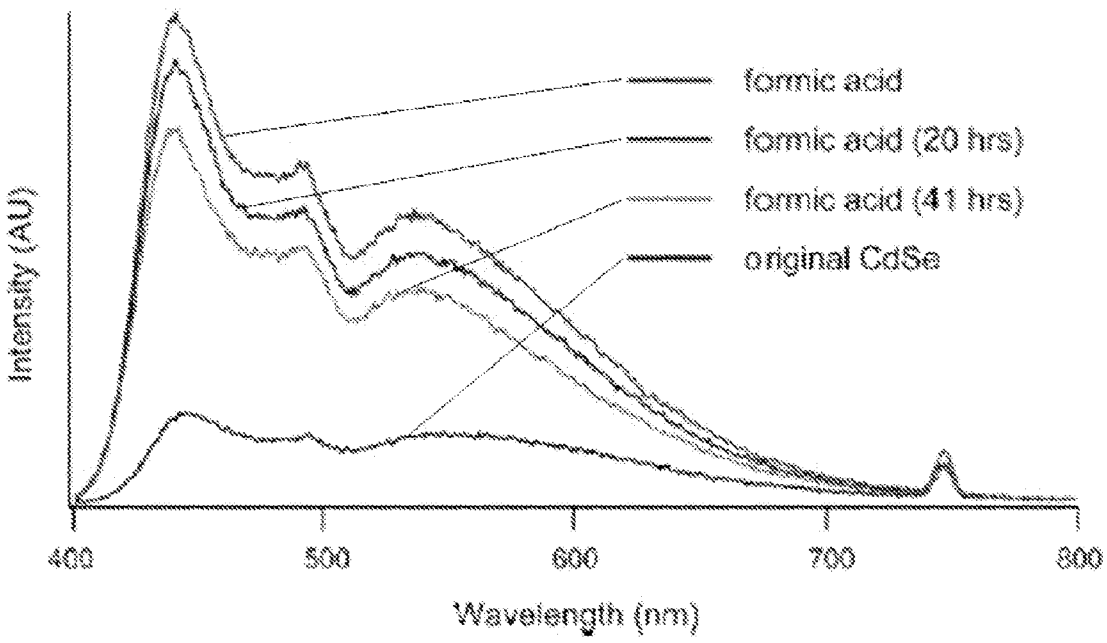
FIG. 23 illustrates example light emission spectra before and after treatment with formic acid in accordance with aspects of the subject disclosure, wherein such spectra for treated CdSe nanocrystals are recorded at different instants subsequent to treatment.

FIG. 23 illustrates example light emission spectra before and after treatment with formic acid in accordance with aspects of the subject disclosure, wherein such spectra for treated CdSe nanocrystals are recorded at different instants subsequent to treatment. In an aspect, substantially immediately after treatment, the quantum yield of light emission increases from nearly 7% to nearly 30% in response to treatment, whereas the quantum yield of light emission for treated CdSe nanocrystals decreases to a value of about 23% during an interval of about 41 hours. Such value is nearly stabilized in that a further decrement of quantum yield of the CdSe nanocrystal is substantially negligible. Such feature of QY of the treated CdSe nanocrystals suggests that the enhancement of QY in accordance with aspects described herein in not a transient phenomenon that culminates with recovery of a QY of the treatment nanocrystals that is substantially the same as that of the CdSe before treatment. Rather, QY enhancement in response to treatment with organocarboxylate agent as described herein can provide a nearly stationary or stable increase in light emission quantum yield. Therefore, in one or more embodiments, the subject disclosure render the treated nanocrystals useful for lighting applications.

While various aspects of the subject disclosure are illustrated for CdSe nanocrystals, it should be appreciated that in various embodiments, treating of ultrasmall broad spectrum emission nanocrystal in accordance with various aspects of the subject disclosure results in photoluminescent nanocrystal comprising a solid assembly comprising a first plurality of atoms from group II crystallized with a second plurality of atoms from group VI; at least one dimension of the assembly less than about 3.0 nm; and one or more organocarboxylate agents coupled to a surface that bounds the assembly, wherein the nanocrystal exhibits broad spectrum photoluminescence (e.g., FWHM of about 100 nm) with a quantum yield of at least about 10%. The group II atoms can be selected from cadmium and zinc, and the group VI atoms are selected from selenium and sulfur. More generally, the nanocrystal comprises one or more of cadmium, selenium, cadmium crystallized with selenium. In an aspect, that the one or more organocarboxylate agents are coupled to a surface that bounds the assembly comprises at least a portion of the nanocrystal being coated with the organocarboxylate agent, wherein the organocarboxylate agent can be a carboxylic acid, and wherein the carboxylic acid can be selected from formic acid, acetic acid, hexanoic acid, octanoic acid, oleic acid, and benzoic acid. Moreover, the organocarboxylate agent can be the conjugate base of a carboxylic acid. In an aspect, the conjugate base can be a salt selected from sodium, potassium, calcium, and zinc of a carboxylic acid selected from formic acid, acetic acid, hexanoic acid, octanoic acid, oleic acid, and benzoic acid. Furthermore, the organocarboxylate agent is formic acid or a salt thereof. In other aspects, the photoluminescent nanocrystal exhibits a photoluminescence quantum yield of at least double that of a nanocrystal without one or more organocarboxylate agents, at least triple that of a nanocrystal without one or more organocarboxylate agents, or at least four-times that of a nanocrystal without one or more organocarboxylate agents. Further, in additional or alternative aspects, the photoluminescent nanocrystal exhibits photoluminescence with a quantum yield of at least about 20%, a quantum yield of at least about 30%, or a quantum yield of at least about 40%.

In one or more embodiments, at least one dimension of the assembly is less than about 2.0 nm, or at least one dimension of the assembly is about 1.5 nm. In addition or in the alternative, all dimensions of the assembly are less than about 3.0 nm, all dimensions of the assembly are less than about 2.0 nm, or all dimensions of the assembly are about 1.5 nm. Moreover, the photoluminescent nanocrystal can comprise cadmium crystallized with selenium and having at least one dimension smaller than about 2.0 nm. In one embodiment, the photoluminescent nanocrystal is magic-sized. In alternative or additional embodiments, the photoluminescent nanocrystal is a broad emission quantum dot.

The subject disclosure is not limited to specific morphologies of the photoluminescent nanocrystal; in an aspect, such nanocrystal further comprises a core of atoms within the assembly, the core comprising: a third plurality of atoms from group II crystallized with a fourth plurality of atoms from group VI, wherein at least one of the third plurality is different from the first plurality or the fourth plurality is different from the second plurality. Moreover, the third plurality can comprise atoms selected from cadmium and zinc; the fourth plurality can comprise atoms selected from selenium and sulfur.

As described hereinbefore, in certain embodiments, the photoluminescent nanocrystal does not comprise at least one of lauric acid, oxalic acid, or maleic acid. In the alternative or in addition, the photoluminescent nanocrystal does not comprise lauric acid, oxalic acid, and maleic acid, or it does not comprise does not comprise stearic acid.

e. Conclusions

Enhancement of light emission (e.g., photoluminescence, fluorescence) quantum yield was achieved with ultrasmall II-VI nanocrystals (e.g., CdSe nanocrystals) by treating the such ultrasmall II-VI nanocrystals with organocarboxylate agent (for example, carboxylic acid or conjugated base thereof). In an aspect, the most effective or substantially most effective enhancement was accomplished by treating the ultrasmall II-VI nanocrystals with formic acid; such treatment yielded broad emission spectrum II-VI nanocrystals exhibiting a quantum yield of nearly 42%. Without wishing to be bound by theory or modeling, it is believed that enhancement of light emission quantum yield in response to treatment with organocarboxylate agent(s) as described in the subject disclosure originates in ligand exchange as disclosed hereinbefore. In certain embodiments, data related to light emission of treated II-VI nanocrystals (e.g., CdSe nanocrystals) indicate that acids with shorter alkyl chain lengths cause a greater enhancement of quantum yield. Again, without wishing to be bound by theory or modeling, it is believed that such feature is associated with steric effects of longer chains or, in the alternative or in addition, acidity effects in view that shorter-chain acids generally have higher pKa than acids with longer alkyl chains. In response to treatment with organocarboxylate agent(s), ultrasmall II-VI nanocrystals have broad spectrum light emission that exhibits cooler white that non-treated (e.g., as-synthesized) ultrasmall II-VI nanocrystals.

It will be apparent to those skilled in the art that various modifications and variations can be made in the present invention without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of increasing photoluminescence quantum yield, the method comprising the steps of:

(a) providing a nanocrystal comprising a first plurality of atoms from group II and a second plurality of atoms from group VI; and (b) treating the nanocrystal with a molar excess of one or more organocarboxylate agents for a time period and at a temperature sufficient to increase nanocrystal photoluminescence quantum yield, compared with the nanocrystal before treatment.

2. The method of claim 1, wherein the organocarboxylate agent is a carboxylic acid.

3. The method of claim 2, wherein the carboxylic acid is selected from formic acid, acetic acid, hexanoic acid, octanoic acid, oleic acid, and benzoic acid.

4. The method of claim 1, wherein the organocarboxylate agent is the conjugate base of a carboxylic acid.

5. The method of claim 4, wherein the conjugate base is a salt selected from sodium, potassium, calcium, and zinc of a carboxylic acid selected from formic acid, acetic acid, hexanoic acid, octanoic acid, oleic acid, and benzoic acid.

6. The method of claim 1, wherein the organocarboxylate agent is formic acid or a salt thereof.

7. The method of claim 1, further comprising cooling the solution and agent to a temperature of at most about 28° C.

8. The method of claim 1, wherein the increase in nanocrystal photoluminescence quantum yield is at least double that of the nanocrystal before treatment.

9. The method of claim 1, wherein the treated nanocrystal exhibits photoluminescence with a quantum yield of at least about 20%.

10. The method of claim 1, wherein providing comprises the steps of:

(a) heating, to a temperature of greater than about 300° C., a reaction mixture comprising a $C_4$ to $C_{22}$ alkyl- or arylphosphonic acid and a source of atoms from group II in a molar ratio of from about 1:5 to about 1:1 Cd/Zn: phosphonic acid;

(b) adding to the reaction mixture an injection mixture comprising a $C_2$ to $C_{16}$ trialkyl- or triarylphosphine and a source of atoms from group VI; and (c) decreasing the temperature of the reaction mixture to less than about 300° C., yielding a nanocrystal comprising a first plurality of atoms from group II and a second plurality of atoms from group VI.

11. A photoluminescent nanocrystal comprising:

(a) a solid assembly comprising a first plurality of atoms from group II crystallized with a second plurality of atoms from group VI;

(b) at least one dimension of the assembly less than about 3.0 nm; and (c) one or more organocarboxylate agents coupled to a surface that bounds the assembly, wherein the nanocrystal exhibits broad spectrum photoluminescence with quantum yield of at least about 10%, wherein the organocarboxylate agent is a carboxylic acid selected from formic acid, acetic acid, hexanoic acid, actanoid acid, oleic acid, and benzoic acid, or wherein the organocarboxylate agent is the conjugate base of a carboxylic acid.

12. The nanocrystal of claim 11, wherein the group II atoms are selected from cadmium and zinc, and the group VI atoms are selected from selenium and sulfur.

13. The nanocrystal of claim 11, further comprising a core of atoms within the assembly, the core comprising:

(a) a third plurality of atoms from group II crystallized with (b) a fourth plurality of atoms from group VI, wherein at least one of the third plurality is different from the first plurality or the fourth plurality is different from the second plurality.

14. The nanocrystal of claim 11, wherein the carboxylic acid is selected from formic acid and acetic acid.

15. The nanocrystal of claim 11, wherein the carboxylic acid is selected from hexanoic acid, octanoic acid, oleic acid, and benzoic acid.

16. The nanocrystal of claim 11, wherein the conjugate base is a salt selected from sodium, potassium, calcium, and zinc of a carboxylic acid selected from formic acid and acetic acid.

17. The nanocrystal of claim 11, wherein the conjugate base is a salt selected from sodium, potassium, calcium, and zinc of a carboxylic acid selected from hexanoic acid, octanoic acid, oleic acid, and benzoic acid.

18. The nanocrystal of claim 11, wherein the organocarboxylate agent is formic acid or a salt thereof.

19. The nanocrystal of claim 11, wherein the nanocrystal exhibits a photoluminescence quantum yield of at least double that of a nanocrystal without one or more organocarboxylate agents.

20. The nanocrystal of claim 11, wherein the nanocrystal exhibits photoluminescence with a quantum yield of at least about 20%.

* * * * *

UNITED STATES PATENT AND TRADEMARK OFFICE

CERTIFICATE OF CORRECTION

PATENT NO. : 9,236,572 B2
APPLICATION NO. : 13/985749
DATED : January 12, 2016
INVENTOR(S) : Teresa E. Tilyou et al.

It is certified that error appears in the above-identified patent and that said Letters Patent is hereby corrected as shown below:

In the claims,

In Column 68, line 42, replace “actanoid acid” with –octanoic acid–

Signed and Sealed this
Twenty-third Day of August, 2016

Michelle K. Lee
*Director of the United States Patent and Trademark Office*